United States Patent
Bok et al.

(10) Patent No.: US 12,507,526 B2
(45) Date of Patent: Dec. 23, 2025

(54) DISPLAY DEVICE

(71) Applicant: Samsung Display Co., Ltd., Yongin-si (KR)

(72) Inventors: Seunglyong Bok, Yongin-si (KR); Jewon Yoo, Yongin-si (KR); Seungin Baek, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 588 days.

(21) Appl. No.: 17/992,998

(22) Filed: Nov. 23, 2022

(65) Prior Publication Data

US 2023/0165050 A1 May 25, 2023

(30) Foreign Application Priority Data

Nov. 23, 2021 (KR) .................. 10-2021-0162594

(51) Int. Cl.
*H10K 59/121* (2023.01)
*H10K 59/65* (2023.01)

(52) U.S. Cl.
CPC .......... *H10K 59/121* (2023.02); *H10K 59/65* (2023.02)

(58) Field of Classification Search
CPC .............................. H10K 59/121; H10K 59/65
USPC ................................................. 313/498–512
See application file for complete search history.

(56) References Cited

U.S. PATENT DOCUMENTS

| | | | |
|---|---|---|---|
| 10,109,698 B2 | 10/2018 | Kang et al. | |
| 10,733,408 B2 | 8/2020 | Bok | |
| 11,094,772 B2 | 8/2021 | Ma et al. | |
| 11,309,369 B2 | 4/2022 | Bae et al. | |
| 11,489,007 B2 | 11/2022 | Yang et al. | |
| 11,502,148 B2 | 11/2022 | Cai et al. | |
| 11,899,862 B2 | 2/2024 | Bok et al. | |
| 2019/0045094 A1 | 2/2019 | Fletcher et al. | |
| 2020/0058726 A1* | 2/2020 | Ma | H10K 59/352 |
| 2022/0069048 A1 | 3/2022 | Bok et al. | |

(Continued)

FOREIGN PATENT DOCUMENTS

| | | |
|---|---|---|
| CN | 110379356 | 10/2019 |
| CN | 111710276 | 9/2020 |
| CN | 112186021 | 1/2021 |

(Continued)

OTHER PUBLICATIONS

Working Principle Demonstration of the Dot Projector with Physical Optics Modeling, LightTrans, VirtualLab Fusion Summer Release 2019 (7.6.1.18).

(Continued)

*Primary Examiner* — Christopher M Raabe
(74) *Attorney, Agent, or Firm* — Sughrue Mion, PLLC

(57) ABSTRACT

A display device includes a substrate including a first auxiliary area and a second auxiliary, the first auxiliary area includes first pixel areas disposed in a matrix and first transmission areas disposed between the first pixel areas and the second auxiliary area includes second pixel areas disposed in a matrix and second transmission areas disposed between the second pixel areas; first conductive patterns respectively disposed on the first pixel areas; and second conductive patterns respectively disposed on the second pixel areas, and a number of first conductive patterns per unit area is greater than a number of second conductive patterns per unit area.

20 Claims, 40 Drawing Sheets

(56) References Cited

U.S. PATENT DOCUMENTS

2022/0093682 A1* 3/2022 Chang ................. H10K 59/131

FOREIGN PATENT DOCUMENTS

| CN | 112462545 | 3/2021 |
|----|-----------|--------|
| IN | 112151592 | 12/2020 |
| KR | 10-2017-0002730 A | 1/2017 |
| KR | 10-2020-0115888 | 10/2020 |
| KR | 10-2021-0082316 A | 7/2021 |
| KR | 10-2022-0031796 | 3/2022 |

OTHER PUBLICATIONS

FLIR Integrated Imaging Solutions, "Structured Light 3D Scanning with Machine Vision Cameras", published on Oct. 14, 2016, retrieved on Nov. 22, 2022 <URL: https://www.youtube.com/watch?v=U0Q9QnYRsoU&t=39s>.

* cited by examiner

| Diffraction in visible light | Diffraction in infrared light |
|---|---|
|  |  |

DISPLAY DEVICE

CROSS-REFERENCE TO RELATED APPLICATION(S)

This application claims priority to and benefits of Korean Patent Application No. 10-2021-0162594 under 35 U.S.C. § 119, filed on Nov. 23, 2021, in the Korean Intellectual Property Office, the entire contents of which are incorporated herein by reference.

BACKGROUND

1. Technical Field

One or more embodiments relate to a display device.

2. Description of the Related Art

A display device visually displays data. A display device may be used as a display in a small-sized product such as a mobile phone, or a display in a large-sized product such as a television.

A display device may include pixels that emit light by receiving electrical signals in order to externally display images. Each of the pixels may include a display element. For example, an organic light-emitting display device may include an organic light-emitting diode as a display element. In general, in the organic light-emitting display device, thin film transistors and organic light-emitting diodes may be disposed on a substrate and the organic light-emitting diodes emit light by themselves.

Recently, usage of a display device has increased, and various design attempts for improving quality of a display device have been tried.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display device having an expanded display area to display an image even in an area in which a component, which is an electronic element, is arranged. However, this objective is an example and the scope of the disclosure is not limited thereby.

Additional aspects will be set forth in part in the description which follows and, in part, will be apparent from the description, or may be learned by practice of the embodiments of the disclosure.

According to one or more embodiments, a display device may include: a substrate including a first auxiliary area; and a second auxiliary area, wherein the first auxiliary area may include first pixel areas disposed in a matrix and first transmission areas disposed between the first pixel areas, and the second auxiliary area may include second pixel areas disposed in a matrix and second transmission areas disposed between the second pixel areas; first conductive patterns respectively disposed on the first pixel areas; and second conductive patterns respectively disposed on the second pixel areas, wherein a number of first conductive patterns per unit area is greater than a number of second conductive patterns per unit area.

A size of each of the first conductive patterns may be less than a size of each of the second conductive patterns.

A first separation distance between first conductive patterns adjacent to each other in a row direction or a column direction from among the first conductive patterns may be less than a second separation distance between second conductive patterns adjacent to each other in the row direction or the column direction from among the second conductive patterns.

A size of each of the first transmission areas may be less than a size of each of the second transmission areas.

The display device may further include first auxiliary pixels respectively disposed on the first conductive patterns; and second auxiliary pixels respectively disposed on the second conductive patterns.

Each of the first auxiliary pixels may include first auxiliary sub-pixels, and each of the second auxiliary pixels may include second auxiliary sub-pixels, and a number of first auxiliary sub-pixels in each of the first auxiliary pixels may be different from a number of second auxiliary sub-pixels in each of the second auxiliary pixels.

The number of first auxiliary sub-pixels in each of the first auxiliary pixels may be less than the number of second auxiliary sub-pixels in each of the second auxiliary pixels.

A main area surrounding at least portions of the first auxiliary area and the second auxiliary area may be defined on the substrate, wherein the resolution of the main area may be higher than the resolution of the first auxiliary area and the resolution of the second auxiliary area, and the resolution of the first auxiliary area may be higher than the resolution of the second auxiliary area.

The display device may further include first connection patterns electrically connecting first conductive patterns adjacent to each other in a row direction from among the first conductive patterns; second connection patterns electrically connecting first conductive patterns adjacent to each other in a column direction from among the first conductive patterns; third connection patterns electrically connecting second conductive patterns adjacent to each other in the row direction from among the second conductive patterns; and fourth connection patterns electrically connecting second conductive patterns adjacent to each other in the column direction from among the second conductive patterns.

The display device may further include a transistor disposed on the substrate, the transistor including a semiconductor layer and a gate electrode at least partially overlapping the semiconductor layer in a plan view, wherein the first conductive patterns and the second conductive patterns may be disposed between the substrate and the semiconductor layer.

The display device may further include a first component disposed below the first auxiliary area that receives light in a first wavelength band; and a second component disposed below the second auxiliary area that receives light in a second wavelength band that is different from the first wavelength band.

The first wavelength band may be a visible ray wavelength band, and the second wavelength band may be an infrared wavelength band.

According to one or more embodiments, a display device may include a substrate including a first auxiliary area; a second auxiliary area; and a main area, wherein the first auxiliary area may include a first transmission area, the second auxiliary area may include a second transmission area, and the main area surrounds at least portions of the first auxiliary area and the second auxiliary area; main display elements disposed on the main area and emitting light of a first color; first auxiliary display elements disposed on the first auxiliary area and emitting light of the first color; and second auxiliary display elements disposed on the second auxiliary area and emitting light of the first color, wherein a number of main display elements per unit area is greater than a number of first auxiliary display elements per unit area and a number of second auxiliary display elements per unit area, and the number of first auxiliary display elements per unit area is less than the number of second auxiliary display elements per unit area.

An emission area of each of the main display elements may be less than an emission area of each of the first auxiliary display elements and an emission area of each of the second auxiliary display elements, and the emission area of each of the first auxiliary display elements may be different from the emission area of each of the second auxiliary display elements.

The emission area of each of the first auxiliary display elements may be greater than the emission area of each of the second auxiliary display elements.

The display device may further include main pixel circuits electrically connected to the main display elements, respectively; first auxiliary pixel circuits electrically connected to the first auxiliary display elements, respectively; and second auxiliary pixel circuits electrically connected to the second auxiliary display elements, respectively, the main display elements may at least partially overlap the main pixel circuits in a plan view, the first auxiliary display elements may be spaced apart from the first auxiliary pixel circuits, and the second auxiliary display elements may be spaced apart from the second auxiliary pixel circuits.

A first length of each of the first auxiliary pixel circuits in a direction may be greater than a second length of each of the second auxiliary pixel circuits in the direction.

The display device may further include first connection lines respectively electrically connecting the first auxiliary display elements to the first auxiliary pixel circuits and at least partially overlapping the first auxiliary area in the plan view; and second connection lines respectively electrically connecting the second auxiliary display elements to the second auxiliary pixel circuits and at least partially overlapping the second auxiliary area in the plan view, wherein the first connection lines and the second connection lines may include a transparent conductive oxide.

The display device may further include a first component disposed below the first auxiliary area that receives light in a first wavelength band; and a second component disposed below the second auxiliary area that receives light in a second wavelength band that is different from the first wavelength band.

The first wavelength band may be a visible ray wavelength band, and the second wavelength band may be an infrared wavelength band.

Other aspects, features, and advantages than the above-described aspects, features, and advantages will be apparent from a detailed description, the claims, and the drawings.

The general and specific aspects may be embodied using a system, a method, a computer program, or a combination of a system, a method, and a computer program.

BRIEF DESCRIPTION OF THE DRAWINGS

The above and other aspects, features, and advantages of the disclosure will be more apparent from the following description taken in conjunction with the accompanying drawings, in which.

DETAILED DESCRIPTION OF THE EMBODIMENTS

Figure 1:
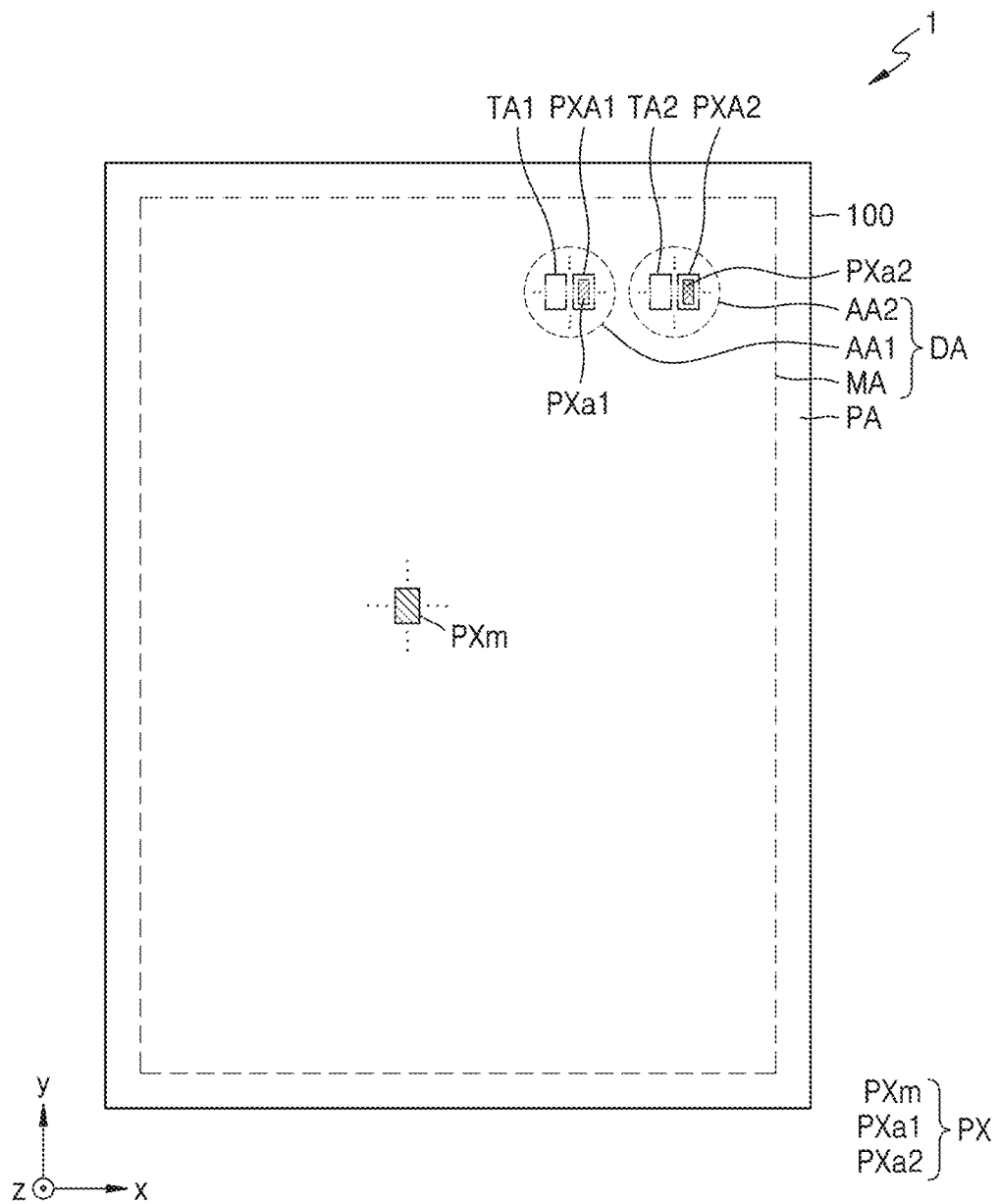
FIG. 1 is a schematic plan view illustrating a display device according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are described below, by referring to the figures, to explain aspects of the description.

As used herein, the term "and/or" includes any and all combinations of one or more of the associated listed items. The terms "and" and "or" may be used in the conjunctive or disjunctive sense and may be understood to be equivalent to "and/or." Throughout the disclosure, the expression "at least one of a, b or c" indicates only a, only b, only c, both a and b, both a and c, both b and c, all of a, b, and c, or variations thereof.

Because the disclosure may have diverse modified embodiments, embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations may be omitted.

While such terms as "first," "second," etc., may be used to describe various components, such components are not be limited to the above terms. The above terms are used only to distinguish one component from another. For example, "a first element" may be referred to as "a second element", and similarly, "a second element" may be referred to as "a first element" without departing from the scope of the disclosure.

The spatially relative terms such as "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or at a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The phrase "in a plan view" means viewing the object from the top, and the phrase "in a schematic cross-sectional view" means viewing a cross-section of which the object is vertically cut from the side.

An expression used in the singular encompasses the expression of the plural, unless it has a clearly different meaning in the context. For example, as used herein, the singular forms, "a," "an," and "the" are intended to include the plural forms as well, unless the context clearly indicates otherwise. Herein, for the sake of concision, the expression of "each of elements (or components, patterns, areas, pixels, circuits, etc.)" is equivalent to "each of a plurality of elements (or components, patterns, areas, pixels, circuits, etc.)", wherein the elements (or components, patterns, areas, pixels, circuits, etc.) are provided in plural.

In the specification, it is to be understood that the terms "including," "having," "comprising" and variations thereof are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on," another layer, region, or component, it may be directly or indirectly formed on the other layer, region, or component. For example, intervening layers, regions, or components may be present.

Sizes of elements in the drawings may be exaggerated for convenience of explanation. In other words, because sizes and thicknesses of components in the drawings may be arbitrarily illustrated for convenience of explanation, the following embodiments are not limited thereto.

When an embodiment may be implemented differently, a specific process order may be performed differently from the described order. For example, two consecutively described processes may be performed substantially at the same time or performed in an order opposite to the described order.

In the specification, the phrase "A and/or B" denotes A, B, or A and B. The phrase "at least one of A and B" denotes A, B, or A and B.

In the embodiments below, when layers, areas, or elements or the like are referred to as being "connected," it will be understood that they may be directly connected or an intervening portion or portions may be present between layers, areas or elements. For example, when layers, areas, or elements or the like are referred to as being "electrically connected," they may be directly electrically connected, or layers, areas or elements may be indirectly electrically connected and an intervening portion or portions may be present.

It will be understood that the terms "connected to" or "coupled to" may include a physical or electrical connection or coupling.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view illustrating a display device 1 according to an embodiment.

Referring to FIG. 1, the display device 1 may include a display area DA and a peripheral area PA outside the display area DA. The display area DA may include a first auxiliary area AA1, a second auxiliary area AA2, and a main area MA at least partially surrounding the first auxiliary area AA1 and the second auxiliary area AA2. The first auxiliary area AA1, the second auxiliary area AA2, and the main area MA may display an image individually or together. The first auxiliary area AA1 may include a first transmission area TA1 and a first pixel area PXA1, and the second auxiliary area AA2 may include a second transmission area TA2 and a second pixel area PXA2. The peripheral area PA may be a type of non-display area in which display elements are not arranged. The display area DA may be entirely surrounded by or may be adjacent to the peripheral area PA.

The display device 1 may provide an image by using pixels PX arranged (or disposed) in the display area DA. The display device 1 may provide an image by using main pixels PXm arranged in the main area MA, first auxiliary pixels PXa1 arranged in the first pixel area PXA1 of the first auxiliary area AA1, and second auxiliary pixels PXa2 arranged in the second pixel area PXA2 of the second auxiliary area AA2. Each of the main pixels PXm, the first auxiliary pixels PXa1, and the second auxiliary pixels PXa2 may include a display element. Each of the main pixels PXm, the first auxiliary pixels PXa1, and the second auxiliary pixels PXa2 may include a display element such as an organic light-emitting diode. Each pixel PX may emit, for example, red, green, blue, or white light from the organic light-emitting diode. Each pixel PX may include sub-pixels emitting light of different colors. For example, each pixel PX may include at least one red sub-pixel, at least one green sub-pixel, and at least one blue sub-pixel.

As described below with reference to FIG. 2A, in the first auxiliary area AA1, a first component 20a that is an electronic element may be disposed under (or below) a display panel 10 to correspond to the first auxiliary area AA1. The first component 20a may be a camera that uses infrared or visible rays, and may include an image pickup device. As another example, the first component 20a may be a solar cell, a flash, an illuminance sensor, a proximity sensor, or an iris sensor. As another example, the first component 20a may have a function of receiving sound. For example, the first component 20a may be an infrared camera, a flood illuminator, a front camera, a dot projector, or the like within the spirit and the scope of the disclosure. In order to reduce the limitation of the function of the first component 20a, the first auxiliary area AA1 may include a first transmission area TA1 through which light and/or sound may pass, the light and/or sound being output from the first component 20a to the outside or travelling from the outside toward the first component 20a.

Although descriptions above are of the first auxiliary area AA1, the descriptions may also apply to the second auxiliary area AA2. As described below with reference to FIG. 2B, in the second auxiliary area AA2, a second component 20b that is an electronic element may be disposed under the display panel 10 to correspond to the second auxiliary area AA2. The second component 20b may be a camera that uses infrared or visible ray, and may include an image pickup device. As another example, the second component 20b may be a solar cell, a flash, an illuminance sensor, a proximity sensor, or an iris sensor. As another example, the second component 20b may have a function of receiving sound. For example, the second component 20b may be an infrared camera, a flood illuminator, a front camera, a dot projector, a laser diode for a time of flight (TOF) camera, or the like within the spirit and the scope of the disclosure. In order to reduce the limitation of the function of the second component 20b, the second auxiliary area AA2 may include a second transmission area TA2 through which light and/or sound may pass, the light and/or sound being output from the second component 20b to the outside or travelling from the outside toward the second component 20b.

Figure 2A:
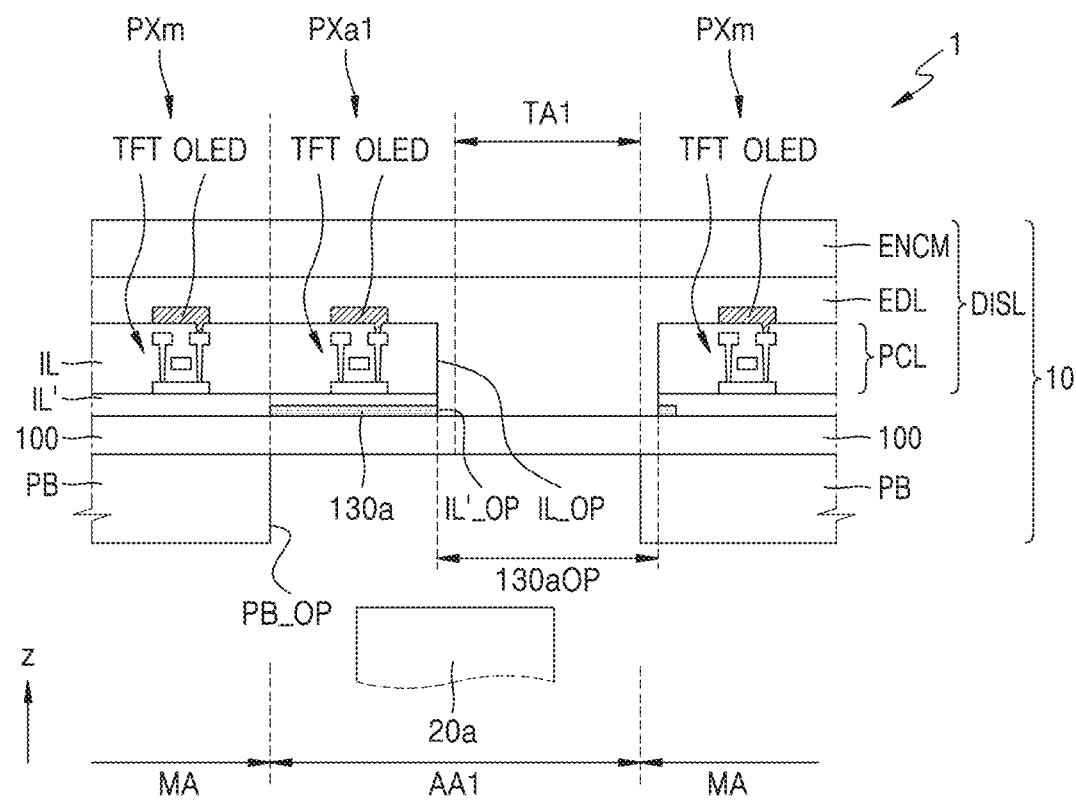
FIG. 2A is a schematic cross-sectional view illustrating a portion of the display device of FIG. 1.
Figure 2B:
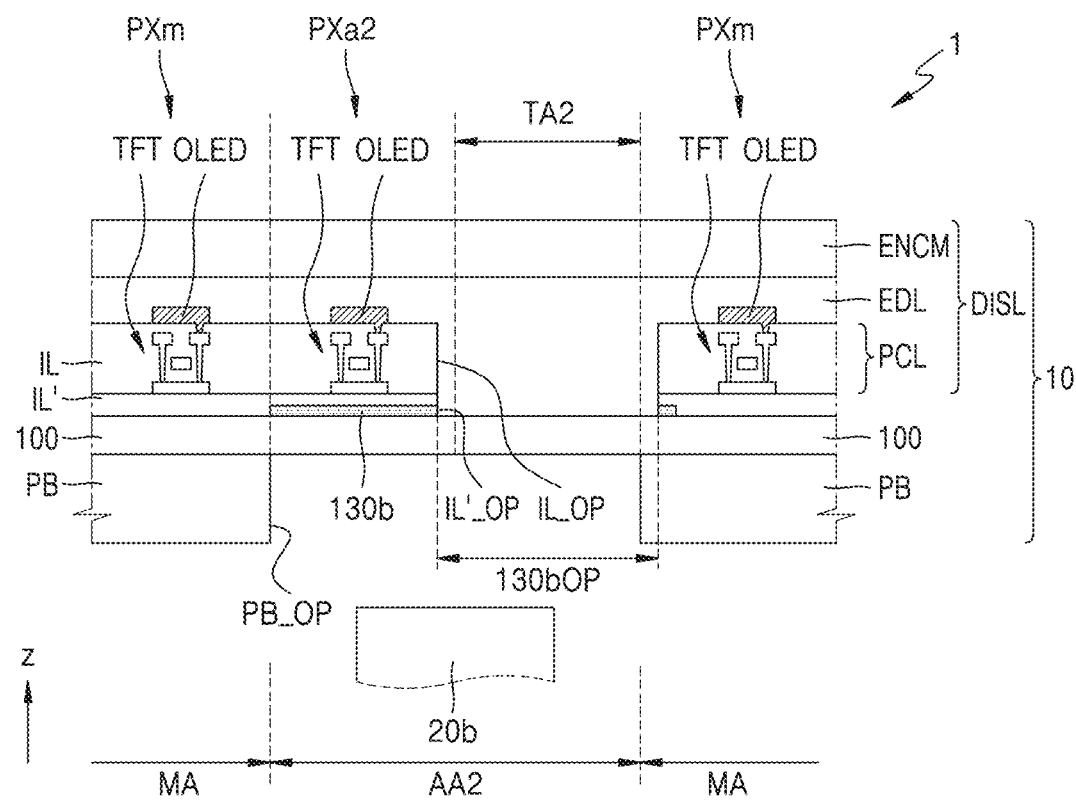
FIG. 2B is a schematic cross-sectional view illustrating another portion of the display device of FIG. 1.

Referring to FIGS. 1, 2A and 2B, in an embodiment, there may be first transmission areas TA1 and second transmission areas TA2, and the number of first transmission areas TA1 per unit area may be different from the number of second transmission areas TA2 per unit area.

In an embodiment, the size of the first transmission area TA1 may be different from the size of the second transmission area TA2.

In an embodiment, the light transmittance of the first auxiliary area AA1 may be different from the light transmittance of the second auxiliary area AA2. For example, the light transmittance of the first auxiliary area AA1 may be lower than that of the second auxiliary area AA2. The first component 20a and the second component 20b may receive light of different wavelength bands, respectively. For example, the first component 20a may receive light in an infrared wavelength band, and the second component 20b may receive light in a visible ray wavelength band. Because light in the infrared wavelength band has higher transmittance than that of light in the visible ray wavelength band, the function of the first component 20a may not be limited even though the first component 20a is arranged in the first auxiliary area AA1 having a relatively low light transmittance.

The first auxiliary pixels PXa1 may be arranged in the first auxiliary area AA1. The first auxiliary pixels PXa1 may emit light to provide an image. An image displayed in the first auxiliary area AA1 is an auxiliary image, and may have a lower resolution than that of an image displayed in the main area MA. The first auxiliary area AA1 may include the first transmission area TA1 through which light and/or sound may pass, and in case that pixels PX are not arranged in the first transmission area TA1, the number of first auxiliary pixels PXa1 that may be arranged per unit area may be less than the number of main pixels PXm arranged per unit area in the main area MA.

Although descriptions above are of the first auxiliary area AA1, the descriptions may also apply to the second auxiliary area AA2. The second auxiliary pixels PXa2 may be arranged in the second auxiliary area AA2. The second auxiliary pixels PXa2 may emit light to provide an image. An image displayed in the second auxiliary area AA2 is an auxiliary image, and may have a lower resolution than that of an image displayed in the main area MA. The second auxiliary area AA2 may include the second transmission area TA2 through which light and/or sound may pass, and in case that pixels PX are not arranged in the second transmission area TA2, the number of second auxiliary pixels PXa2 that may be arranged per unit area may be less than the number of main pixels PXm arranged per unit area in the main area MA.

In an embodiment, the resolution of the first auxiliary area AA1 may be different from the resolution of the second auxiliary area AA2. In other words, the number of first auxiliary pixels PXa1 per unit area may be different from the number of second auxiliary pixels PXa2 per unit area. For example, the resolution of the first auxiliary area AA1 may be higher than that of the second auxiliary area AA2. The first component 20a and the second component 20b may receive light of different wavelength bands, respectively. For example, the first component 20a may receive light in a visible ray wavelength band, and the second component 20b may receive light in an infrared wavelength band. Because light in the visible ray wavelength band is not readily diffracted compared to light in the infrared wavelength band, the function of the first component 20a may not be limited even though the first component 20a is arranged in the first auxiliary area AA1 having a relatively high resolution. This will be described in more detail with reference to FIGS. 5 to 9.

FIG. 1 illustrates an example in which one first auxiliary area AA1 and one second auxiliary area AA2 are located (or disposed) within the main area MA. However, in an embodiment, the display device 1 may include three or more auxiliary areas. The resolutions and light transmittances of the auxiliary areas may be different from each other.

Also, although FIG. 1 illustrates an example in which the shape and size of the first auxiliary area AA1 are the same as those of the second auxiliary area AA2, the shape and size of the first auxiliary area AA1, in an embodiment may be different from those of the second auxiliary area AA2. In case that viewed from a direction substantially perpendicular to the upper surface of the display device 1, each of the first auxiliary area AA1 and the second auxiliary area AA2 may have various shapes, such as a circular shape, an elliptical shape, a polygonal shape (for example, a quadrangular shape), a star shape, or a diamond shape. It is to be understood that the shapes disclosed herein may also include shapes substantial to the shapes disclosed herein.

FIG. 1 illustrates an example in which the first auxiliary area AA1 and the second auxiliary area AA2 are arranged at the upper right side of the main area MA having a substantially rectangular shape in case that viewed from a direction substantially perpendicular to the upper surface of the display device 1. However, in an embodiment, the first auxiliary area AA1 and the second auxiliary area AA2 may be arranged at the upper center (+y direction) of the main area MA having a rectangular shape. The first auxiliary area AA1 and the second auxiliary area AA2 may be arranged at one side or a side of the main area MA having a rectangular shape, for example, at the upper left side of the main area MA. As an embodiment, the first auxiliary area AA1 and the second auxiliary area AA2 may be arranged at the center of one side or a side of the main area MA having a rectangular shape.

FIG. 2A is a schematic cross-sectional view illustrating a portion of the display device 1 of FIG. 1.

Referring to FIG. 2A, the display device 1 may include a display panel 10 and a first component 20a overlapping the display panel 10. A cover window (not shown) protecting the display panel 10 may be further disposed on the display panel 10.

The display panel 10 may include a first auxiliary area AA1 that overlaps the first component 20a, and a main area MA in which a main image is displayed. The display panel 10 may include a substrate 100, a first conductive pattern 130a on the substrate 100, a display layer DISL on the first conductive pattern 130a, and a protection member PB disposed under the substrate 100. Because the display panel 10 may include the substrate 100, it may be understood that the first auxiliary area AA1 and the main area MA are defined in the substrate 100.

The display layer DISL may include a circuit layer PCL including a transistor TFT, a display element layer EDL including an organic light-emitting diode OLED as a display element, and a sealing member ENCM such as an encapsulation substrate. Insulating layer IL' may be arranged between the substrate 100 and the display layer DISL and Insulating layer IL may be arranged in the display layer DISL.

The substrate 100 may include an insulating material such as glass, quartz, or polymer resin. The substrate 100 may be a rigid substrate or a flexible substrate that may be bent, folded, or rolled.

The display panel 10 may provide an image by using pixels PX (refer to FIG. 1). A main pixel PXm among the pixels PX may be arranged in the main area MA, and a first auxiliary pixel PXa1 among the pixels PX may be arranged in the first auxiliary area AA1. Each of the main pixel PXm and the first auxiliary pixel PXa1 may include at least one transistor TFT and at least one organic light-emitting diode OLED electrically connected to the at least one transistor TFT. In other words, each of the main pixel PXm and the first auxiliary pixel PXa1 may be implemented through at least one transistor TFT and at least one organic light-emitting diode OLED. An area in which the first auxiliary pixel PXa1 is arranged in the first auxiliary area AA1 may be referred to as a first pixel area PXA1 (refer to FIG. 1).

Also, a first transmission area TA1, in which a display element is not arranged, may be arranged in the first auxiliary area AA1. The first transmission area TA1 may be an area through which light or signals emitted from the first component 20a arranged to correspond to the first auxiliary area AA1 or light or signals incident to the first component 20a is transmitted. The first pixel area PXA1 may be alternately arranged with the first transmission area TA1 in the first auxiliary area AA1.

The first conductive pattern 130a may be arranged between the substrate 100 and the display layer DISL, for example, between the substrate 100 and the transistor TFT or between the substrate 100 and the insulating layers IL and IL'. The first conductive pattern 130a may have at least one opening 130aOP through which light emitted from the first component 20a or directed to the first component 20a may pass. The opening 130aOP of the first conductive pattern 130a may overlap the first transmission area TA1 and may allow movement of light directed to the first component 20a or emitted from the first component 20a. A metal material portion (or a metal portion) of the first conductive pattern 130a may prevent light from diffracting through a narrow gap between transistors TFT arranged in the first auxiliary area AA1 or a narrow gap between wiring lines connected to each of the transistors TFT.

Although not shown in FIG. 2A, the first conductive pattern 130a may be electrically connected to the transistor TFT. For example, the first conductive pattern 130a may be connected to a gate electrode, a source electrode, or a drain electrode of the transistor TFT. The first conductive pattern 130a may have the same voltage level as the gate electrode, the source electrode, or the drain electrode of the transistor TFT. In case that the first conductive pattern 130a has a given voltage level, performance degradation of the transistor TFT may be prevented or reduced.

The insulating layers IL' arranged between the substrate 100 and the display layer DISL and the insulating layers IL arranged in the display layer DISL may have at least one opening IL_OP and at least one opening IL'_OP, respectively. Light emitted from the first component 20a or directed to the first component 20a may pass through each of the opening IL_OP of the insulating layer IL and the opening IL'_OP of the insulating layer IL'. The opening IL_OP of the insulating layer IL and the opening IL'_OP of the insulating layer IL' may overlap the first transmission area TA1 and may allow movement of light directed to the first component 20a or emitted from the first component 20a.

The display element layer EDL may be covered or overlapped by the sealing member ENCM. The sealing member ENCM may include an encapsulation substrate or a thin-film encapsulation layer.

In an embodiment, the sealing member ENCM may include an encapsulation substrate. The encapsulation substrate may be arranged to face the substrate 100 with the display element layer EDL therebetween. A gap may be between the encapsulation substrate and the display element layer EDL. The encapsulation substrate may include glass. A sealant including frit or the like may be arranged between the substrate 100 and the encapsulation substrate, and the sealant may be arranged in the peripheral area PA described above with reference to FIG. 1. The sealant arranged in the peripheral area PA may surround the display area DA (refer to FIG. 1) and prevent moisture from penetrating through the side surface of the display device 1.

In an embodiment, the sealing member ENCM may include a thin-film encapsulation layer. The thin-film encapsulation layer may include at least one inorganic encapsulation layer and at least one organic encapsulation layer. For example, the thin-film encapsulation layer may include a first inorganic encapsulation layer, a second inorganic encapsulation layer, and an organic encapsulation layer therebetween.

The protection member PB may be attached to a lower portion of the substrate 100 to support and protect the substrate 100. The protection member PB may have an opening PB_OP corresponding to the first auxiliary area AA1. As the protection member PB has the opening PB_OP, the light transmittance of the first auxiliary area AA1 may be improved. The protection member PB may include polyethylene terephthalate (PET) or polyimide (PI).

The area of the first auxiliary area AA1 may be greater than an area in which the first component 20a is arranged. Accordingly, the area of the opening PB_OP provided in the protection member PB may not match the area of the first auxiliary area AA1.

FIG. 2B is a schematic cross-sectional view illustrating another portion of the display device 1 of FIG. 1. In FIG. 2B, the same reference numerals as those of FIG. 2A refer to the same members, and redundant descriptions thereof will be omitted.

Referring to FIG. 2B, the display device 1 may include a display panel 10 and a second component 20b overlapping the display panel 10. The display panel 10 may include a second auxiliary area AA2 that is an area overlapping the second component 20b. Because the display panel 10 may include the substrate 100, it may be understood that the second auxiliary area AA2 is defined in the substrate 100.

The display panel 10 may provide an image by using pixels PX (refer to FIG. 1). A second auxiliary pixel PXa2 among the pixels PX may be arranged in the second auxiliary area AA2. The second auxiliary pixel PXa2 may include at least one transistor TFT and at least one organic light-emitting diode OLED electrically connected to the at least one transistor TFT. In other words, the second auxiliary pixel PXa2 may be implemented through at least one transistor TFT and at least one organic light-emitting diode OLED. An area in which the second auxiliary pixel PXa2 is arranged in the second auxiliary area AA2 may be referred to as a second pixel area PXA2 (refer to FIG. 1).

Also, a second transmission area TA2, in which a display element is not arranged, may be arranged in the second auxiliary area AA2. The second transmission area TA2 may be an area through which light or signals emitted from the second component 20b arranged to correspond to the second auxiliary area AA2 or light or signals incident to the second component 20b is transmitted. The second pixel area PXA2 may be alternately arranged with the second transmission area TA2 in the second auxiliary area AA2.

A second conductive pattern 130b may be arranged between the substrate 100 and the display layer DISL, for example, between the substrate 100 and the transistor TFT or between the substrate 100 and the insulating layers IL and IL'. The second conductive pattern 130b may have at least one opening 130bOP through which light emitted from the second component 20b or directed to the second component 20b may pass. The opening 130bOP of the second conductive pattern 130b may overlap the second transmission area TA2 and may allow movement of light directed to the second component 20b or emitted from the second component 20b. A metal material portion (or a metal portion) of the second conductive pattern 130b may prevent light from diffracting through a narrow gap between transistors TFT arranged in the second auxiliary area AA2 or a narrow gap between wiring lines connected to each of the transistors TFT.

Although not shown in FIG. 2B, the second conductive pattern 130b may be electrically connected to the transistor TFT. For example, the second conductive pattern 130b may be connected to a gate electrode, a source electrode, or a drain electrode of the transistor TFT. The second conductive pattern 130b may have the same voltage level as the gate electrode, the source electrode, or the drain electrode of the transistor TFT. In case that the second conductive pattern 130b has a given voltage level, performance degradation of the transistor TFT may be prevented or reduced.

The insulating layers IL' arranged between the substrate 100 and the display layer DISL and the insulating layers IL arranged in the display layer DISL may have at least one opening IL_OP and at least one opening IL'_OP, respectively. Light emitted from the second component 20b or directed to the second component 20b may pass through each of the opening IL_OP of the insulating layer IL and the opening IL'_OP of the insulating layer IL'. The opening IL_OP of the insulating layer IL and the opening IL'_OP of the insulating layer IL' may overlap the second transmission area TA2 and may allow movement of light directed to the second component 20b or emitted from the second component 20b.

A protection member PB may include an opening PB_OP corresponding to the second auxiliary area AA2. As the protection member PB has the opening PB_OP, the light transmittance of the second auxiliary area AA2 may be improved. The area of the second auxiliary area AA2 may be greater than an area in which the second component 20b is arranged. Accordingly, the area of the opening PB_OP provided in the protection member PB may not match the area of the second auxiliary area AA2.

Figure 3:
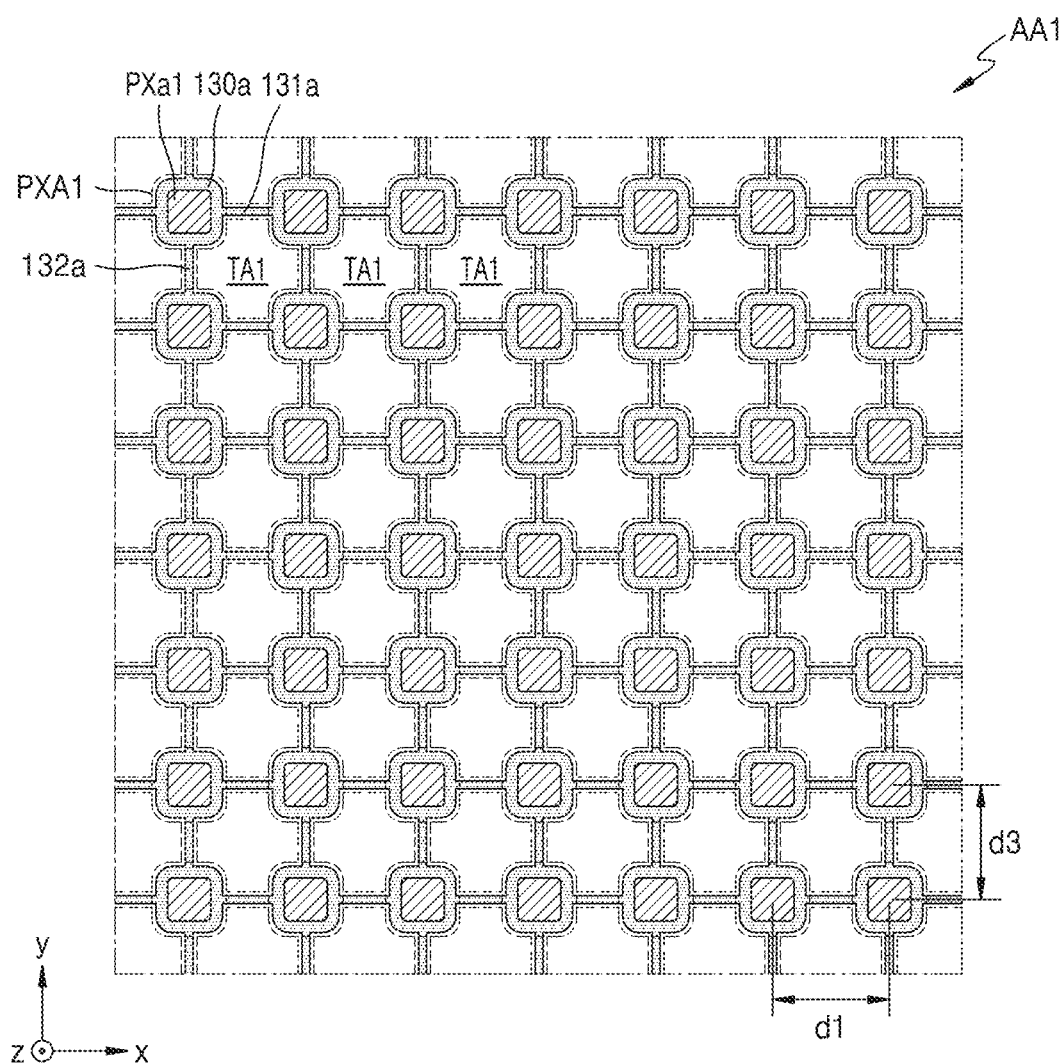
FIG. 3 is an enlarged schematic plan view illustrating a portion of a first auxiliary area in FIG. 1.

FIG. 3 is an enlarged schematic plan view illustrating a portion of the first auxiliary area AA1 in FIG. 1.

Referring to FIG. 3, the first auxiliary area AA1 may include first pixel areas PXA1 and first transmission areas TA1.

The first pixel areas PXA1 may be arranged in a matrix. The first pixel areas PXA1 may be arranged in a first direction (or a row direction) (for example, a ±x direction) and a second direction (or a column direction) (for example, a ±y direction). First conductive patterns 130a may be respectively disposed in the first pixel areas PXA1.

Although the shape of each of the first conductive patterns 130a is illustrated as a rounded rectangle in FIG. 3, as an embodiment, each of the first conductive patterns 130a may have various shapes, such as a circular shape, an elliptical shape, other polygonal shapes, or an irregular shape.

First auxiliary pixels PXa1 may be respectively disposed on the first conductive patterns 130a. The first auxiliary pixels PXa1 may be protected from light passing through the first auxiliary area AA1 through the first conductive patterns 130a. Each of the first auxiliary pixels PXa1 may include sub-pixels emitting light of different colors. For example, each of the first auxiliary pixels PXa1 may include at least one red sub-pixel, at least one green sub-pixel, and at least one blue sub-pixel.

Among the first conductive patterns 130a, first conductive patterns 130a adjacent to each other in the first direction (for example, the ±x direction) may be connected to each other through first connection patterns 131a. Among the first conductive patterns 130a, first conductive patterns 130a adjacent to each other in the second direction (for example, the ±y direction) may be connected to each other through second connection patterns 132a. The first conductive patterns 130a, the first connection patterns 131a, and the second connection patterns 132a may be arranged on a same layer and may be integral with each other.

Although not shown in FIG. 3, wiring lines that transmit electrical signals to the first auxiliary pixels PXa1 may be arranged on the first connection patterns 131a and the second connection patterns 132a. The electrical signals may include a data voltage (or a data signal), a scan signal, a light emission control signal, a driving voltage, an initialization voltage, and the like within the spirit and the scope of the disclosure. The wiring lines may be protected from light passing through the first auxiliary area AA1 through the first connection patterns 131a and the second connection patterns 132a.

The first transmission areas TA1 may be apart from each other, and may be two-dimensionally arranged in the first direction (for example, the ±x direction) and the second direction (for example, the ±y direction). The first transmission areas TA1 may be arranged between the first pixel areas PXA1. For example, each of the first transmission areas TA1 may be arranged between two adjacent first pixel areas PXA1 in the x direction, the y direction, or a direction oblique to the x direction and the y direction.

FIG. 3 illustrates an example in which the first transmission area TA1 substantially has a cross shape. However, in an embodiment, the first transmission area TA1 may have various shapes, such as a circular shape, an elliptical shape, a polygonal shape (for example, a quadrangular shape), or an irregular shape.

Figure 4:
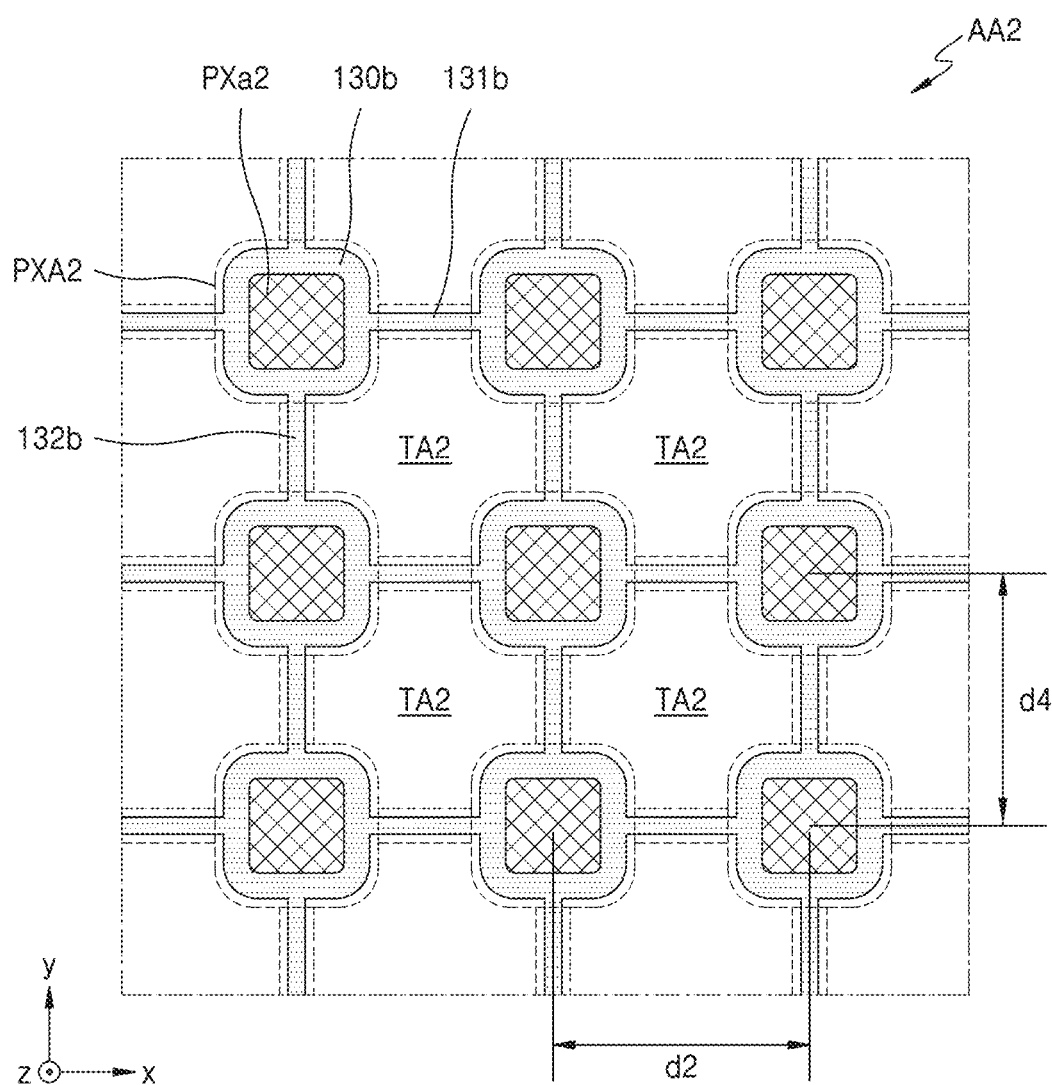
FIG. 4 is an enlarged schematic plan view illustrating a portion of a second auxiliary area in FIG. 1.

FIG. 4 is an enlarged schematic plan view illustrating a portion of the second auxiliary area AA2 in FIG. 1.

Referring to FIG. 4, the second auxiliary area AA2 may include second pixel areas PXA2 and second transmission areas TA2.

The second pixel areas PXA2 may be arranged in a matrix. The second pixel areas PXA2 may be arranged in the first direction (for example, the ±x direction) and the second direction (for example, the ±y direction). Second conductive patterns 130b may be respectively disposed on the second pixel areas PXA2.

Although the shape of each of the second conductive patterns 130b is illustrated as a rounded rectangle in FIG. 4, as an embodiment, each of the second conductive patterns 130b may have various shapes, such as a circular shape, an elliptical shape, other polygonal shapes, or an irregular shape.

Second auxiliary pixels PXa2 may be respectively disposed on the second conductive patterns 130b. The second auxiliary pixels PXa2 may be protected from light passing through the second auxiliary area AA2 through the second conductive patterns 130b. Each of the second auxiliary pixels PXa2 may include sub-pixels emitting light of different colors. For example, each of the second auxiliary pixels PXa2 may include at least one red sub-pixel, at least one green sub-pixel, and at least one blue sub-pixel.

Among the second conductive patterns 130b, second conductive patterns 130b adjacent to each other in the first direction (for example, the ±x direction) may be connected to each other through third connection patterns 131b. Among the second conductive patterns 130b, second conductive patterns 130b adjacent to each other in the second direction (for example, the ±y direction) may be connected to each other through fourth connection patterns 132b. The second conductive patterns 130b, the third connection patterns 131b, and the fourth connection patterns 132b may be arranged on a same layer and may be integral with each other.

Although not shown in FIG. 4, wiring lines that transmit electrical signals to the second auxiliary pixels PXa2 may be arranged on the third connection patterns 131b and the fourth connection patterns 132b. The electrical signals may include a data voltage (or a data signal), a scan signal, a light emission control signal, a driving voltage, an initialization voltage, and the like within the spirit and the scope of the disclosure. The wiring lines may be protected from light passing through the second auxiliary area AA2 through the third connection patterns 131b and the fourth connection patterns 132b.

The second transmission areas TA2 may be apart from each other, and may be two-dimensionally arranged in the first direction (for example, the ±x direction) and the second direction (for example, the ±y direction). The second transmission areas TA2 may be arranged between the second pixel areas PXA2. For example, each of the second transmission areas TA2 may be arranged between two adjacent second pixel areas PXA2 in the x direction, the y direction, or a direction oblique to the x direction and the y direction.

FIG. 4 illustrates an example in which the second transmission area TA2 substantially has a cross shape. However, in an embodiment, the second transmission area TA2 may have various shapes, such as a circular shape, an elliptical shape, a polygonal shape (for example, a quadrangular shape), or an irregular shape.

Comparing FIG. 3 and FIG. 4 to each other, the number of first conductive patterns 130a per unit area may be different from the number of second conductive patterns 130b per unit area. In other words, the number of first auxiliary pixels PXa1 per unit area may be different from the number of second auxiliary pixels PXa2 per unit area. In other words, the resolution of the first auxiliary area AA1 may be different from that of the second auxiliary area AA2. For example, the number of first conductive patterns 130a per unit area may be greater than the number of second conductive patterns 130b per unit area. The number of first auxiliary pixels PXa1 per unit area may be greater than the number of second auxiliary pixels PXa2 per unit area. The resolution of the first auxiliary area AA1 may be higher than that of the second auxiliary area AA2.

In an embodiment, the size of each of the first conductive patterns 130a may be different from the size of each of the second conductive patterns 130b. For example, the size of each of the first conductive patterns 130a may be less than the size of each of the second conductive patterns 130b.

In an embodiment, a first separation distance d1 between first conductive patterns 130a adjacent to each other in the first direction (for example, the ±x direction) from among the first conductive patterns 130a may be different from a second separation distance d2 between second conductive patterns 130b adjacent to each other in the first direction (for example, the ±x direction) from among the second conductive patterns 130b. For example, the first separation distance d1 may be less than the second separation distance d2.

In an embodiment, a third separation distance d3 between first conductive patterns 130a adjacent to each other in the second direction (for example, the ±y direction) from among the first conductive patterns 130a may be different from a fourth separation distance d4 between second conductive patterns 130b adjacent to each other in the second direction (for example, the ±y direction) from among the second conductive patterns 130b. For example, the third separation distance d3 may be less than the fourth separation distance d4.

In an embodiment, the size of each of the first transmission areas TA1 may be different from the size of each of the second transmission areas TA2. For example, the size of each of the first transmission areas TA1 may be less than the size of each of the second transmission areas TA2.

As such, the structures of the first conductive patterns 130a and the first transmission areas TA1, arranged in the first auxiliary area AA1 may be different from the structures of the second conductive patterns 130b and the second transmission areas TA2, arranged in the second auxiliary area AA2. A function of the first component 20a arranged to correspond to the first auxiliary area AA1 may be different from a function of the second component 20b arranged to correspond to the second auxiliary area AA2. In case that the structure of the first auxiliary area AA1 is different from the structure of the second auxiliary area AA2, both the function of the first component 20a and the function of the second component 20b may not be limited.

Figure 5:
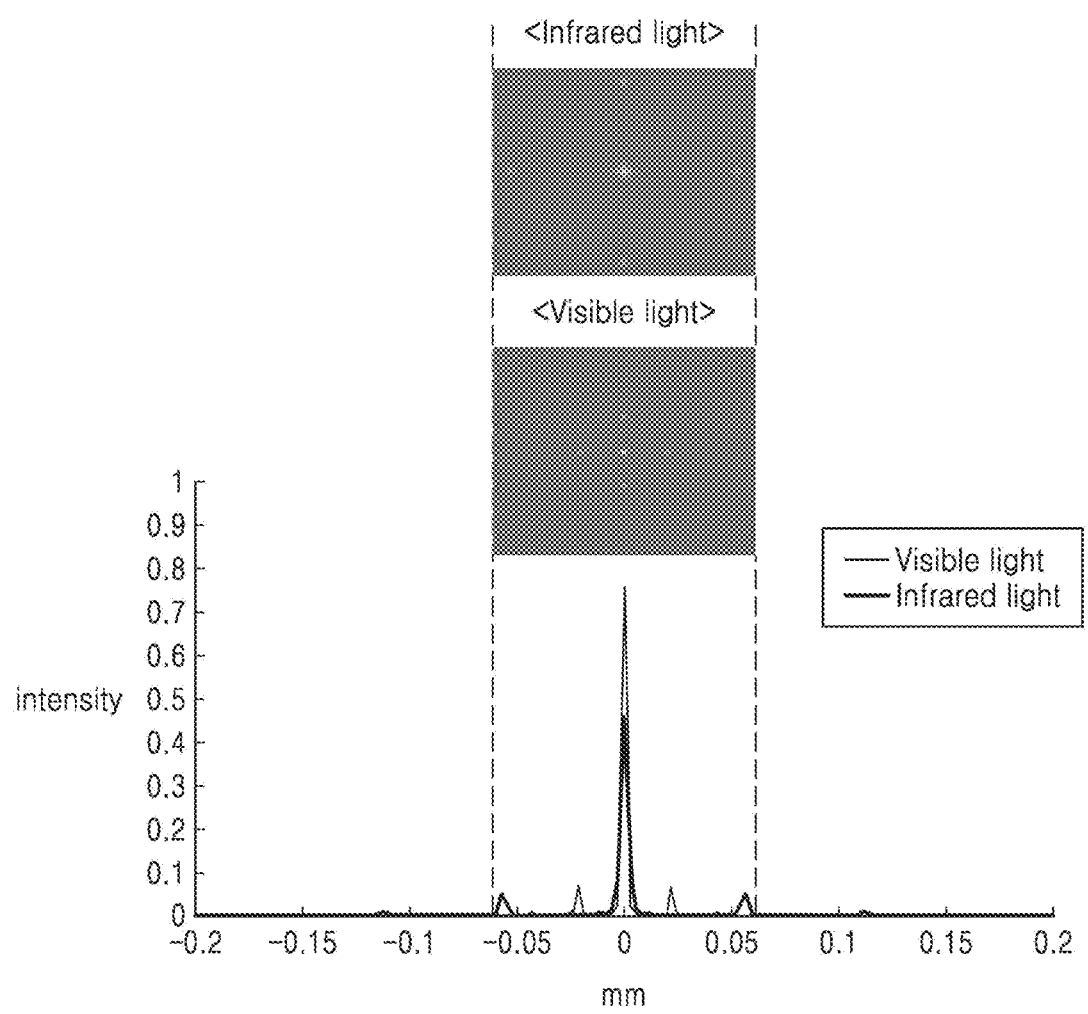
FIG. 5 is a graph for explaining diffraction in a visible ray wavelength band and an infrared wavelength band according to a comparative example.
Figure 6:
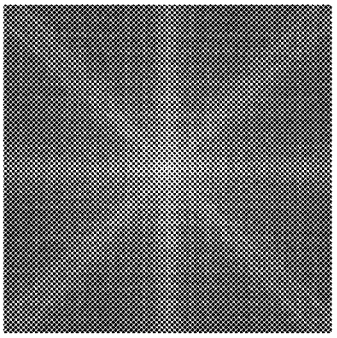
FIG. 6 is a diagram for explaining diffraction in a visible ray wavelength band and an infrared wavelength band according to a comparative example.
Figure 6:
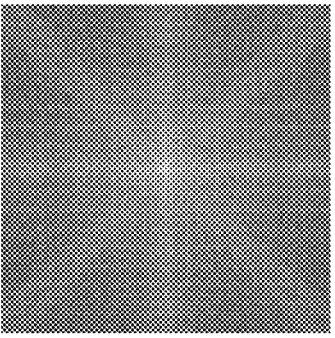
Figure 7:
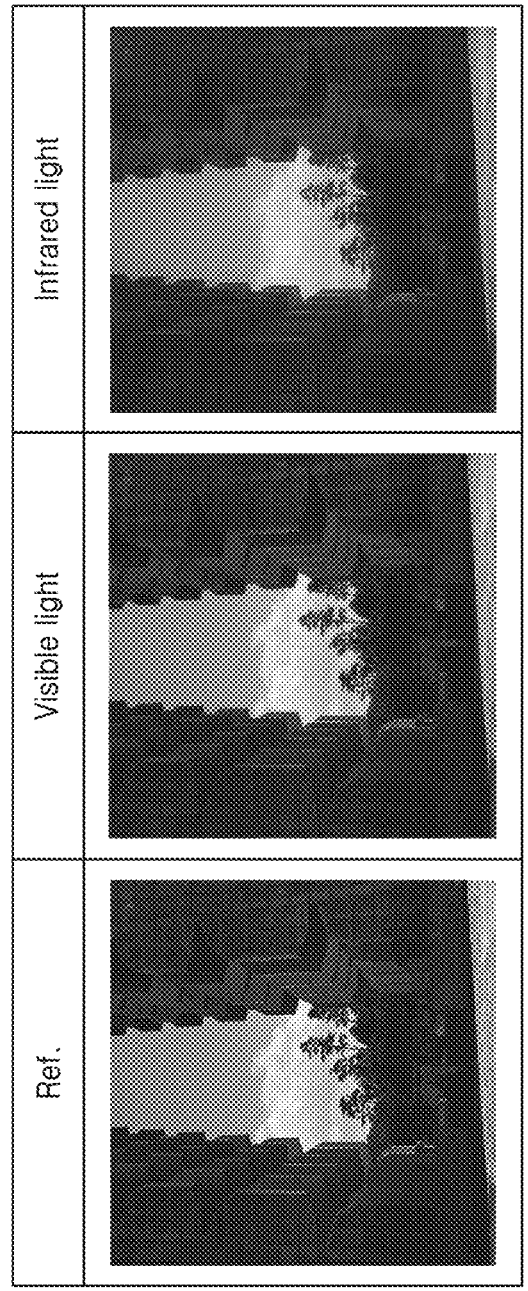
FIG. 7 is a diagram for explaining diffraction in a visible ray wavelength band and an infrared wavelength band according to a comparative example.

FIG. 5 is a graph for explaining diffraction in a visible ray wavelength band and an infrared wavelength band according to a comparative example, and FIGS. 6 and 7 are diagrams for explaining diffraction in a visible ray wavelength band and an infrared wavelength band according to comparative examples. By way of example, FIGS. 5 to 7 are diagrams for explaining the diffraction of light in a visible ray wavelength band and light in an infrared wavelength band, transmitted through auxiliary areas, in case that the structures of the auxiliary areas are the same, as comparative examples. That the structures of the auxiliary areas are the same may mean that the sizes of conductive patterns respectively arranged in the auxiliary areas are the same, the number of conductive patterns per unit area is the same between the auxiliary areas, or the sizes of the transmission areas are the same.

First, referring to FIG. 5, light in the visible ray wavelength band transmitted through an auxiliary area was measured at 0 and in a region adjacent to 0, whereas light in the infrared wavelength band transmitted through an auxiliary area was measured at 0 and in a region slightly separated from 0. It may be determined that the light in the infrared wavelength band is more diffracted than the light in the visible ray wavelength band (or it may be determined that the light in the infrared wavelength band diffracts better than the light in the visible ray wavelength band).

As shown in FIG. 6, an image in the case where light in the visible ray wavelength band is transmitted through an auxiliary area is clearer than an image in the case where light in the infrared wavelength band is transmitted through an auxiliary area. As shown in FIG. 7, the image in the case where the light in the visible ray wavelength band is transmitted through the auxiliary area is a little blurry compared to a reference image Ref., but is clearer than the image in the case where the light in the infrared wavelength band is transmitted through the auxiliary area. This is a result of a diffraction difference between the light in the infrared wavelength band and the light in the visible ray wavelength band.

As may be understood from FIGS. 5 to 7, a diffraction difference occurs according to a wavelength band. Accordingly, in case that components for receiving light of different wavelength bands are respectively arranged in auxiliary areas having a same structure, functions of some or a number of the components may be limited by diffraction, and thus, some or a number of the components may not operate normally.

However, in case that the structure of the first auxiliary area AA1 is different from the structure of the second auxiliary area AA2 as in the embodiment of the disclosure, the diffraction difference may be reduced even though the wavelength bands of light received by the components are different from each other, and thus, limitation of the function of each of the components due to diffraction may be reduced. Hereinafter, a detailed description will be provided with reference to FIGS. 8 and 9.

Figure 8:
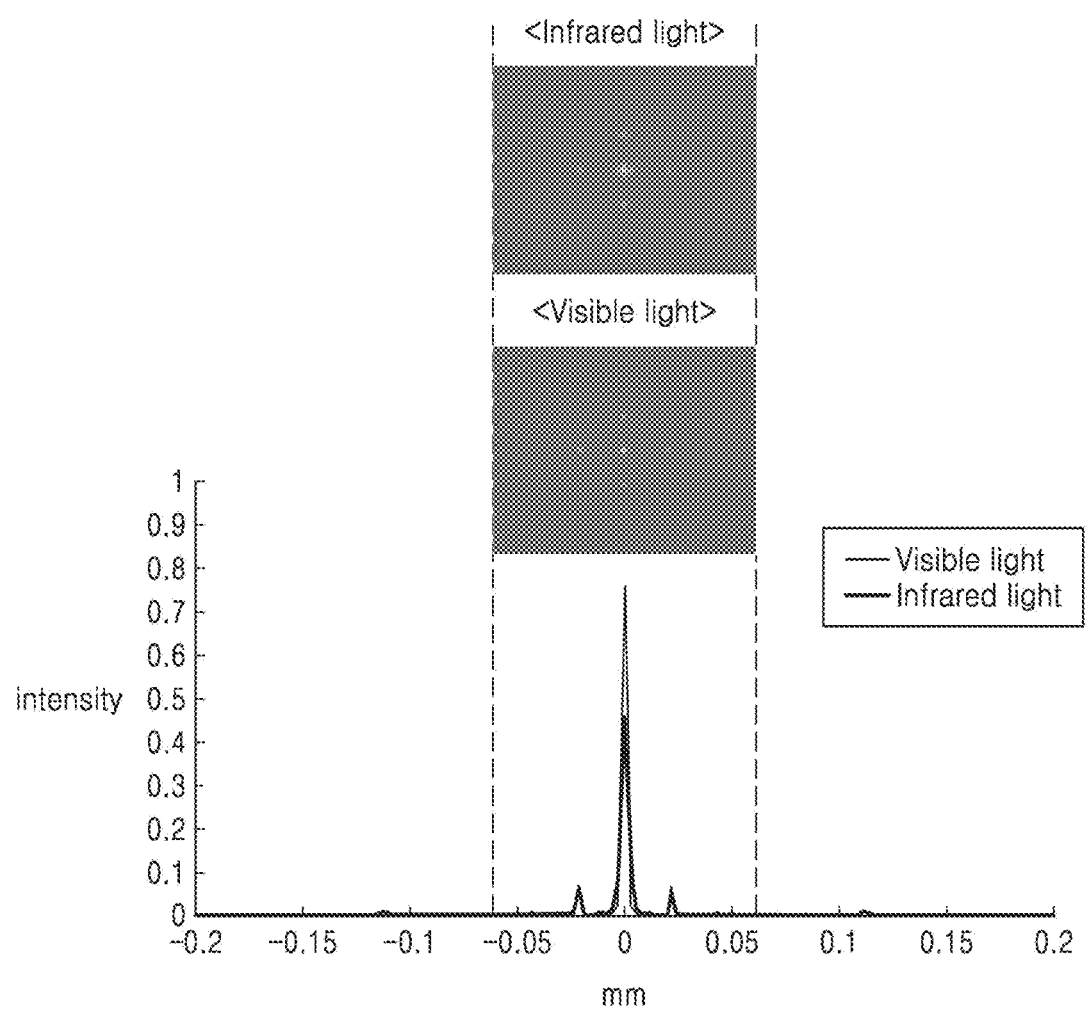
FIG. 8 is a graph for explaining diffraction in a visible ray wavelength band and an infrared wavelength band according to an embodiment.
Figure 9:
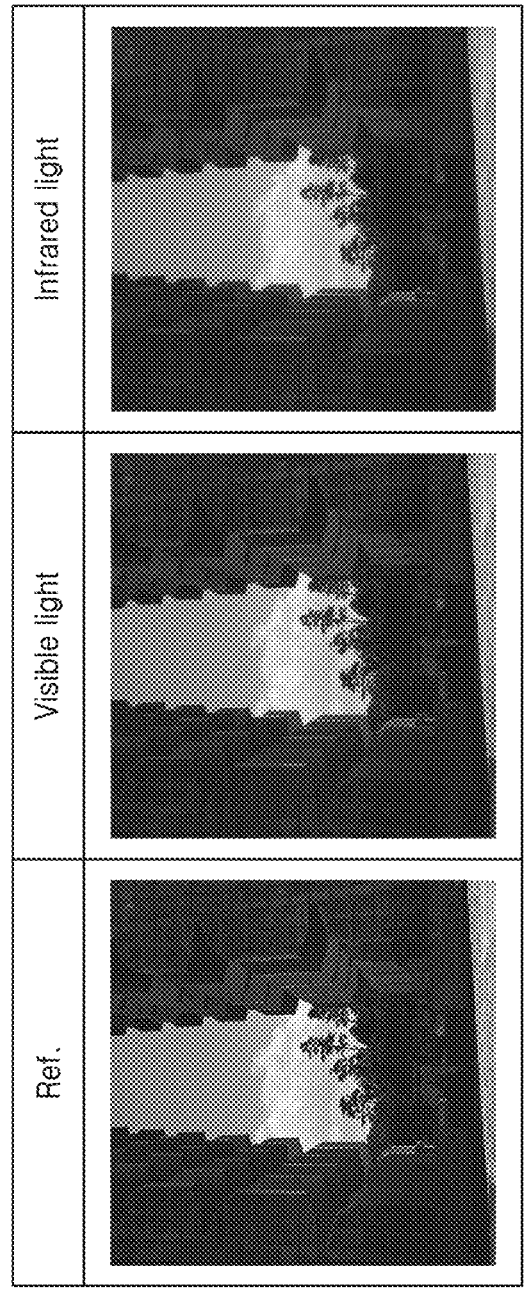
FIG. 9 is a diagram for explaining diffraction in a visible ray wavelength band and an infrared wavelength band according to an embodiment.

FIG. 8 is a graph for explaining diffraction in a visible ray wavelength band and an infrared wavelength band according to an embodiment, and FIG. 9 is a diagram for explaining diffraction in a visible ray wavelength band and an infrared wavelength band according to an embodiment. By way of example, FIGS. 8 and 9 are diagrams for explaining the diffraction of light in a visible ray wavelength band transmitted through the first auxiliary area AA1 of FIG. 3 and light in an infrared wavelength band transmitted through the second auxiliary area AA2 of FIG. 4.

First, referring to FIG. 8, unlike in FIG. 5, a position where the light in the visible ray wavelength band transmitted through the first auxiliary area AA1 is measured is similar to a position where the light in the infrared wavelength band transmitted through the second auxiliary area AA2 is measured. By making the structure of the second auxiliary area AA2 different from that of the first auxiliary area AA1, it may be understood that the diffraction of the light in the infrared wavelength band occurs similar to the diffraction of the light in the visible ray wavelength band.

Referring to FIG. 9, it may be understood that an image in the case where the light in the infrared wavelength band transmitted through the second auxiliary area AA2 is clearer than the image shown in FIG. 7. As such, the structures of conductive patterns arranged in an auxiliary area may be adjusted according to the degree of diffraction of light in each wavelength band, and the function of a component for receiving light in each wavelength band may not be limited.

Figure 10:
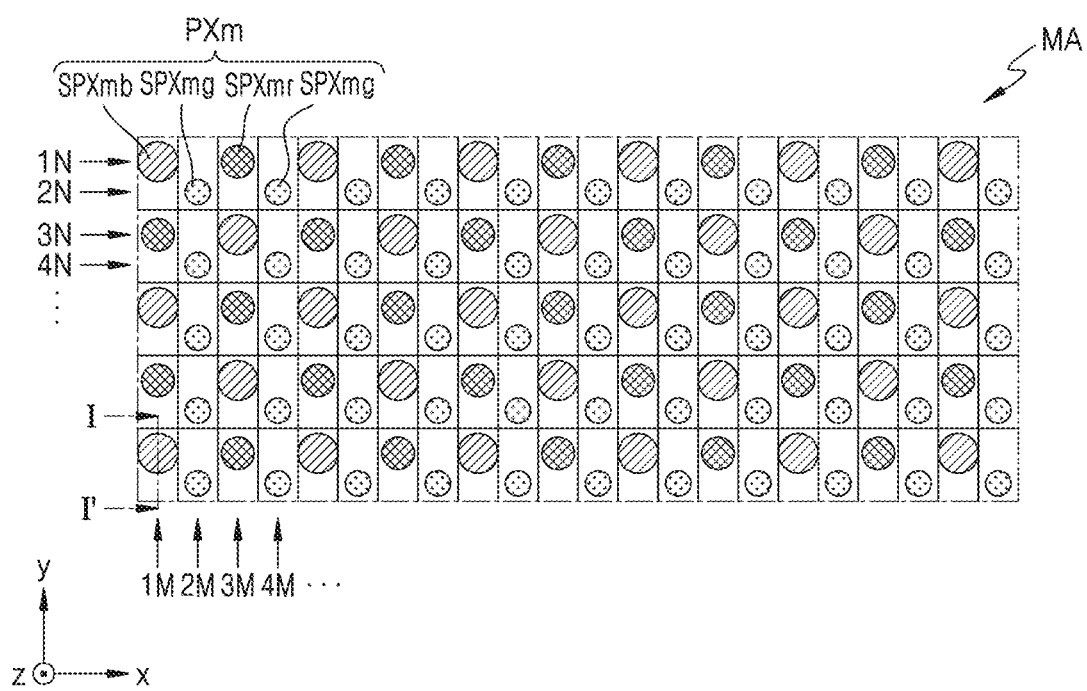
FIG. 10 is an enlarged schematic plan view illustrating a portion of a main area in FIG. 1.

FIG. 10 is an enlarged schematic plan view illustrating a portion of the main area MA in FIG. 1.

Referring to FIG. 10, main pixels PXm may be arranged in the main area MA. Each of the main pixels PXm may include sub-pixels emitting light of different colors. For example, the main pixel PXm may include a red main sub-pixel SPXmr, a green main sub-pixel SPXmg, and a blue main sub-pixel SPXmb.

In an embodiment, the red main sub-pixel SPXmr, the green main sub-pixel SPXmg, and the blue main sub-pixel SPXmb may be arranged in a PENTILE® type.

In a first row 1N, blue main sub-pixels SPXmb may be alternately arranged with red main sub-pixels SPXmr, and in a second row 2N adjacent to the first row 1N, green main sub-pixels SPXmg are arranged to be apart from each other by an interval. In a third row 3N adjacent to the second row 2N, red main sub-pixels SPXmr may be alternately arranged with blue main sub-pixels SPXmb, and in a fourth row 4N adjacent to the third row 3N, green main sub-pixels SPXmg are arranged to be apart from each other by an interval. This arrangement of pixels is repeated up to an N-th row. The sizes (or widths) of the blue main sub-pixel SPXmb and the red main sub-pixel SPXmr may be greater than the sizes (or widths) of the green main sub-pixel SPXmg.

The blue main sub-pixels SPXmb and the red main sub-pixels SPXmr, arranged in the first row 1N, and the green main sub-pixels SPXmg arranged in the second row 2N may be alternately arranged. Accordingly, blue main sub-pixels SPXmb may be alternately arranged with red main sub-pixels SPXmr in a first column 1M, and green main sub-pixels SPXmg are arranged to be apart from each other by an interval in a second column 2M adjacent to the first column 1M. Red main sub-pixels SPXmr may be alternately arranged with blue main sub-pixels SPXmb in a third column 3M adjacent to the second column 2M, and green main sub-pixels SPXmg are arranged to be apart from each other by an interval in a fourth column 4M adjacent to the third column 3M. This arrangement of pixels is repeated up to an M-th column.

In other words, the blue main sub-pixel SPXmb is arranged at each of the first and third vertices facing each other from among the vertices of a virtual quadrangle having the center point of the green main sub-pixel SPXmg as the center point of the virtual quadrangle, and the red main sub-pixel SPXmr is arranged at each of the second and fourth vertices, which are the remaining vertices. The virtual quadrangle may be variously modified. For example, the virtual quadrangle may be a rectangle, a rhombus, and a square.

Such a pixel arrangement structure is called a PENTILE® matrix structure or a PENTILE® structure, and a high resolution may be realized with a small number of pixels by using a rendering driving scheme that shares adjacent pixels to represent colors.

Although FIG. 10 illustrates an example in which sub-pixels of the main pixel PXm arranged in the main area MA are arranged in a PENTILE® matrix structure, the disclosure is not limited thereto. As an embodiment, the sub-pixels of the main pixel PXm, for example, the red main sub-pixel SPXmr, the green main sub-pixel SPXmg, and the blue main sub-pixel SPXmb, may be arranged in various shapes such as a stripe structure, a mosaic arrangement structure, and a delta arrangement structure.

Figure 11:
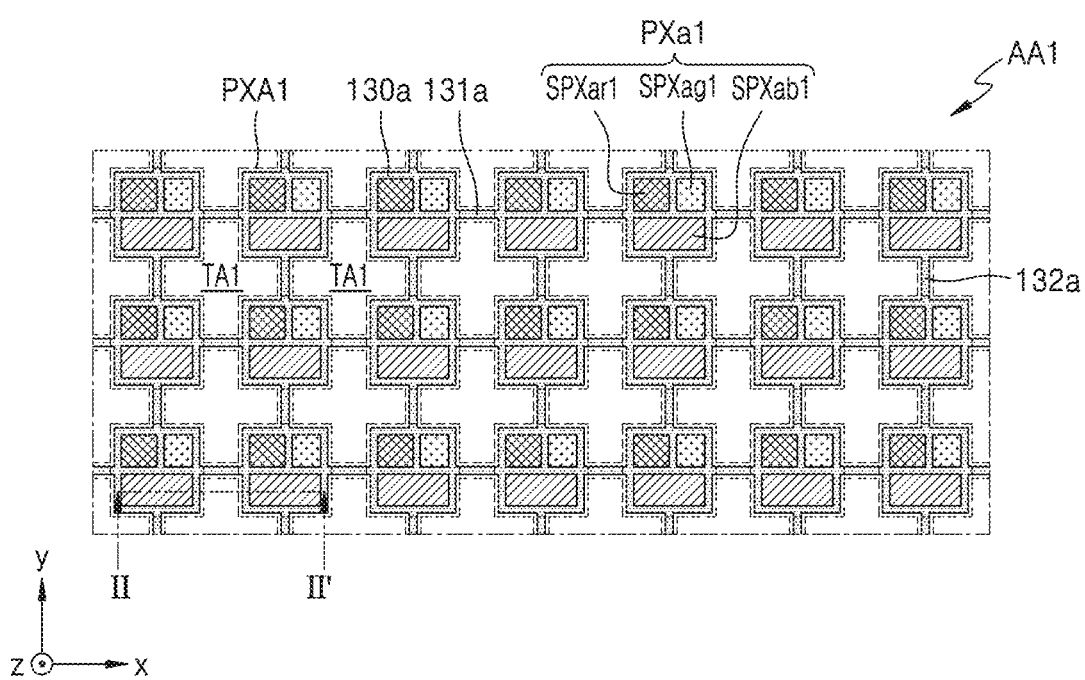
FIG. 11 is an enlarged schematic plan view illustrating a portion of the first auxiliary area in FIG. 1.

FIG. 11 is an enlarged schematic plan view illustrating a portion of the first auxiliary area AA1 in FIG. 1. By way of example, FIG. 11 shows an example of FIG. 3 described above.

Referring to FIG. 11, the first auxiliary area AA1 may include first pixel areas PXA1 and first transmission areas TA1. The first pixel areas PXA1 may be arranged in a matrix, and the first transmission areas TA1 may be arranged between the first pixel areas PXA1.

First conductive patterns 130a may be respectively disposed in the first pixel areas PXA1. First conductive patterns 130a adjacent to each other in the first direction (for example, the ±x direction) may be connected to each other through first connection patterns 131a. First conductive patterns 130a adjacent to each other in the second direction (for example, the ±y direction) may be connected to each other through second connection patterns 132a. The first conductive patterns 130a, the first connection patterns 131a, and the second connection patterns 132a may be arranged on a same layer and may be integral with each other.

First auxiliary pixels PXa1 may be respectively disposed on the first conductive patterns 130a. Each of the first auxiliary pixels PXa1 may include sub-pixels emitting light of different colors. For example, the first auxiliary pixel PXa1 may include a first red auxiliary sub-pixel SPXar1, a first green auxiliary sub-pixel SPXag1, and a first blue auxiliary sub-pixel SPXab1.

Although FIG. 11 illustrates an example in which sub-pixels of the first auxiliary pixel PXa1 arranged in the first auxiliary area AA1 are arranged in a stripe structure, the disclosure is not limited thereto. As an embodiment, the sub-pixels of the first auxiliary pixel PXa1, for example, the first red auxiliary sub-pixel SPXar1, the first green auxiliary sub-pixel SPXag1, and the first blue auxiliary sub-pixel SPXab1, may be arranged in various shapes, such as a PENTILE® matrix structure, a mosaic arrangement structure, and a delta arrangement structure.

Figure 12:
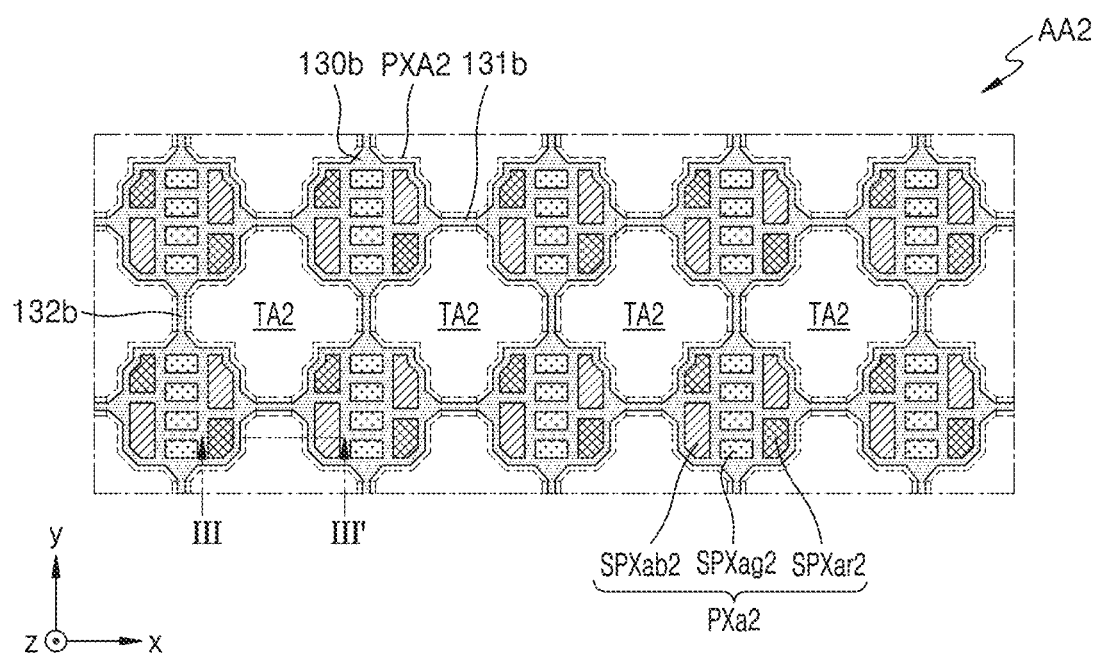
FIG. 12 is an enlarged schematic plan view illustrating a portion of the second auxiliary area in FIG. 1.

FIG. 12 is an enlarged schematic plan view illustrating a portion of the second auxiliary area AA2 of FIG. 1. By way of example, FIG. 12 shows an example of FIG. 4 described above.

Referring to FIG. 12, the second auxiliary area AA2 may include second pixel areas PXA2 and second transmission areas TA2. The second pixel areas PXA2 may be arranged in a matrix, and the second transmission areas TA2 may be arranged between the second pixel areas PXA2.

Second conductive patterns 130b may be respectively disposed in the second pixel areas PXA2. Second conductive patterns 130b adjacent to each other in the first direction (for example, the ±x direction) may be connected to each other through third connection patterns 131b. Second conductive patterns 130b adjacent to each other in the second direction (for example, the ±y direction) may be connected to each other through fourth connection patterns 132b. The second conductive patterns 130b, the third connection patterns 131b, and the fourth connection patterns 132b may be arranged on a same layer and may be integral with each other.

Second auxiliary pixels PXa2 may be respectively disposed on the second conductive patterns 130b. Each of the second auxiliary pixels PXa2 may include sub-pixels emitting light of different colors. For example, the second auxiliary pixel PXa2 may include a second red auxiliary sub-pixel SPXar2, a second green auxiliary sub-pixel SPXag2, and a second blue auxiliary sub-pixel SPXab2.

Comparing FIGS. 10, 11, and 12 to each other, the resolution of the main area MA may be higher than the resolution of the first auxiliary area AA1 and the resolution of the second auxiliary area AA2. The resolution of the first auxiliary area AA1 may be higher than that of the second auxiliary area AA2. In other words, the number of first auxiliary pixels PXa1 per unit area may be greater than the number of second auxiliary pixels PXa2 per unit area. In other words, the number of first conductive patterns 130a per unit area may be greater than the number of second conductive patterns 130b per unit area.

In an embodiment, the size of each of the first conductive patterns 130a may be different from the size of each of the second conductive patterns 130b. For example, the size of each of the first conductive patterns 130a may be less than the size of each of the second conductive patterns 130b.

In an embodiment, the size of each of the first transmission areas TA1 may be different from the size of each of the second transmission areas TA2. For example, the size of each of the first transmission areas TA1 may be less than the size of each of the second transmission areas TA2.

As such, the structures of the first conductive patterns 130a and the first transmission areas TA1, arranged in the first auxiliary area AA1 may be different from the structures of the second conductive patterns 130b and the second transmission areas TA2, arranged in the second auxiliary area AA2.

In an embodiment, the number of sub-pixels of the first auxiliary pixel PXa1 arranged in the first auxiliary area AA1 may be different from the number of sub-pixels of the second auxiliary pixel PXa2 arranged in the second auxiliary area AA2. For example, as shown in FIG. 11, one first auxiliary pixel PXa1 may include one first red auxiliary sub-pixel SPXar1, one first green auxiliary sub-pixel SPXag1, and one first blue auxiliary sub-pixel SPXab1. As shown in FIG. 12, one second auxiliary pixel PXa2 may include two second red auxiliary sub-pixels SPXar2, four second green auxiliary sub-pixels SPXag2, and two second blue auxiliary sub-pixels SPXab2. For example, the number of sub-pixels of the first auxiliary pixel PXa1 may be less than the number of sub-pixels of the second auxiliary pixel PXa2.

Figure 13:
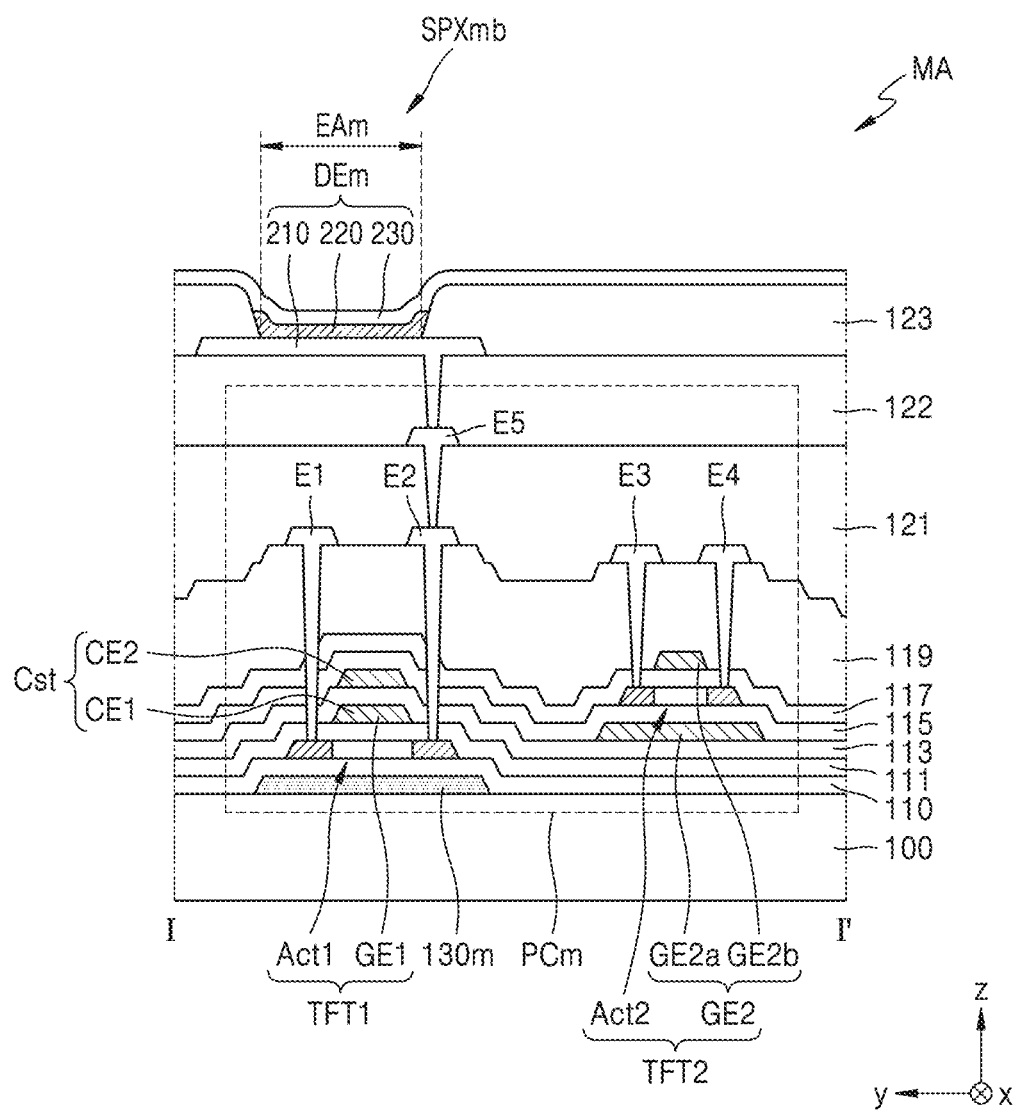
FIG. 13 is a schematic cross-sectional view of a portion of the main area, taken along line I-I' in FIG. 10.

FIG. 13 is a schematic cross-sectional view of a portion of the main area MA, taken along line I-I' in FIG. 10. By way of example, FIG. 13 illustrates the blue main sub-pixel SPXmb of FIG. 10. Hereinafter, although descriptions below are of the blue main sub-pixel SPXmb, the descriptions may also apply to the red main sub-pixel SPXmr and the green main sub-pixel SPXmg of FIG. 10.

Referring to FIG. 13, the blue main sub-pixel SPXmb may include a main pixel circuit PCm and a main display element DEm. The main pixel circuit PCm and the main display element DEm may be electrically connected to each other. The main display element DEm may be driven by the main pixel circuit PCm.

The main pixel circuit PCm may include at least one transistor and at least one capacitor. For example, as shown in FIG. 13, the main pixel circuit PCm may include a first transistor TFT1, a second transistor TFT2, and a storage capacitor Cst. The first transistor TFT1 may include a first semiconductor layer Act1 and a first gate electrode GE1, and the second transistor TFT2 may include a second semiconductor layer Act2 and a second gate electrode GE2. The second gate electrode GE2 may include a lower gate electrode GE2a and an upper gate electrode GE2b.

Hereinafter, a configuration in the main area MA of display device 1 (refer to FIG. 1) will be described in more detail according to a stacked structure with reference to FIG. 13.

A substrate 100 may include a glass material, a ceramic material, a metal material, or a flexible or bendable material. In case that the substrate 100 is flexible or bendable, the substrate 100 may include a polymer resin such as polyethersulfone, polyacrylate, polyetherimide, polyethylene naphthalate, PET, polyphenylene sulfide, polyarylate, PI, polycarbonate, or cellulose acetate propionate.

The substrate 100 may have a single-layer or multi-layer structure including the polymer resin, and may further include an inorganic layer in the case of the multi-layer structure. In an embodiment, the substrate 100 may have an organic/inorganic/organic structure.

A buffer layer 110 may reduce or block penetration of foreign materials, moisture, or external air from the bottom of the substrate 100, and may provide a flat surface on the substrate 100. The buffer layer 110 may include an inorganic material such as an oxide or a nitride, an organic material, or an organic/inorganic composite, and may have a single-layer or multi-layer structure including an inorganic material and/or an organic material.

A barrier layer (not shown) may be further included between the substrate 100 and the buffer layer 110. The barrier layer may prevent or reduce penetration of impurities from the substrate 100 or the like into the first semiconductor layer Act1 and the second semiconductor layer Act2. The barrier layer may include an inorganic material such as an oxide or a nitride, an organic material, or an organic/inorganic composite, and may have a single-layer or multi-layer structure including an inorganic material and/or an organic material.

A lower conductive pattern 130m may be between the substrate 100 and the buffer layer 110. The lower conductive pattern 130m may include a conductive material including molybdenum (Mo), aluminum (Al), copper (Cu), titanium (Ti), or the like, and may include a single layer or layers including the conductive material.

The lower conductive pattern 130m may at least partially overlap the first semiconductor layer Act1. The lower conductive pattern 130m may protect the first semiconductor layer Act1. The lower conductive pattern 130m may be such that an arbitrary (or preset) voltage is applied thereto. In case that a pixel circuit PCm including both an N-channel metal-oxide-semiconductor field-effect transistor (MOSFET) (NMOS) and a P-channel MOSFET (PMOS) is driven through the lower conductive pattern 130m to which an arbitrary voltage is applied, the accumulation of unnecessary charges in the first semiconductor layer Act1 may be prevented. As a result, characteristics of the first transistor TFT1 including the first semiconductor layer Act1 may be stably maintained.

The first semiconductor layer Act1 may be disposed on the buffer layer 110. The first semiconductor layer Act1 may include amorphous silicon or polysilicon. The first semiconductor layer Act1 may include a channel region, and a source region and a drain region arranged on both sides of the channel region. The source region and the drain region may be regions doped with a dopant. The first semiconductor layer Act1 may include a single layer or multiple layers.

A first insulating layer 111 and a second insulating layer 113 may be successively stacked on the substrate 100 to cover or overlap the first semiconductor layer Act1. The first insulating layer 111 and the second insulating layer 113 may each include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), or the like within the spirit and the scope of the disclosure. The $ZnO_x$ may include zinc oxide (ZnO) and/or zinc peroxide ($ZnO_2$).

The first gate electrode GE1 may be disposed on the first insulating layer 111. The first gate electrode GE1 may be arranged to at least partially overlap the first semiconductor layer Act1. The first gate electrode GE1 may include a conductive material including Mo, Al, Cu, Ti, or the like, and may include a single layer or multiple layers including the conductive material. For example, the first gate electrode GE1 may include a single layer including Mo.

An upper electrode CE2 and the lower gate electrode GE2a may be arranged on the second insulating layer 113. The upper electrode CE2 and the lower gate electrode GE2a may each include a conductive material including Mo, Al, Cu, Ti, or the like, and may include a single layer or multiple layers including the conductive material. For example, the upper electrode CE2 and the lower gate electrode GE2a may each include a single Mo layer.

In an embodiment, the storage capacitor Cst may include a lower electrode CE1 and the upper electrode CE2, and may overlap the first transistor TFT1 as shown in FIG. 13. For example, the first gate electrode GE1 of the first transistor TFT1 may function as the lower electrode CE1 of the storage capacitor Cst. Unlike this, the storage capacitor Cst may not overlap the first transistor TFT1 and may be present separately.

The upper electrode CE2 of the storage capacitor Cst overlaps the lower electrode CE1 with the second insulating layer 113 therebetween to form a capacitance. The second insulating layer 113 may function as a dielectric layer of the storage capacitor Cst.

The lower gate electrode GE2a may at least partially overlap the second semiconductor layer Act2 of the second transistor TFT2. The lower gate electrode GE2a may protect the second semiconductor layer Act2. The lower gate electrode GE2a may be such that an arbitrary (or preset) voltage is applied thereto. For example, the lower gate electrode GE2a may be electrically connected to the upper gate electrode GE2b. The lower gate electrode GE2a may be substantially synchronized with the upper gate electrode GE2b.

A third insulating layer 115 may be disposed on the second insulating layer 113 to cover or overlap the upper electrode CE2 and the lower gate electrode GE2a. The third insulating layer 115 may include $SiO_2$, $SiN_x$, SiON, $Al_2O_3$, $TiO_2$, $Ta_2O_5$, $HfO_2$, $ZnO_x$, or the like within the spirit and the scope of the disclosure. The ZnO may include ZnO and/or $ZnO_2$.

The second semiconductor layer Act2 may be disposed on the third insulating layer 115. The second semiconductor layer Act2 may include an oxide semiconductor material. The second semiconductor layer Act2 may include an oxide of at least one material selected from the group consisting of indium (In), gallium (Ga), stannum (Sn), zirconium (Zr), vanadium (V), hafnium (Hf), cadmium (Cd), germanium (Ge), chrome (Cr), titanium (Ti), aluminum (Al), cesium (Cs), cerium (Ce), and Zinc (Zn).

For example, the second semiconductor layer Act2 may be an indium tin zinc oxide (ITZO) semiconductor layer, an indium gallium zinc oxide (IGZO) semiconductor layer, or the like within the spirit and the scope of the disclosure. Because the oxide semiconductor has a wide band gap (about 3.1 eV), high carrier mobility, and low leakage current, a voltage drop is not large even though a driving time is long, and thus, a luminance change according to the voltage drop is not large even during low-frequency driving.

The second semiconductor layer Act2 may include a channel region, and a source region and a drain region arranged on both sides of the channel region. The second semiconductor layer Act2 may include a single layer or multiple layers.

As described above, the lower gate electrode GE2a may be disposed under the second semiconductor layer Act2. Because the second semiconductor layer Act2 including an oxide semiconductor material is vulnerable to light, the second semiconductor layer Act2 may be protected through the lower gate electrode GE2a. The lower gate electrode GE2a may prevent a change in device characteristics of the second transistor TFT2 including an oxide semiconductor material, the change being due to a photocurrent induced in the second semiconductor layer Act2 by external light incident through the substrate 100.

A fourth insulating layer 117 may be disposed on the third insulating layer 115 to cover or overlap the second semiconductor layer Act2. The fourth insulating layer 117 may include $SiO_2$, $SiN_x$, SiON, $Al_2O_3$, $TiO_2$, $Ta_2O_5$, $HfO_2$, $ZnO_x$, or the like within the spirit and the scope of the disclosure. The ZnO may include ZnO and/or $ZnO_2$.

FIG. 13 illustrates an example in which the fourth insulating layer 117 is disposed on the entire surface of the substrate 100 to cover or overlap the second semiconductor layer Act2. However, in an embodiment, the fourth insulating layer 117 may be patterned to overlap a portion of the second semiconductor layer Act2. For example, the fourth insulating layer 117 may be patterned to overlap the channel region of the second semiconductor layer Act2.

The upper gate electrode GE2b may be disposed on the fourth insulating layer 117. The upper gate electrode GE2b may be disposed to at least partially overlap the second semiconductor layer Act2. The upper gate electrode GE2b may include a conductive material including Mo, Al, Cu, Ti, or the like, and may include a single layer or multiple layers including the conductive material. For example, the upper gate electrode GE2b may include a single Mo layer.

FIG. 13 illustrates an example in which the first transistor TFT1 and the second transistor TFT2 are arranged on different layers. However, in an embodiment, the first transistor TFT1 and the second transistor TFT2 may be arranged on a same layer. For example, the second semiconductor layer Act2 of the second transistor TFT2 may be between the buffer layer 110 and the first insulating layer 111, and the upper gate electrode GE2b may be between the first insulating layer 111 and the second insulating layer 113. The first semiconductor layer Act1 of the first transistor TFT1 and the second semiconductor layer Act2 of the second transistor TFT2 may include a same material or a similar material. Also, some or a number of insulating layers may be omitted.

A fifth insulating layer 119 may be disposed on the fourth insulating layer 117 to cover or overlap the upper gate electrode GE2b. The fifth insulating layer 119 may include $SiO_2$, $SiN_x$, SiON, $Al_2O_3$, $TiO_2$, $Ta_2O_5$, $HfO_2$, $ZnO_x$, or the like within the spirit and the scope of the disclosure. The ZnO may include ZnO and/or $ZnO_2$.

A first electrode E1, a second electrode E2, a third electrode E3, and a fourth electrode E4 may be arranged on the fifth insulating layer 119. The first electrode E1, the second electrode E2, the third electrode E3, and the fourth electrode E4 may each include a conductive material including Mo, Al, Cu, Ti, or the like, and may include a single layer or multiple layers including the conductive material. For example, the first electrode E1, the second electrode E2, the third electrode E3, and the fourth electrode E4 may each have a multi-layer structure of Ti/Al/Ti.

The first electrode E1 may be connected to the first semiconductor layer Act1 through a contact hole formed in the first to fifth insulating layers 111, 113, 115, 117, and 119. A portion of the first electrode E1 may be buried in the contact hole, and the first electrode E1 and the first semiconductor layer Act1 may be connected to each other. The second electrode E2 may be connected to the first semiconductor layer Act1 through a contact hole formed in the first to fifth insulating layers 111, 113, 115, 117, and 119. A portion of the second electrode E2 may be buried in the contact hole, and the second electrode E2 and the first semiconductor layer Act1 may be connected to each other. The third electrode E3 may be connected to the second semiconductor layer Act2 through a contact hole formed in the fourth and fifth insulating layers 117 and 119. A portion of the third electrode E3 may be buried in the contact hole, and the third electrode E3 and the second semiconductor layer Act2 may be connected to each other. The fourth electrode E4 may be connected to the second semiconductor layer Act2 through a contact hole formed in the fourth and fifth insulating layers 117 and 119. A portion of the fourth electrode E4 may be buried in the contact hole, and the fourth electrode E4 and the second semiconductor layer Act2 may be connected to each other.

FIG. 13 illustrates an example in which the first electrode E1, the second electrode E2, the third electrode E3, and the fourth electrode E4 are arranged on the fifth insulating layer 119. However, in an embodiment, at least one of the first electrode E1 and the second electrode E2 and at least one of the third electrode E3 and the fourth electrode E4 may be omitted.

A sixth insulating layer 121 and a seventh insulating layer 122 may be successively stacked on the fifth insulating layer 119. The sixth insulating layer 121 and the seventh insulating layer 122 may each include a single layer or multiple layers including an organic material, and may each provide a flat upper surface. The sixth insulating layer 121 and the seventh insulating layer 122 may each include a general-purpose commercial polymer such as benzocyclobutene (BCB), PI, hexamethyldisiloxane (HMDSO), polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like within the spirit and the scope of the disclosure.

A fifth electrode E5 may be disposed on the sixth insulating layer 121. The fifth electrode E5 may include a conductive material including Mo, Al, Cu, Ti, or the like, and may include a single layer or multiple layers including the conductive material. For example, the fifth electrode E5 may have a multi-layer structure of Ti/Al/Ti.

The fifth electrode E5 may be connected to the second electrode E2 through a contact hole formed in the sixth insulating layer 121. A portion of the fifth electrode E5 may be buried in the contact hole, and the fifth electrode E5 and the second electrode E2 may be connected to each other.

A main display element DEm may be disposed on the seventh insulating layer 122. The main display element DEm may include a pixel electrode 210, an intermediate layer 220, and an opposite electrode 230.

The pixel electrode 210 may be a (semi)transmissive electrode or a reflective electrode. In an embodiment, the pixel electrode 210 may include a reflective layer including Ag, Mg, Al, Pt, Pd, Au, Ni, Nd, Ir, Cr, or a compound thereof, and a transparent or translucent electrode layer formed on the reflective layer. The transparent or translucent electrode layer may include at least one selected from the group including indium tin oxide (ITO), indium zinc oxide (IZO), zinc oxide (ZnO), indium oxide ($In_2O_3$), indium gallium oxide (IGO), and aluminum zinc oxide (AZO). In an embodiment, the pixel electrode 210 may include ITO/Ag/ITO.

The pixel electrode 210 may be connected to the fifth electrode E5 through a contact hole formed in the seventh insulating layer 122. A portion of the pixel electrode 210 may be buried in the contact hole, and the pixel electrode 210 and the fifth electrode E5 may be connected to each other. The pixel electrode 210 may be electrically connected to the first semiconductor layer Act1 through the second electrode E2 and the fifth electrode E5.

A pixel-defining layer 123 may be disposed on the seventh insulating layer 122. The pixel-defining layer 123 may have an opening exposing the pixel electrode 210, and a main emission area EAm of the main display element DEm may be defined by the opening. The pixel-defining layer 123 may increase the distance between the edge of the pixel electrode 210 and the opposite electrode 230 above the pixel electrode 210, thereby preventing the occurrence of an arc in the edge of the pixel electrode 210.

The pixel-defining layer 123 may include one or more organic insulating materials selected from the group consisting of PI, polyamide, acrylic resin, BCB, and phenol resin, and may be formed by spin coating or the like within the spirit and the scope of the disclosure. The pixel-defining layer 123 may include an organic insulating material. As another example, the pixel-defining layer 123 may include an inorganic insulating material such as silicon nitride, silicon oxynitride, or silicon oxide. As another example, the pixel-defining layer 123 may include an organic insulating material and an inorganic insulating material. In an embodiment, the pixel-defining layer 123 may include a light-blocking material and may be provided in black. The light-blocking material may include carbon black, carbon nanotubes, a resin or paste containing black dye, metal particles such as nickel, aluminum, molybdenum and/or an alloy thereof, metal oxide particles (for example, chromium oxide), metal nitride particles (for example, chromium nitride), or the like within the spirit and the scope of the disclosure. In case that the pixel-defining layer 123 may include a light-blocking material, reflection of external light by metal structures disposed under the pixel-defining layer 123 may be reduced.

The intermediate layer 220 may be arranged in the opening formed by the pixel-defining layer 123. The intermediate layer 220 may include an organic emission layer. The organic emission layer may include an organic material including a fluorescent or phosphorescent material emitting red, green, blue, or white light. The organic emission layer may include a low molecular weight organic material or a high molecular weight organic material, and a functional layer such as a hole transport layer (HTL), a hole injection layer (HIL), an electron transport layer (ETL), or an electron injection layer (EIL) may be optionally further disposed below and above the organic emission layer.

The intermediate layer 220 may be arranged to correspond to each of the pixel electrodes 210. However, the disclosure is not limited thereto. The intermediate layer 220 may be variously modified. For example, the intermediate layer 220 may include an integral layer over the pixel electrodes 210.

The opposite electrode 230 may be a transmissive electrode or a reflective electrode. In an embodiment, the opposite electrode 230 may be a transparent or translucent electrode, and may include a metal thin film having a small work function, which may include Li, Ca, LiF, Al, Ag, Mg, or a compound thereof, or may have materials with multilayer structures such as LiF/Ca or LiF/Al. A transparent conductive oxide (TCO) layer such as an ITO, IZO, ZnO, or $In_2O_3$ layer may be further disposed on the metal thin film. The opposite electrode 230 may be disposed over a display area DA (refer to FIG. 1) and may be arranged on the intermediate layer 220 and the pixel-defining layer 123. The opposing electrode 230 may be integral in display elements to correspond to pixel electrodes 210.

Because a display element including an organic emission layer may be readily damaged by moisture or oxygen from the outside, an encapsulation layer (not shown) may cover or overlap the display element to protect the display element. The encapsulation layer may be disposed on the opposite electrode 230, to cover or overlap the display area DA, and extend to at least a portion of a peripheral area PA (refer to FIG. 1). The encapsulation layer may include at least one inorganic encapsulation layer and/or at least one organic encapsulation layer. For example, the encapsulation layer may include a first inorganic encapsulation layer, an organic encapsulation layer, and a second inorganic encapsulation layer. The at least one inorganic encapsulation layer may include at least one inorganic material selected from among aluminum oxide, titanium oxide, tantalum oxide, hafnium oxide, zinc oxide, silicon oxide, silicon nitride, and silicon oxynitride. The at least one organic encapsulation layer may include a polymer-based material. Examples of the polymer-based material may include an acrylic resin, an epoxy-based resin, PI, polyethylene, and the like within the spirit and the scope of the disclosure.

Figure 14:
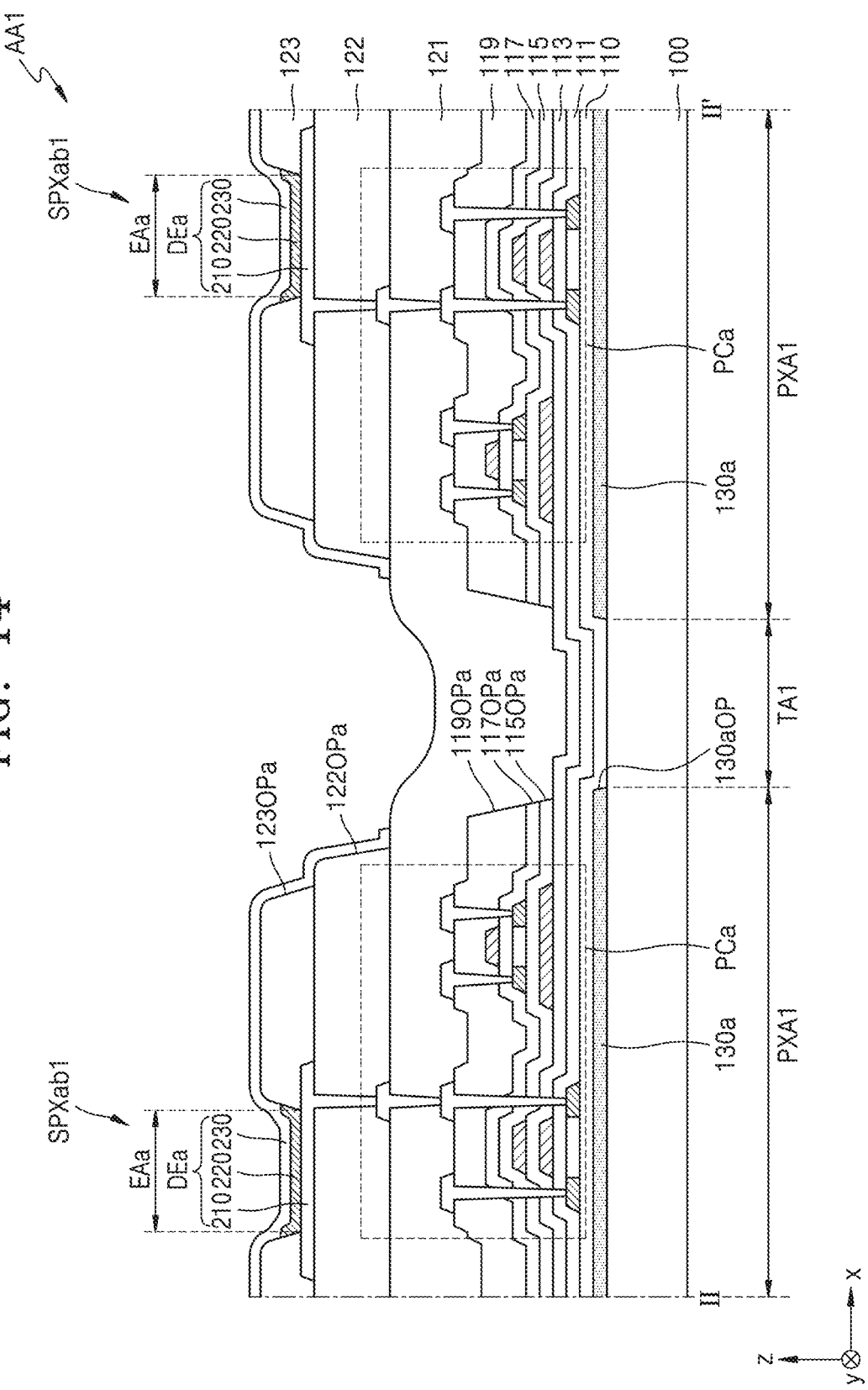
FIG. 14 is a schematic cross-sectional view of a portion of the first auxiliary area, taken along line II-IP in FIG. 11.

FIG. 14 is a schematic cross-sectional view of a portion of the first auxiliary area AA1, taken along line II-II' in FIG. 11. By way of example, FIG. 14 illustrates the first blue auxiliary sub-pixel SPXab1 of FIG. 11. Hereinafter, although descriptions below are of the first blue auxiliary sub-pixel SPXab1, the descriptions may also apply to the first red auxiliary sub-pixel SPXar1 and the first green auxiliary sub-pixel SPXag1 of FIG. 11. In FIG. 14, the same reference numerals as those of FIG. 13 refer to the same members, and redundant descriptions thereof will be omitted.

Referring to FIG. 14, the first blue auxiliary sub-pixel SPXab1 may include an auxiliary pixel circuit PCa and an auxiliary display element DEa. The auxiliary pixel circuit PCa and the auxiliary display element DEa may be electrically connected to each other. The auxiliary display element DEa may be driven by the auxiliary pixel circuit PCa. The auxiliary pixel circuit PCa may include at least one transistor and at least one capacitor.

The auxiliary display element DEa may include a pixel electrode 210, an intermediate layer 220, and an opposite electrode 230. The pixel electrode 210 of the auxiliary display element DEa may be partially exposed by an opening of the pixel-defining layer 123, and an emission area EAa of the auxiliary display element DEa may be defined by the opening of the pixel-defining layer 123.

A first conductive pattern 130a may be arranged in the first pixel area PXA1. The first conductive pattern 130a may be between the auxiliary pixel circuit PCa and the substrate 100. The first conductive pattern 130a may be between the substrate 100 and the first semiconductor layer Act1. The first conductive pattern 130a may include a conductive material including Mo, Al, Cu, Ti, or the like, and may include a single layer or multiple layers including the conductive material.

In an embodiment, at least one of insulating layers arranged on the substrate 100 may have an opening corresponding to a first transmission area TA1. For example, as shown in FIG. 14, the third insulating layer 115 may have an opening 115OPa corresponding to the first transmission area TA1. The fourth insulating layer 117 may have an opening 117OPa corresponding to the first transmission area TA1. The fifth insulating layer 119 may have an opening 119OPa corresponding to the first transmission area TA1. The seventh insulating layer 122 may have an opening 122OPa corresponding to the first transmission area TA1. The pixel-defining layer 123 may have an opening 123OPa corresponding to the first transmission area TA1.

FIG. 14 illustrates an example in which the buffer layer 110, the first insulating layer 111, the second insulating layer 113, and the sixth insulating layer 121 are arranged in the first transmission area TA1. However, in an embodiment, each of the buffer layer 110, the first insulating layer 111, the second insulating layer 113, and the sixth insulating layer 121 may have an opening corresponding to the first transmission area TA1.

In an embodiment, a conductive pattern disposed on the substrate 100 may have an opening corresponding to the first transmission area TA1. For example, as shown in FIG. 14, the first conductive pattern 130a may have an opening 130aOP corresponding to the first transmission area TA1.

Figure 15:
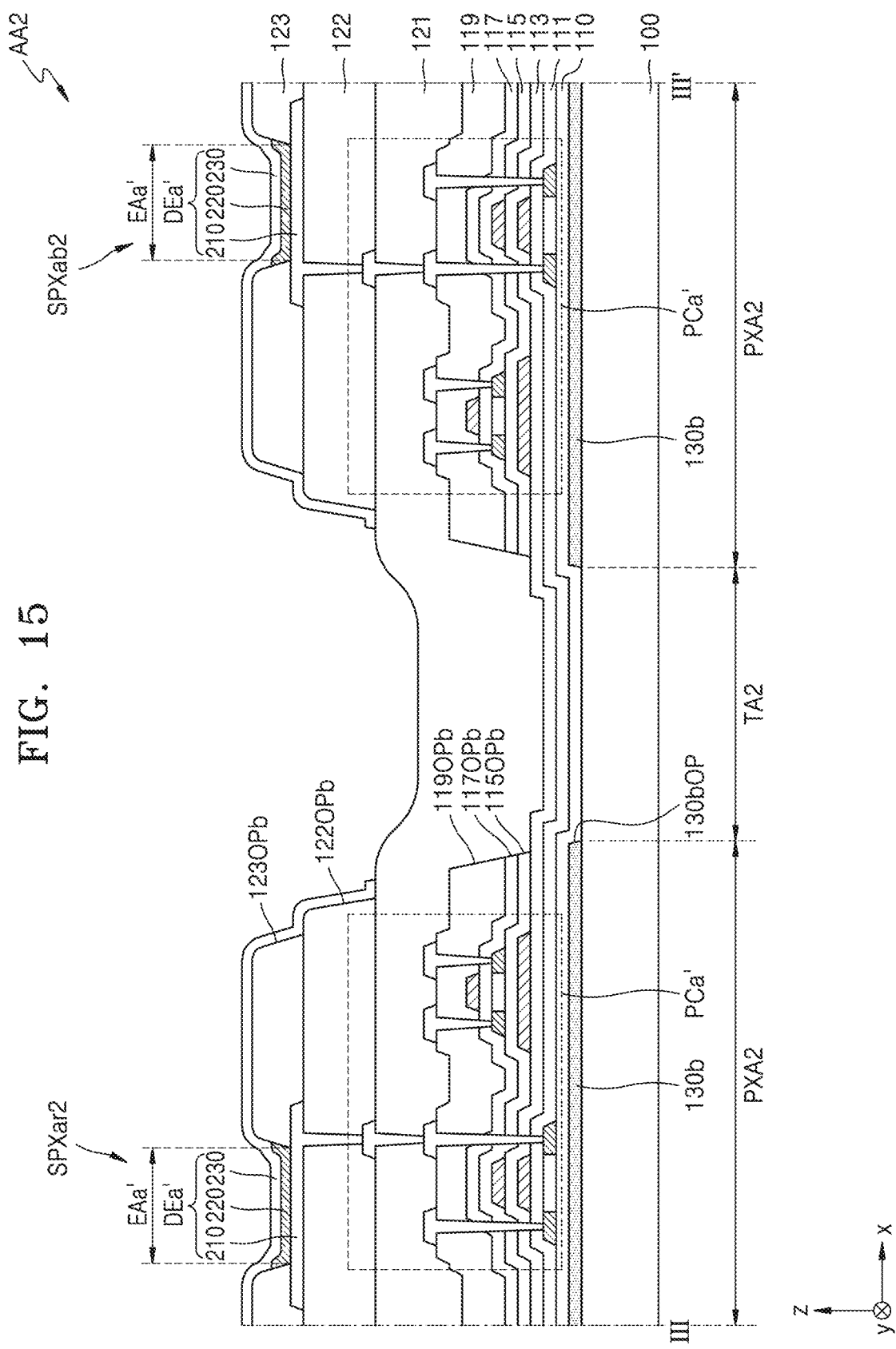
FIG. 15 is a schematic cross-sectional view of a portion of the second auxiliary area, taken along line in FIG. 12.

FIG. 15 is a schematic cross-sectional view of a portion of the second auxiliary area AA2, taken along line in FIG. 12. By way of example, FIG. 15 illustrates the second red auxiliary sub-pixel SPXar2 and the second blue auxiliary sub-pixel SPXab2 of FIG. 12. Hereinafter, although descriptions below are of the second red auxiliary sub-pixel SPXar2 and the second blue auxiliary sub-pixel SPXab2, the descriptions may also apply to the second green auxiliary sub-pixel SPXag2 of FIG. 12. In FIG. 15, the same reference numerals as those of FIG. 13 refer to the same members, and redundant descriptions thereof will be omitted.

Referring to FIG. 15, each of the second red auxiliary sub-pixel SPXar2 and the second blue auxiliary sub-pixel SPXab2 may include an auxiliary pixel circuit PCa' and an auxiliary display element DEa'. The auxiliary pixel circuit PCa' and the auxiliary display element DEa' may be electrically connected to each other. The auxiliary display element DEa' may be driven by the auxiliary pixel circuit PCa'. The auxiliary pixel circuit PCa' may include at least one transistor and at least one capacitor.

The auxiliary display element DEa' may include a pixel electrode 210, an intermediate layer 220, and an opposite electrode 230. The pixel electrode 210 of the auxiliary display element DEa' may be partially exposed by an opening of the pixel-defining layer 123, and an emission area EAa' of the auxiliary display element DEa' may be defined by the opening of the pixel-defining layer 123.

A second conductive pattern 130*b* may be arranged in the second pixel area PXA2. The second conductive pattern 130*b* may be between the auxiliary pixel circuit PCa' and the substrate 100. The second conductive pattern 130*b* may be between the substrate 100 and the first semiconductor layer Act1. The second conductive pattern 130*b* may include a conductive material including Mo, Al, Cu, Ti, or the like, and may include a single layer or multiple layers including the conductive material.

In an embodiment, at least one of insulating layers arranged on the substrate 100 may have an opening corresponding to a second transmission area TA2. For example, as shown in FIG. 15, the third insulating layer 115 may have an opening 115OPb corresponding to the second transmission area TA2. The fourth insulating layer 117 may have an opening 117OPb corresponding to the second transmission area TA2. The fifth insulating layer 119 may have an opening 119OPb corresponding to the second transmission area TA2. The seventh insulating layer 122 may have an opening 122OPb corresponding to the second transmission area TA2. The pixel-defining layer 123 may have an opening 123OPb corresponding to the second transmission area TA2.

FIG. 15 illustrates an example in which the buffer layer 110, the first insulating layer 111, the second insulating layer 113, and the sixth insulating layer 121 are arranged in the second transmission area TA2. However, in an embodiment, each of the buffer layer 110, the first insulating layer 111, the second insulating layer 113, and the sixth insulating layer 121 may have an opening corresponding to the second transmission area TA2.

In an embodiment, the conductive pattern disposed on the substrate 100 may have an opening corresponding to the second transmission area TA2. For example, as shown in FIG. 15, the second conductive pattern 130*b* may have an opening 130*b*OP corresponding to the second transmission area TA2.

Figure 16:
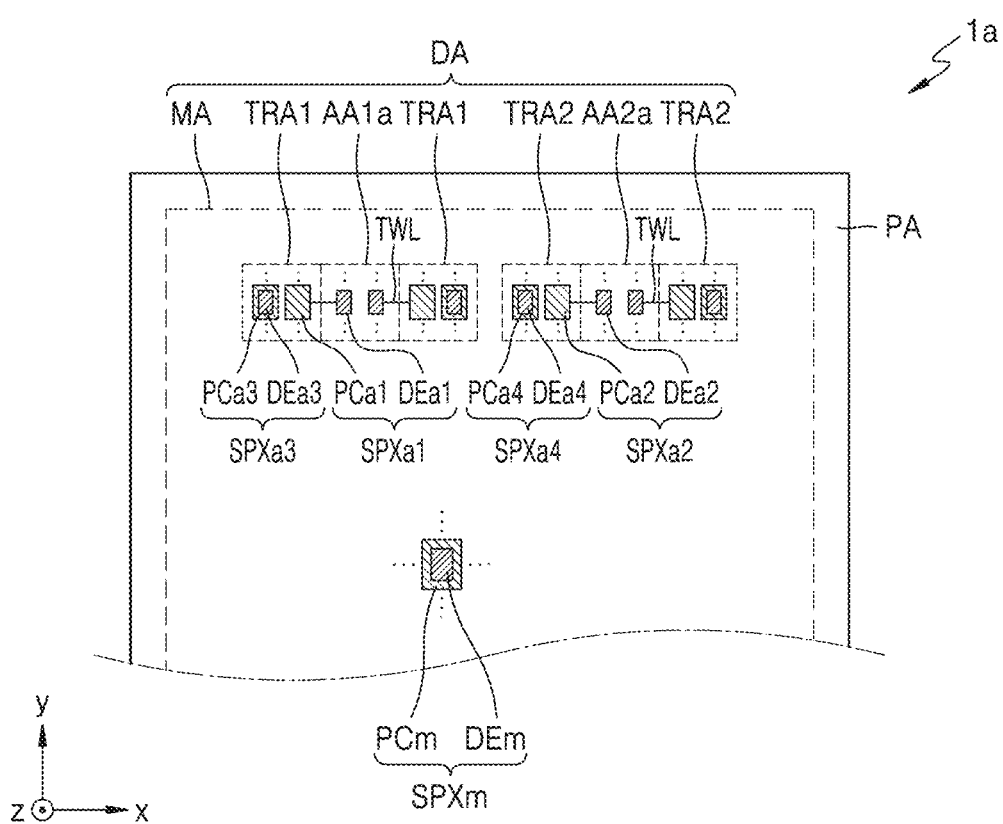
FIG. 16 is a schematic plan view illustrating a portion of a display device according to an embodiment.

FIG. 16 is a schematic plan view illustrating a portion of a display device 1*a* according to an embodiment.

Referring to FIG. 16, the display device 1*a* may include a display area DA and a peripheral area PA outside the display area DA. The display area DA may include a main area MA, a first auxiliary area AA1*a* including a first transmission area TA1*a* (refer to FIG. 17), a first intermediate area TRA1, a second auxiliary area AA2*a* including a second transmission area TA2*a* (refer to FIG. 18), and a second intermediate area TRA2. The first intermediate area TRA1 may at least partially surround the first auxiliary area AA1*a*, and the second intermediate area TRA2 may at least partially surround the second auxiliary area AA2*a*. The main area MA may at least partially surround the first auxiliary area AA1*a*, the first intermediate area TRA1, the second auxiliary area AA2*a*, and the second intermediate area TRA2.

FIG. 16 illustrates an example in which first intermediate areas TRA1 are respectively arranged on the left and right sides of the first auxiliary area AA1*a*. However, in an embodiment, the first intermediate area TRA1 may be arranged on the left or right side of the first auxiliary area AA1*a*. In an embodiment, the first intermediate area TRA1 may be disposed above the first auxiliary area AA1*a*. Although descriptions below are of the first intermediate area TRA1, the descriptions may also apply to the second intermediate area TRA2.

Main sub-pixels SPXm may be arranged in the main area MA. Each of the main sub-pixels SPXm may include a main display element DEm and a main pixel circuit PCm. The main display element DEm and the main pixel circuit PCm may be electrically connected to each other. The main display element DEm and the main pixel circuit PCm may at least partially overlap each other. The main sub-pixel SPXm may emit red, green, or blue light.

Each of the first auxiliary sub-pixels SPXa1 may include a first auxiliary display element DEa1 arranged in the first auxiliary area AA1*a* and a first auxiliary pixel circuit PCa1 arranged in the first intermediate area TRA1. The first auxiliary display element DEa1 and the first auxiliary pixel circuit PCa1 may be electrically connected to each other through a connection line TWL. The connection line TWL may include a transparent conductive material. In a plan view, the first auxiliary display element DEa1 and the first auxiliary pixel circuit PCa1 may be apart from each other. In other words, the first auxiliary display element DEa1 and the first auxiliary pixel circuit PCa1 may not overlap each other. The first auxiliary sub-pixel SPXa1 may emit red, green, or blue light.

An area, in which the first auxiliary display element DEa1 is not arranged, in the first auxiliary area AA1*a* may be defined as the first transmission area TA1*a*. The first transmission area TA1*a* may be an area through which light or signals emitted from a component arranged to correspond to the first auxiliary area AA1*a* or light or signals incident to the component is transmitted.

The connection line TWL may be arranged to at least partially overlap the first transmission area TA1*a*. Because the connection line TWL may include a transparent conductive material having high light transmittance, the light transmittance of the first transmission area TA1*a* may be secured. Also, because the first auxiliary pixel circuit PCa1 is not arranged in the first auxiliary area AA1*a*, the area of the first transmission area TA1*a* and light transmittance may be readily expanded and thus may be further improved.

Because the first auxiliary display elements DEa1 are not arranged in the first transmission area TA1*a*, the number of first auxiliary display elements DEa1 per unit area may be less than the number of main display elements DEm per unit area. For example, an image displayed in the first auxiliary area AA1*a* is an auxiliary image, and may have a lower resolution than that of an image displayed in the main area MA.

Each of the third auxiliary sub-pixels SPXa3 may include a third auxiliary display element DEa3 and a third auxiliary pixel circuit PCa3, arranged in the first intermediate area TRA1. The third auxiliary display element DEa3 and the third auxiliary pixel circuit PCa3 may be electrically connected to each other. The third auxiliary sub-pixel SPXa3 may emit red, green, or blue light.

Although the first intermediate area TRA1 does not include a transmission area, some or a number of pixel circuits (for example, the first auxiliary pixel circuit PCa1) disposed in the first intermediate area TRA1 is to drive the first auxiliary display elements DEa1 in the first auxiliary area AA1a, and the number of third auxiliary display elements DEa3 per unit area may be less than the number of main display elements DEm per unit area. For example, an image displayed in the first intermediate area TRA1 is an auxiliary image, and may have a lower resolution than that of an image displayed in the main area MA. On the other hand, the resolution of the first auxiliary area AA1a may be substantially the same as the resolution of the first intermediate area TRA1. In other words, the number of first auxiliary display elements DEa1 per unit area may be substantially equal to the number of third auxiliary display elements DEa3 per unit area.

Each of the second auxiliary sub-pixels SPXa2 may include a second auxiliary display element DEa2 arranged in the second auxiliary area AA2a and a second auxiliary pixel circuit PCa2 arranged in the second intermediate area TRA2. The second auxiliary display element DEa2 and the second auxiliary pixel circuit PCa2 may be electrically connected to each other through a connection line TWL. The connection line TWL may include a transparent conductive material. In a plan view, the second auxiliary display element DEa2 and the second auxiliary pixel circuit PCa2 may be apart from each other. In other words, the second auxiliary display element DEa2 and the second auxiliary pixel circuit PCa2 may not overlap each other. The second auxiliary sub-pixel SPXa2 may emit red, green, or blue light.

An area, in which the second auxiliary display element DEa2 is not arranged, in the second auxiliary area AA2a may be defined as the second transmission area TA2a. The second transmission area TA2a may be an area through which light or signals emitted from a component arranged to correspond to the second auxiliary area AA2a or light or signals incident to the component is transmitted.

The connection line TWL may be arranged to at least partially overlap the second transmission area TA2a. Because the connection line TWL may include a transparent conductive material having high light transmittance, the light transmittance of the second transmission area TA2a may be secured. Also, because the second auxiliary pixel circuit PCa2 is not arranged in the second auxiliary area AA2a, the area of the second transmission area TA2a and light transmittance may be readily expanded and thus may be further improved.

Because the second auxiliary display elements DEa2 are not arranged in the second transmission area TA2a, the number of the second auxiliary display elements DEa2 per unit area may be less than the number of the main display elements DEm per unit area. For example, an image displayed in the second auxiliary area AA2a is an auxiliary image, and may have a lower resolution than that of an image displayed in the main area MA.

In an embodiment, the resolution of the first auxiliary area AA1a may be different from the resolution of the second auxiliary area AA2a. In other words, the number of first auxiliary display elements DEa1 per unit area may be different from the number of second auxiliary display elements DEa2 per unit area. For example, the resolution of the first auxiliary area AA1a may be lower than that of the second auxiliary area AA2a. The number of first auxiliary display elements DEa1 per unit area may be less than the number of second auxiliary display elements DEa2 per unit area.

Each of the fourth auxiliary sub-pixels SPXa4 may include a fourth auxiliary display element DEa4 and a fourth auxiliary pixel circuit PCa4 arranged in the second intermediate area TRA2. The fourth auxiliary display element DEa4 and the fourth auxiliary pixel circuit PCa4 may be electrically connected to each other. The fourth auxiliary sub-pixel SPXa4 may emit red, green, or blue light.

Although the second intermediate area TRA2 does not include a transmission area, some or a number of pixel circuits (for example, the second auxiliary pixel circuit PCa2) disposed in the second intermediate area TRA2 is to drive the second auxiliary display elements DEa2 in the second auxiliary area AA2a, and the number of fourth auxiliary display elements DEa4 per unit area may be less than the number of main display elements DEm per unit area. For example, an image displayed in the second intermediate area TRA2 is an auxiliary image, and may have a lower resolution than that of an image displayed in the main area MA. On the other hand, the resolution of the second auxiliary area AA2a may be substantially the same as the resolution of the second intermediate area TRA2. In other words, the number of second auxiliary display elements DEa2 per unit area may be substantially the same as the number of fourth auxiliary display elements DEa4 per unit area.

Figure 17:
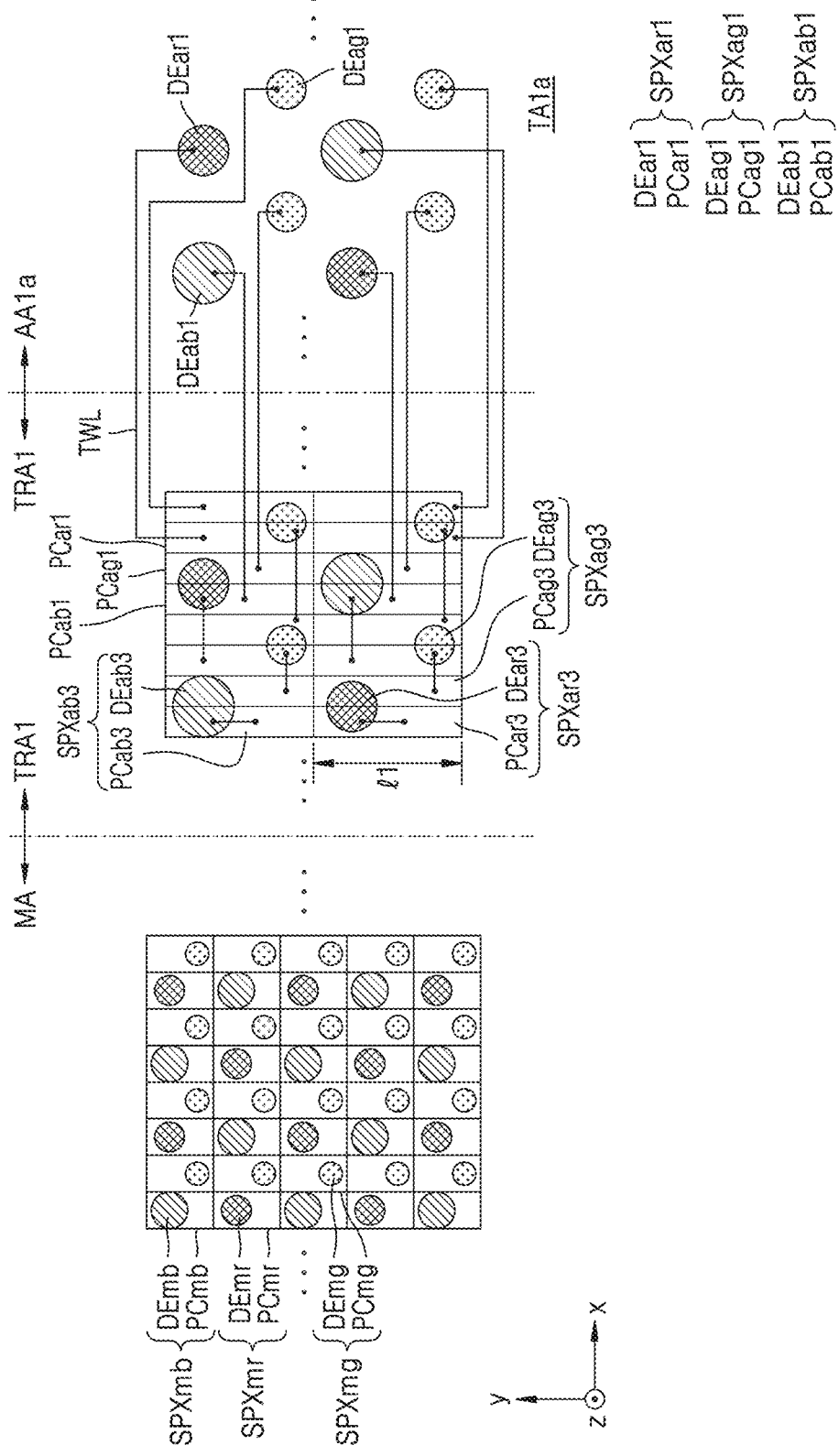
FIG. 17 is an enlarged schematic plan view illustrating a portion of FIG. 16.

FIG. 17 is an enlarged schematic plan view illustrating a portion of FIG. 16. By way of example, FIG. 17 illustrates portions of the main area MA, the first intermediate area TRA1, and the first auxiliary area AA1a in FIG. 16.

Referring to FIG. 17, the red main sub-pixel SPXmr may include a red main display element DEmr and a first main pixel circuit PCmr, arranged in the main area MA, the green main sub-pixel SPXmg may include a green main display element DEmg and a second main pixel circuit PCmg, arranged in the main area MA, and the blue main sub-pixel SPXmb may include a blue main display element DEmb and a third main pixel circuit PCmb, arranged in the main area MA. The red main display element DEmr and the first main pixel circuit PCmr may at least partially overlap each other, the green main display element DEmg and the second main pixel circuit PCmg may at least partially overlap each other, and the blue main display element DEmb and the third main pixel circuit PCmb may at least partially overlap each other.

FIG. 17 illustrates an example in which the red main sub-pixel SPXmr, the green main sub-pixel SPXmg, and the blue main sub-pixel SPXmb are arranged in a PENTILE® matrix structure. However, in an embodiment, the red main sub-pixel SPXmr, the green main sub-pixel SPXmg, and the blue main sub-pixel SPXmb may be arranged in various shapes, such as a stripe structure, a mosaic arrangement structure, and a delta arrangement structure.

The first red auxiliary sub-pixel SPXar1 may include a first red auxiliary display element DEar1 arranged in the first auxiliary area AA1a and a $(1-1)^{th}$ auxiliary pixel circuit PCar1 arranged in the first intermediate area TRA1. The first green auxiliary sub-pixel SPXag1 may include a first green auxiliary display element DEag1 arranged in the first auxiliary area AA1a and a $(1-2)^{th}$ auxiliary pixel circuit PCag1 arranged in the first intermediate area TRA1. The first blue auxiliary sub-pixel SPXab1 may include a first blue auxiliary display element DEab1 arranged in the first auxiliary area AA1a and a $(1-3)^{th}$ auxiliary pixel circuit PCab1 arranged in the first intermediate area TRA1. In a plan view, the first red auxiliary display element DEar1 and the $(1-1)^{th}$ auxiliary pixel circuit PCar1 may be apart from each other, the first green auxiliary display element DEag1 and the $(1-2)^{th}$ auxiliary pixel circuit PCag1 may be apart from each other, and the first blue auxiliary display element DEab1 and the (1-3)$^{th}$ auxiliary pixel circuit PCab1 may be apart from each other. The first red auxiliary display element DEar1 and the (1-1)$^{th}$ auxiliary pixel circuit PCar1 may be electrically connected to each other through a connection line TWL, the first green auxiliary display element DEag1 and the (1-2)$^{th}$ auxiliary pixel circuit PCag1 may be electrically connected to each other through a connection line TWL, and the first blue auxiliary display element DEab1 and the (1-3)$^{th}$ auxiliary pixel circuit PCab1 may be electrically connected to each other through a connection line TWL.

FIG. 17 illustrates an example in which the first red auxiliary display element DEar1, the first green auxiliary display element DEag1, and the first blue auxiliary display element DEab1 are arranged in a PENTILE® matrix structure. However, in an embodiment, the first red auxiliary display element DEar1, the first green auxiliary display element DEag1, and the first blue auxiliary display element DEab1 may be arranged in various shapes such as a stripe structure, a mosaic arrangement structure, and a delta arrangement structure.

The third red auxiliary sub-pixel SPXar3 may include a third red auxiliary display element DEar3 and a (3-1)$^{th}$ auxiliary pixel circuit PCar3, arranged in the first intermediate area TRA1. The third green auxiliary sub-pixel SPXag3 may include a third green auxiliary display element DEag3 and a (3-2)$^{th}$ auxiliary pixel circuit PCag3, arranged in the first intermediate area TRA1. The third blue auxiliary sub-pixel SPXab3 may include a third blue auxiliary display element DEab3 and a (3-3)$^{th}$ auxiliary pixel circuit PCab3, arranged in the intermediate area TRA1.

FIG. 17 illustrates an example in which the third red auxiliary display element DEar3, the third green auxiliary display element DEag3, and the third blue auxiliary display element DEab3 are arranged in a PENTILE® matrix structure. However, in an embodiment, the third red auxiliary display element DEar3, the third green auxiliary display element DEag3, and the third blue auxiliary display element DEab3 may be arranged in various shapes such as a stripe structure, a mosaic arrangement structure, and a delta arrangement structure.

In an embodiment, the resolution of the main area MA may be higher than the resolution of the first auxiliary area AA1a and the resolution of the first intermediate area TRA1. For example, the number of red main display elements DEmr per unit area may be greater than the number of first red auxiliary display elements DEar1 per unit area and the number of third red auxiliary display elements DEar3 per unit area. Although descriptions above are of the red main display element DEmr, the first red auxiliary display element DEar1, and the third red auxiliary display element DEar3, the descriptions may also apply to the green main display element DEmg, the first green auxiliary display element DEag1, and the third green auxiliary display element DEag3 and to the blue main display element DEmb, the first blue auxiliary display element DEab1, and the third blue auxiliary display element DEab3.

In an embodiment, an emission area of the red main display element DEmr may be smaller than an emission area of the first red auxiliary display element DEar1 and an emission area of the third red auxiliary display element DEar3. An emission area of the green main display element DEmg may be smaller than an emission area of the first green auxiliary display element DEag1 and an emission area of the third green auxiliary display element DEag3. An emission area of the blue main display element DEmb may be smaller than an emission area of the first blue auxiliary display element DEab1 and an emission area of the third blue auxiliary display element DEab3.

In an embodiment, the resolution of the first auxiliary area AA1a may be substantially the same as the resolution of the first intermediate area TRA1. For example, the number of first red auxiliary display elements DEar1 per unit area may be substantially equal to the number of third red auxiliary display elements DEar3 per unit area. Although descriptions above are of the first red auxiliary display element DEar1 and the third red auxiliary display element DEar3, the descriptions may also apply to the first green auxiliary display element DEag1 and the third green auxiliary display element DEag3 and to the first blue auxiliary display element DEab1 and the third blue auxiliary display element DEab3.

In an embodiment, an emission area of the first red auxiliary display element DEar1 may be substantially the same as an emission area of the third red auxiliary display element DEar3. An emission area of the first green auxiliary display element DEag1 may be substantially the same as an emission area of the third green auxiliary display element DEag3. An emission area of the first blue auxiliary display element DEab1 may be substantially the same as an emission area of the third blue auxiliary display element DEab3.

Figure 18:
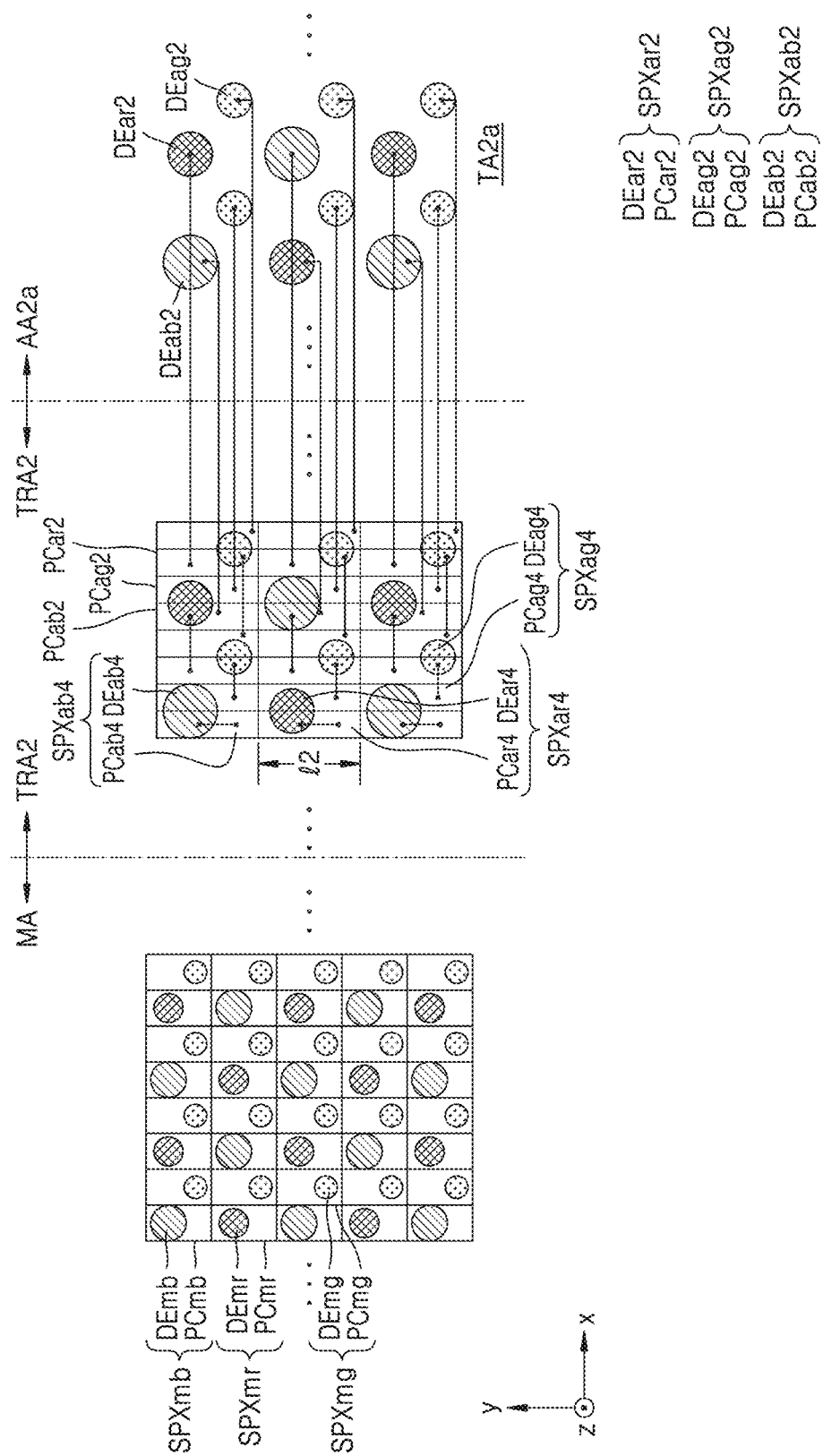
FIG. 18 is an enlarged schematic plan view illustrating a portion of FIG. 16.

FIG. 18 is an enlarged schematic plan view illustrating a portion of FIG. 16.

Referring to FIG. 18, the second red auxiliary sub-pixel SPXar2 may include a second red auxiliary display element DEar2 arranged in the second auxiliary area AA2a and a (2-1)$^{th}$ auxiliary pixel circuit PCar2 arranged in the second intermediate area TRA2. The second green auxiliary sub-pixel SPXag2 may include a second green auxiliary display element DEag2 arranged in the second auxiliary area AA2a and a (2-2)$^{th}$ auxiliary pixel circuit PCag2 arranged in the second intermediate area TRA2. The second blue auxiliary sub-pixel SPXab2 may include a second blue auxiliary display element DEab2 arranged in the second auxiliary area AA2a and a (2-3)$^{th}$ auxiliary pixel circuit PCab2 arranged in the second intermediate area TRA2. In a plan view, the second red auxiliary display element DEar2 and the (2-1)$^{th}$ auxiliary pixel circuit PCar2 may be apart from each other, the second green auxiliary display element DEag2 and the (2-2)$^{th}$ auxiliary pixel circuit PCag2 may be apart from each other, and the second blue auxiliary display element DEab2 and the (2-3)$^{th}$ auxiliary pixel circuit PCab2 may be apart from each other. The second red auxiliary display element DEar2 and THE (2-1)$^{th}$ auxiliary pixel circuit PCar2 may be electrically connected to each other through a connection line TWL, the second green auxiliary display element DEag2 and the (2-2)$^{th}$ auxiliary pixel circuit PCag2 may be electrically connected to each other through a connection line TWL, and the second blue auxiliary display element DEab2 and the (2-3)$^{th}$ auxiliary pixel circuit PCab2 may be electrically connected to each other through a connection line TWL.

FIG. 18 illustrates an example in which the second red auxiliary display element DEar2, the second green auxiliary display element DEag2, and the second blue auxiliary display element DEab2 are arranged in a PENTILE® matrix structure. However, in an embodiment, the second red auxiliary display element DEar2, the second green auxiliary display element DEag2, and the second blue auxiliary display element DEab2 may be arranged in various shapes, such as a stripe structure, a mosaic arrangement structure, and a delta arrangement structure.

The fourth red auxiliary sub-pixel SPXar4 may include a fourth red auxiliary display element DEar4 and a (4-1)$^{th}$ auxiliary pixel circuit PCar4, arranged in the second intermediate area TRA2. The fourth green auxiliary sub-pixel SPXag4 may include a fourth green auxiliary display element DEag4 and a $(4\text{-}2)^{th}$ auxiliary pixel circuit PCag4, arranged in the second intermediate area TRA2. The fourth blue auxiliary sub-pixel SPXab4 may include a fourth blue auxiliary display element DEab4 and a $(4\text{-}3)^{th}$ auxiliary pixel circuit PCab4, arranged in the second intermediate area TRA2.

FIG. 18 illustrates an example in which the fourth red auxiliary display element DEar4, the fourth green auxiliary display element DEag4, and the fourth blue auxiliary display element DEab4 are arranged in a PENTILE® matrix structure. However, in an embodiment, the fourth red auxiliary display element DEar4, the fourth green auxiliary display element DEag4, and the fourth blue auxiliary display element DEab4 may be arranged in various shapes, such as a stripe structure, a mosaic arrangement structure, and a delta arrangement structure.

In an embodiment, the resolution of the main area MA may be higher than the resolution of the second auxiliary area AA2a and the resolution of the second intermediate area TRA2. For example, the number of red main display elements DEmr per unit area may be greater than the number of second red auxiliary display elements DEar2 per unit area and the number of fourth red auxiliary display elements DEar4 per unit area. Although descriptions above are of the red main display element DEmr, the second red auxiliary display element DEar2, and the fourth red auxiliary display element DEar4, the descriptions may also apply to the green main display element DEmg, the second green auxiliary display element DEag2, and the fourth green auxiliary display element DEag4 and to the blue main display element DEmb, the second blue auxiliary display element DEab2, and the fourth blue auxiliary display element DEab4.

In an embodiment, an emission area of the red main display element DEmr may be smaller than an emission area of the second red auxiliary display element DEar2 and an emission area of the fourth red auxiliary display element DEar4. An emission area of the green main display element DEmg may be smaller than an emission area of the second green auxiliary display element DEag2 and an emission area of the fourth green auxiliary display element DEag4. An emission area of the blue main display element DEmb may be smaller than an emission area of the second blue auxiliary display element DEab2 and an emission area of the fourth blue auxiliary display element DEab4.

In an embodiment, the resolution of the second auxiliary area AA2a may be substantially the same as the resolution of the second intermediate area TRA2. For example, the number of second red auxiliary display elements DEar2 per unit area may be substantially equal to the number of fourth red auxiliary display elements DEar4 per unit area. Although descriptions above are of the second red auxiliary display element DEar2 and the fourth red auxiliary display element DEar4, the descriptions may also apply to the second green auxiliary display element DEag2 and the fourth green auxiliary display element DEag4 and to the second blue auxiliary display element DEab2 and the fourth blue auxiliary display element DEab4.

In an embodiment, an emission area of the second red auxiliary display element DEar2 may be substantially the same as an emission area of the fourth red auxiliary display element DEar4. An emission area of the second green auxiliary display element DEag2 may be substantially the same as an emission area of the fourth green auxiliary display element DEag4. An emission area of the second blue auxiliary display element DEab2 may be substantially the same as an emission area of the fourth blue auxiliary display element DEab4.

Comparing FIG. 17 and FIG. 18 to each other, the resolution of the first auxiliary area AA1a may be different from the resolution of the second auxiliary area AA2a. For example, the resolution of the first auxiliary area AA1a may be lower than the resolution of the second auxiliary area AA2a.

In an embodiment, the number of first red auxiliary display elements DEar1 per unit area may be different from the number of second red auxiliary display elements DEar2 per unit area. For example, the number of first red auxiliary display elements DEar1 per unit area may be less than the number of second red auxiliary display elements DEar2 per unit area. Although descriptions above are of the first red auxiliary display element DEar1 and the second red auxiliary display element DEar2, the descriptions may also apply to the first green auxiliary display element DEag1 and the second green auxiliary display element DEag2 and to the first blue auxiliary display element DEab1 and the second blue auxiliary display element DEab2.

As such, the structures of the first conductive patterns 130a (refer to FIG. 3) and the first transmission areas TA1a, arranged in the first auxiliary area AA1a may be different from the structures of the second conductive patterns 130b (refer to FIG. 4) and the second transmission areas TA2a, arranged in the second auxiliary area AA2a.

In an embodiment, a first length l1 of the $(1\text{-}1)^{th}$ auxiliary pixel circuit PCar1 in one direction or a direction (for example, the y direction) may be greater than a second length l2 of the $(2\text{-}1)^{th}$ auxiliary pixel circuit PCar2 in the one direction or in the direction. Although descriptions above are of the $(1\text{-}1)^{th}$ auxiliary pixel circuit PCar1 and the $(2\text{-}1)^{th}$ auxiliary pixel circuit PCar2, the descriptions may also apply to the $(1\text{-}2)^{th}$ auxiliary pixel circuit PCag1 and the $(2\text{-}2)^{th}$ auxiliary pixel circuit PCag2 and to the $(1\text{-}3)^{th}$ auxiliary pixel circuit PCab1 and the $(2\text{-}3)^{th}$ auxiliary pixel circuit PCab2.

Figure 19:
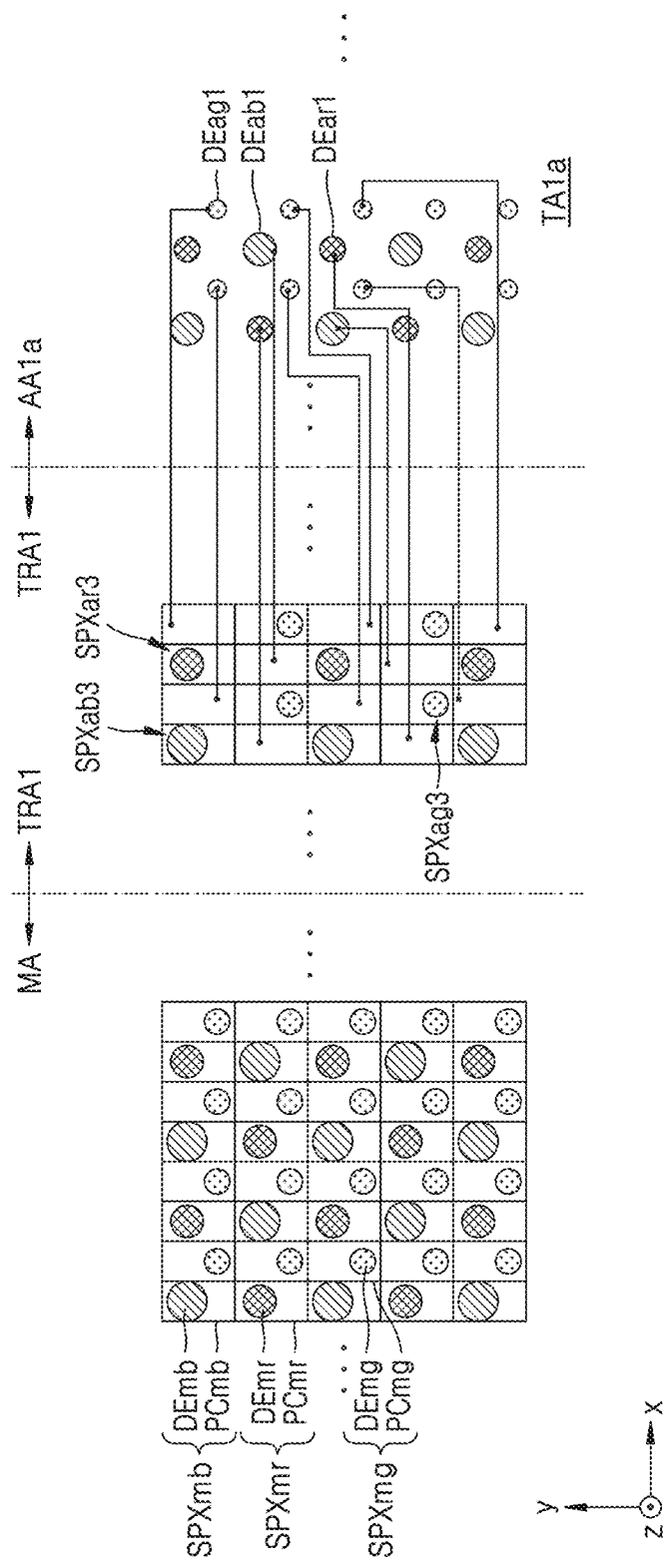
FIG. 19 is an enlarged schematic plan view illustrating a portion of FIG. 16.

FIG. 19 is an enlarged schematic plan view illustrating a portion of FIG. 16. FIG. 19 is a modified embodiment of FIG. 17, and differences therebetween will be described.

Referring to FIG. 19, the resolution of the main area MA may be substantially the same as the resolution of the first auxiliary area AA1a. For example, the number of red main display elements DEmr per unit area may be substantially equal to the number of first red auxiliary display elements DEar1 per unit area. The number of green main display elements DEmg per unit area may be substantially equal to the number of first green auxiliary display elements DEag1 per unit area. The number of blue main display elements DEmb per unit area may be substantially equal to the number of first blue auxiliary display elements DEab1 per unit area.

In an embodiment, an emission area of the red main display element DEmr may be larger than an emission area of the first red auxiliary display element DEar1. An emission area of the green main display element DEmg may be larger than an emission area of the first green auxiliary display element DEag1. An emission area of the blue main display element DEmb may be larger than an emission area of the first blue auxiliary display element DEab1.

Although the resolution of the first auxiliary area AA1a is substantially the same as the resolution of the main area MA, emission areas of auxiliary display elements (e.g., the first red auxiliary display element DEar1, the first green auxiliary display element DEag1, and the first blue auxiliary display element DEab1) of the first auxiliary area AA1a may be reduced, and thus, the area of the first transmission area TA1a may be increased. Accordingly, the light transmittance of the first auxiliary area AA1a may be secured.

Figure 20:
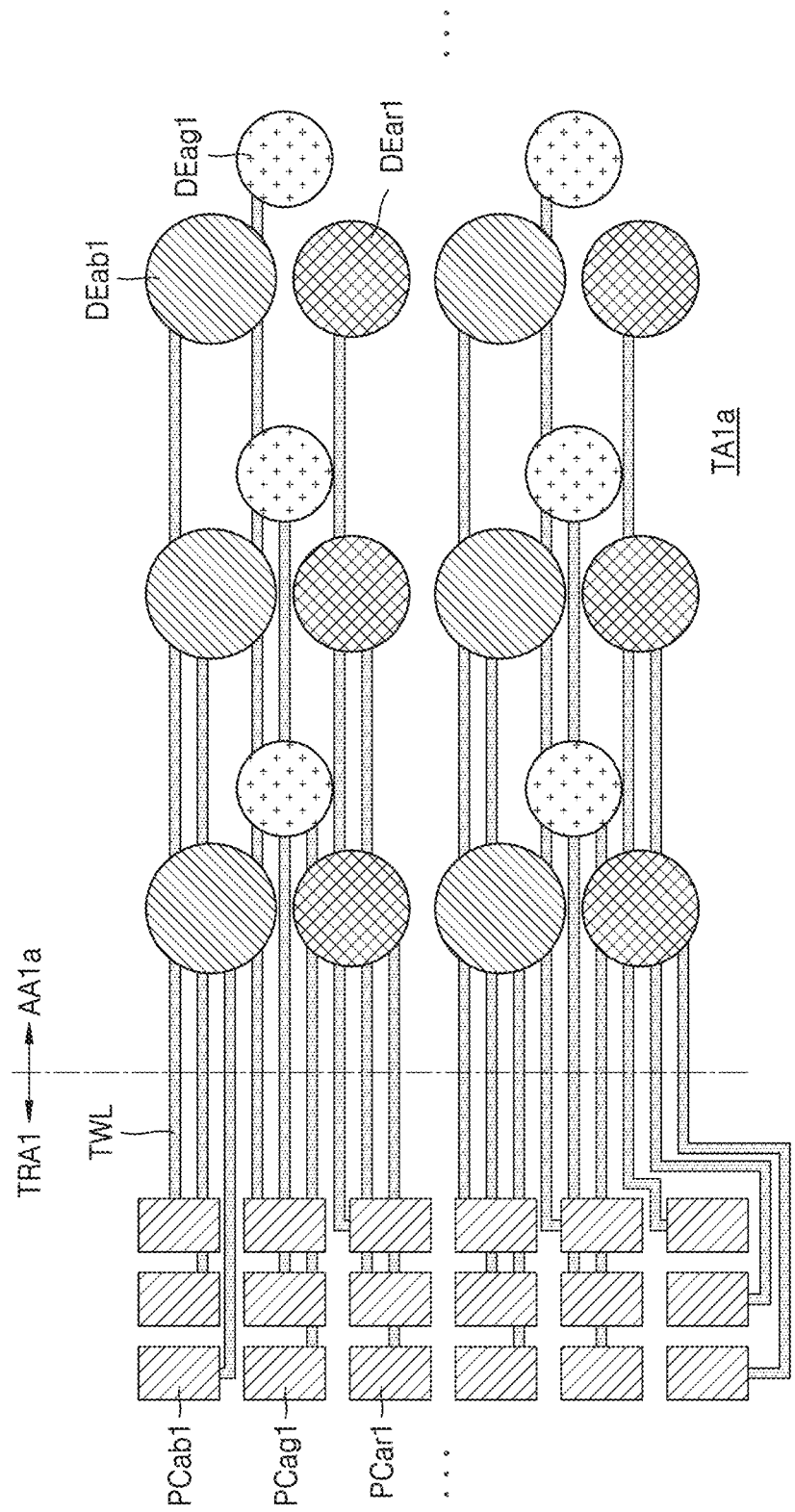
FIG. 20 is an enlarged schematic plan view illustrating a portion of FIG. 16.
Figure 21:
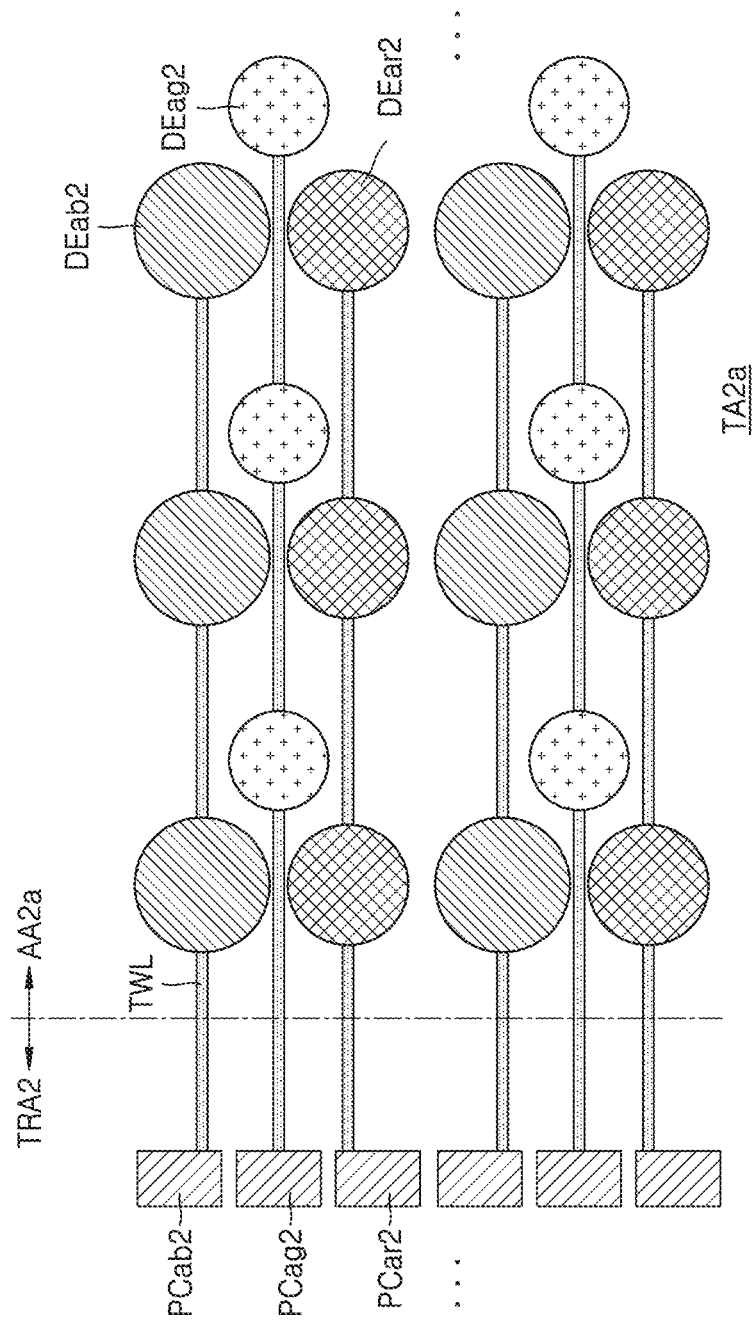
FIG. 21 is an enlarged schematic plan view illustrating a portion of FIG. 16.

FIGS. 20 and 21 are enlarged schematic plan views illustrating a portion of FIG. 16. FIGS. 20 and 21 are modified embodiments of FIGS. 17 and 18, and differences therebetween will be described.

Referring to FIGS. 20 and 21, the first red auxiliary display element DEar1, the first green auxiliary display element DEag1, and the first blue auxiliary display element DEab1, arranged in the first auxiliary area AA1a, may be arranged in a delta arrangement structure. The second red auxiliary display element DEar2, the second green auxiliary display element DEag2, and the second blue auxiliary display element DEab2, arranged in the second auxiliary area AA2a, may be arranged in a delta arrangement structure.

In an embodiment, each of the auxiliary pixel circuits arranged in the first intermediate area TRA1 may be electrically connected, through a connection line TWL, to one auxiliary display element arranged in the first auxiliary area AA1a. For example, as shown in FIG. 20, the $(1-1)^{th}$ auxiliary pixel circuit PCar1 arranged in the first intermediate area TRA1 may be electrically connected, through a connection line TWL, to one first red auxiliary display element DEar1 arranged in the first auxiliary area AA1a. The $(1-2)^{th}$ auxiliary pixel circuit PCag1 arranged in the first intermediate area TRA1 may be connected, through a connection line TWL, to one first green auxiliary display element DEag1 arranged in the first auxiliary area AA1a. The $(1-3)^{th}$ auxiliary pixel circuit PCab1 arranged in the first intermediate area TRA1 may be connected, through a connection line TWL, to one first blue auxiliary display element DEab1 arranged in the first auxiliary area AA1a.

In an embodiment, each of the auxiliary pixel circuits arranged in the second intermediate area TRA2 may be electrically connected, through a connection line TWL, to two or more auxiliary display elements arranged in the second auxiliary area AA2a. For example, as shown in FIG. 21, the $(2-1)^{th}$ auxiliary pixel circuit PCar2 arranged in the second intermediate area TRA2 may be electrically connected, through a connection line TWL, to three second red auxiliary display elements DEar2 arranged in the second auxiliary area AA2a. The $(2-2)^{th}$ auxiliary pixel circuit PCag2 arranged in the second intermediate area TRA2 may be electrically connected, through a connection line TWL, to three second green auxiliary display elements DEag2 arranged in the second auxiliary area AA2a. The $(2-3)^{th}$ auxiliary pixel circuit PCab2 arranged in the second intermediate area TRA2 may be electrically connected, through a connection line TWL, to three second blue auxiliary display elements DEab2 arranged in the second auxiliary area AA2a.

As such, the number of connection lines TWL overlapping the first auxiliary area AA1a may be greater than the number of connection lines TWL overlapping the second auxiliary area AA2a. The light transmittance of the second auxiliary area AA2a may be secured as auxiliary display elements (e.g., the second red auxiliary display elements DEar2, the second green auxiliary display elements DEag2, and the second blue auxiliary display elements DEab2) share one auxiliary pixel circuit (e.g., the $(2-1)^{th}$ auxiliary pixel circuit PCar2, the $(2-2)^{th}$ auxiliary pixel circuit PCag2, and the $(2-3)^{th}$ auxiliary pixel circuit PCab2).

Figure 22:
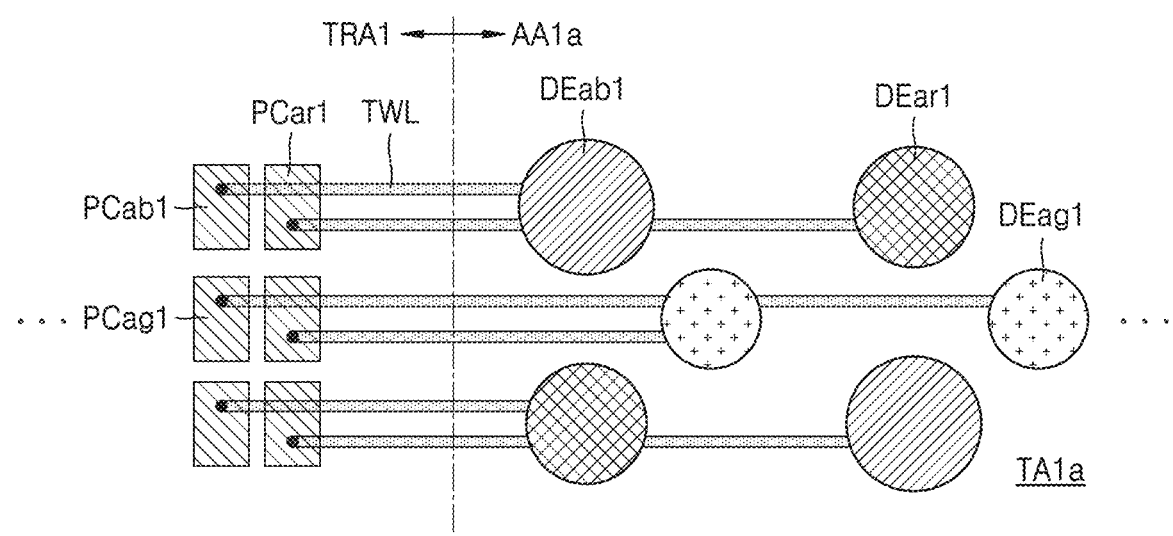
FIG. 22 is an enlarged schematic plan view illustrating a portion of FIG. 16.
Figure 23:
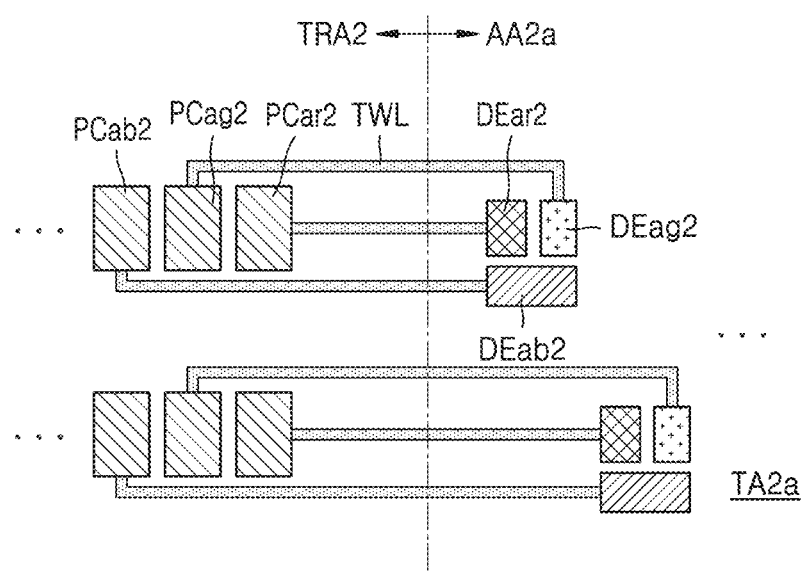
FIG. 23 is an enlarged schematic plan view illustrating a portion of FIG. 16.

FIGS. 22 and 23 are enlarged schematic plan views illustrating a portion of FIG. 16. FIGS. 22 and 23 are modified embodiments of FIGS. 17 and 18, and differences therebetween will be described.

Referring to FIGS. 22 and 23, the first red auxiliary display element DEar1, the first green auxiliary display element DEag1, and the first blue auxiliary display element DEab1, arranged in the first auxiliary area AA1a, may be arranged in a PENTILE® matrix structure. The second red auxiliary display element DEar2, the second green auxiliary display element DEag2, and the second blue auxiliary display element DEab2, arranged in the second auxiliary area AA2a, may be arranged in a stripe structure.

As such, the arrangement structure of auxiliary display elements arranged in the first auxiliary area AA1a may be different from the arrangement structure of auxiliary display elements arranged in the second auxiliary area AA2a. The resolution of the first auxiliary area AA1a may be different from the resolution of the second auxiliary area AA2a. As another example, the area of the first transmission area TA1a of the first auxiliary area AA1a may be different from the area of the second transmission area TA2a of the second auxiliary area AA2a. As another example, the light transmittance of the first auxiliary area AA1a may be different from the light transmittance of the second auxiliary area AA2a.

Figure 24:
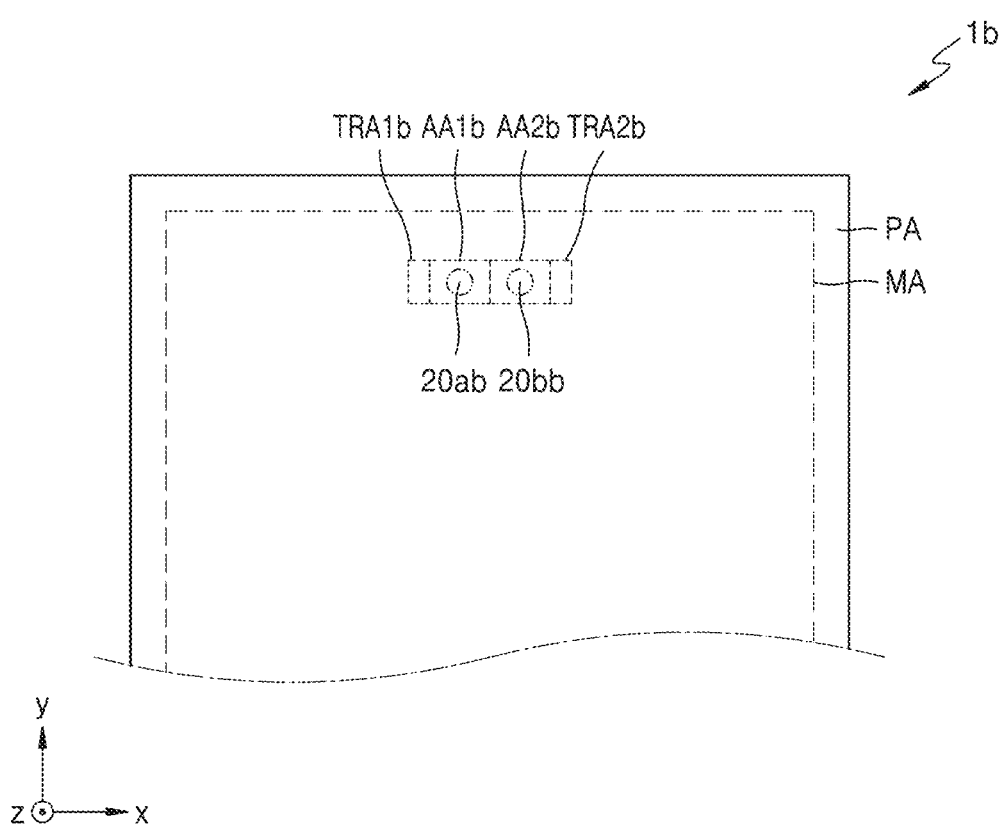
FIG. 24 is a schematic plan view illustrating a portion of a display device according to an embodiment.

FIG. 24 is a schematic plan view illustrating a portion of a display device 1b according to an embodiment. FIG. 24 is a modified embodiment of FIG. 16, and differences therebetween will be described.

Referring to FIG. 24, the display device 1b may include a first auxiliary area AA1b, a first intermediate area TRA1b, a second auxiliary area AA2b, and a second intermediate area TRA2b. The first auxiliary area AA1b and the second auxiliary area AA2b may not be apart from each other. The first intermediate area TRA1b may be arranged on the left side of the first auxiliary area AA1b, and the second intermediate area TRA2b may be arranged on the right side of the second auxiliary area AA2b. The first auxiliary area AA1b may correspond to the first auxiliary area AA1a of FIG. 16, the first intermediate area TRA1b may correspond to the first intermediate area TRA1 of FIG. 16, the second auxiliary area AA2b may correspond to the second auxiliary area AA2a of FIG. 16, and the second intermediate area TRA2b may correspond to the second intermediate area TRA2 of FIG. 16.

In an embodiment, the resolution of the first auxiliary area AA1b may be different from the resolution of the second auxiliary area AA2b. For example, the resolution of the first auxiliary area AA1b may be lower than that of the second auxiliary area AA2b. In order to remove a diffraction difference according to the length of a wavelength as described with reference to FIGS. 8 and 9 above, a first component 20ab and a second component 20bb arranged to respectively correspond to the first auxiliary area AA1b and the second auxiliary area AA2b may be adjusted. For example, the first component 20ab that receives light in an infrared wavelength band in which relatively large diffraction occurs may be arranged to correspond to the first auxiliary area AA1b. The second component 20bb that receives light in a visible ray wavelength band in which relatively small diffraction occurs may be arranged to correspond to the second auxiliary area AA2b.

In an embodiment, the light transmittance of the first auxiliary area AA1b may be different from the light transmittance of the second auxiliary area AA2b. For example, the light transmittance of the first auxiliary area AA1b may be higher than that of the second auxiliary area AA2b. The first component 20ab and the second component 20bb arranged to respectively correspond to the first auxiliary area AA1*b* and the second auxiliary area AA2*b* may be adjusted. For example, because the first auxiliary area AA1*b* has a relatively high light transmittance, the first component 20*ab* that receives light in a visible ray wavelength band having a relatively low transmittance may be arranged to correspond to the first auxiliary area AA1*b*. Because the second auxiliary area AA2*b* has a relatively low light transmittance, the second component 20*bb* that receives light in an infrared wavelength band having a relatively high transmittance may be arranged to correspond to the second auxiliary area AA2*b*.

Figure 25:
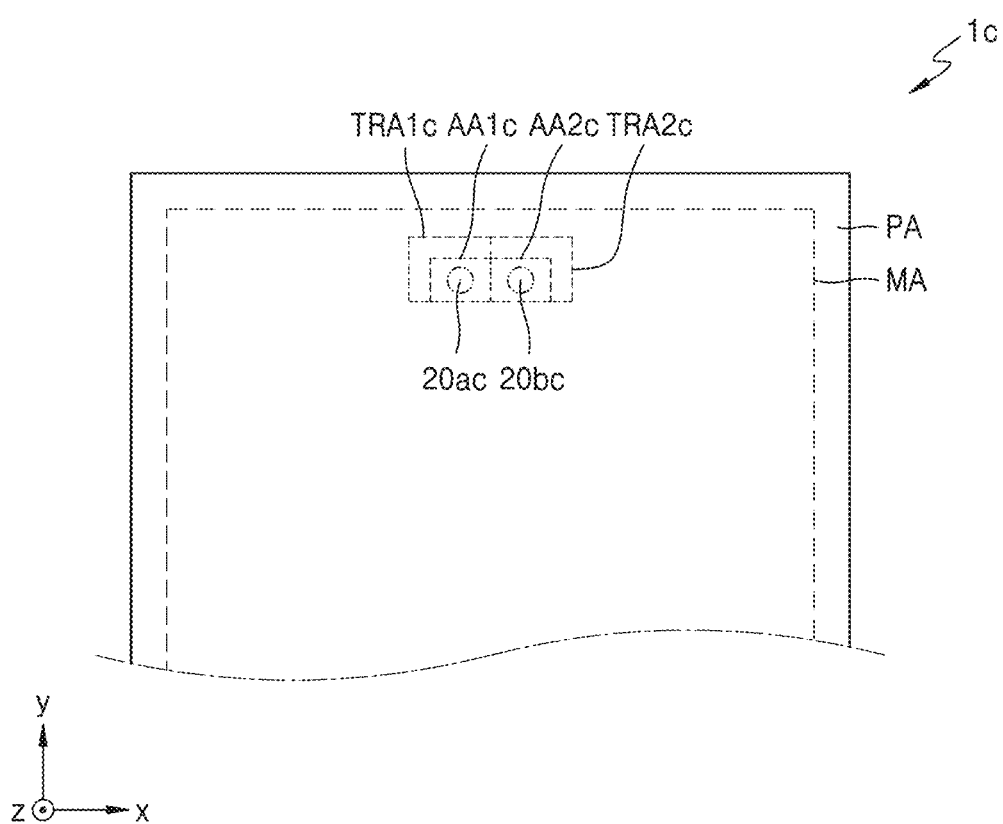
FIG. 25 is a schematic plan view illustrating a portion of a display device according to an embodiment.

FIG. 25 is a schematic plan view illustrating a portion of a display device 1*c* according to an embodiment. FIG. 25 is a modified embodiment of FIG. 16, and differences therebetween will be described.

Referring to FIG. 25, the display device 1*c* may include a first auxiliary area AA1*c*, a first intermediate area TRA1*c*, a second auxiliary area AA2*c*, and a second intermediate area TRA2*c*. The first auxiliary area AA1*c* and the second auxiliary area AA2*c* may not be apart from each other. The first intermediate area TRA1*c* may surround a portion of the first auxiliary area AA1*c*, and the second intermediate area TRA2*c* may surround a portion of the second auxiliary area AA2*b*. Auxiliary areas may be partially surrounded by intermediate areas. The first auxiliary area AA1*c* may correspond to the first auxiliary area AA1*a* of FIG. 16, the first intermediate area TRA1*c* may correspond to the first intermediate area TRA1 of FIG. 16, the second auxiliary area AA2*c* may correspond to the second auxiliary area AA2*a* of FIG. 16, and the second intermediate area TRA2*c* may correspond to the second intermediate area TRA2 of FIG. 16.

The display device 1*c* may include a first component 20*ac* arranged to correspond to the first auxiliary area AA1*c* and a second component 20*bc* arranged to correspond to the second auxiliary area AA2*c*. As described above with reference to FIG. 24, types (or functions) of the first component 20*ac* and the second component 20*bc* may be selected by considering improvement in diffraction difference or improvement in transmittance.

Figure 26:
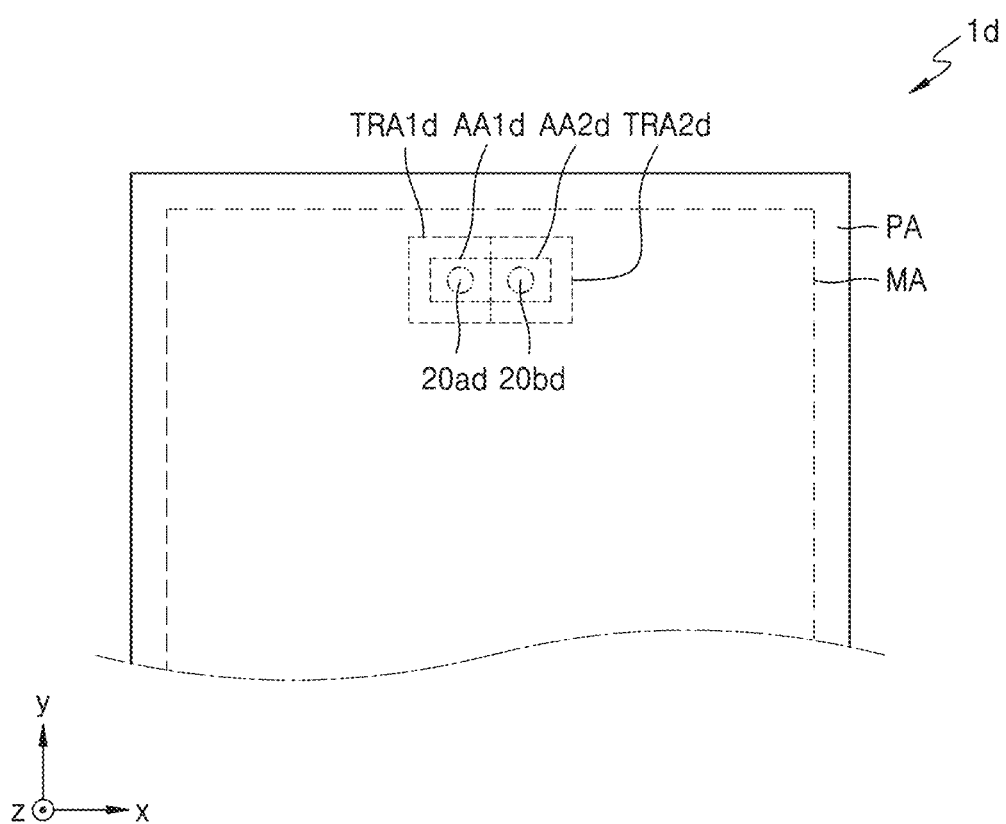
FIG. 26 is a schematic plan view illustrating a portion of a display device according to an embodiment.

FIG. 26 is a schematic plan view illustrating a portion of a display device 1*d* according to an embodiment. FIG. 26 is a modified embodiment of FIG. 16, and differences therebetween will be described.

Referring to FIG. 26, the display device 1*d* may include a first auxiliary area AA1*d*, a first intermediate area TRA1*d*, a second auxiliary area AA2*d*, and a second intermediate area TRA2*d*. The first auxiliary area AA1*d* and the second auxiliary area AA2*d* may not be apart from each other. The first intermediate area TRA1*d* may surround the first auxiliary area AA1*d*, and the second intermediate area TRA2*d* may surround the second auxiliary area AA2*d*. Auxiliary areas may be surrounded by intermediate areas. The first auxiliary area AA1*d* may correspond to the first auxiliary area AA1*a* of FIG. 16, the first intermediate area TRA1*d* may correspond to the first intermediate area TRA1 of FIG. 16, the second auxiliary area AA2*d* may correspond to the second auxiliary area AA2*a* of FIG. 16, and the second intermediate area TRA2*d* may correspond to the second intermediate area TRA2 of FIG. 16.

The display device 1*d* may include a first component 20*ad* arranged to correspond to the first auxiliary area AA1*d* and a second component 20*bd* arranged to correspond to the second auxiliary area AA2*d*. As described above with reference to FIG. 24, types (or functions) of the first component 20*ad* and the second component 20*bd* may be selected by considering improvement in diffraction difference or improvement in transmittance.

Figure 27:
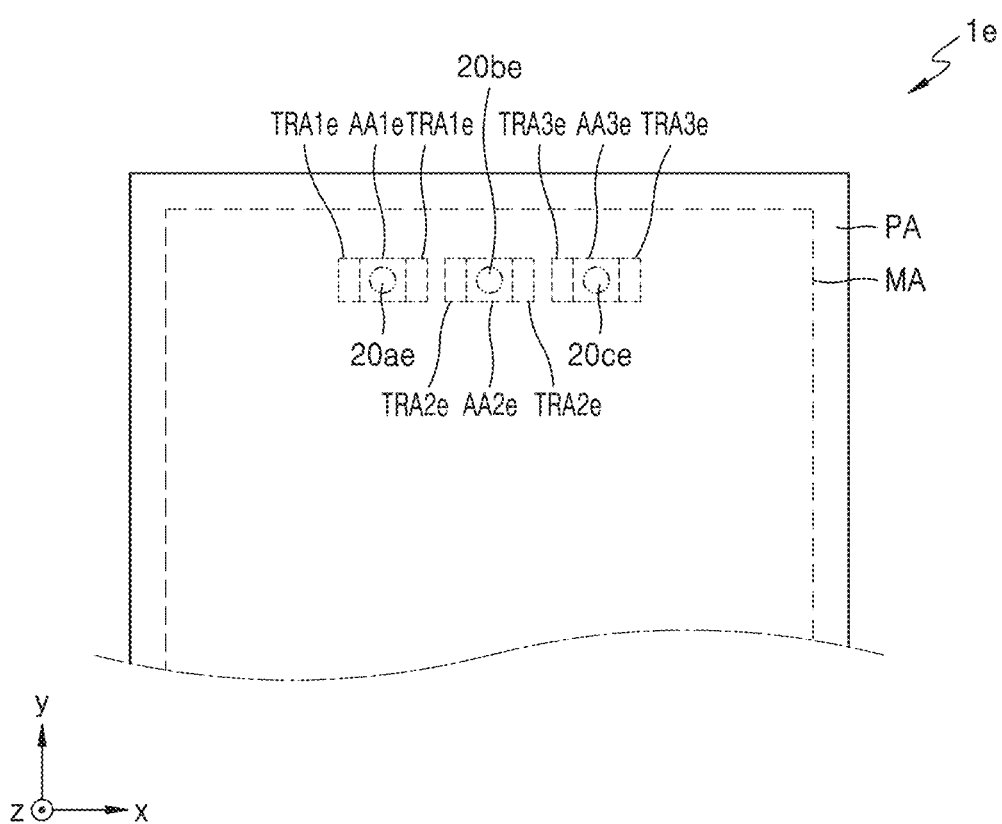
FIG. 27 is a schematic plan view illustrating a portion of a display device according to an embodiment.

FIG. 27 is a schematic plan view illustrating a portion of a display device 1*e* according to an embodiment. FIG. 27 is a modified embodiment of FIG. 16, and differences therebetween will be described.

Referring to FIG. 27, the display device 1*e* may include a first auxiliary area AA1*e*, a first intermediate area TRA1*e*, a second auxiliary area AA2*e*, a second intermediate area TRA2*e*, a third auxiliary area AA3*e*, and a third intermediate area TRA3*e*. First intermediate areas TRA1*e* may be respectively arranged on the left and right sides of the first auxiliary area AA1*e*, second intermediate areas TRA2*e* may be respectively arranged on the left and right sides of the second auxiliary area AA2*e*, and third intermediate areas TRA3*e* may be respectively arranged on the left and right sides of the third auxiliary area AA3*e*. This is only an example, and the arrangement of the intermediate areas may be variously changed.

The display device 1*e* may include a first component 20*ae* arranged to correspond to the first auxiliary area AA1*e*, a second component 20*be* arranged to correspond to the second auxiliary area AA2*e*, and a third component 20*ce* arranged to correspond to the third auxiliary area AA3*e*. As described above with reference to FIG. 24, types (or functions) of the first component 20*ae*, the second component 20*be*, and the third component 20*ce* may be selected by considering improvement in diffraction difference or improvement in transmittance.

Figure 28:
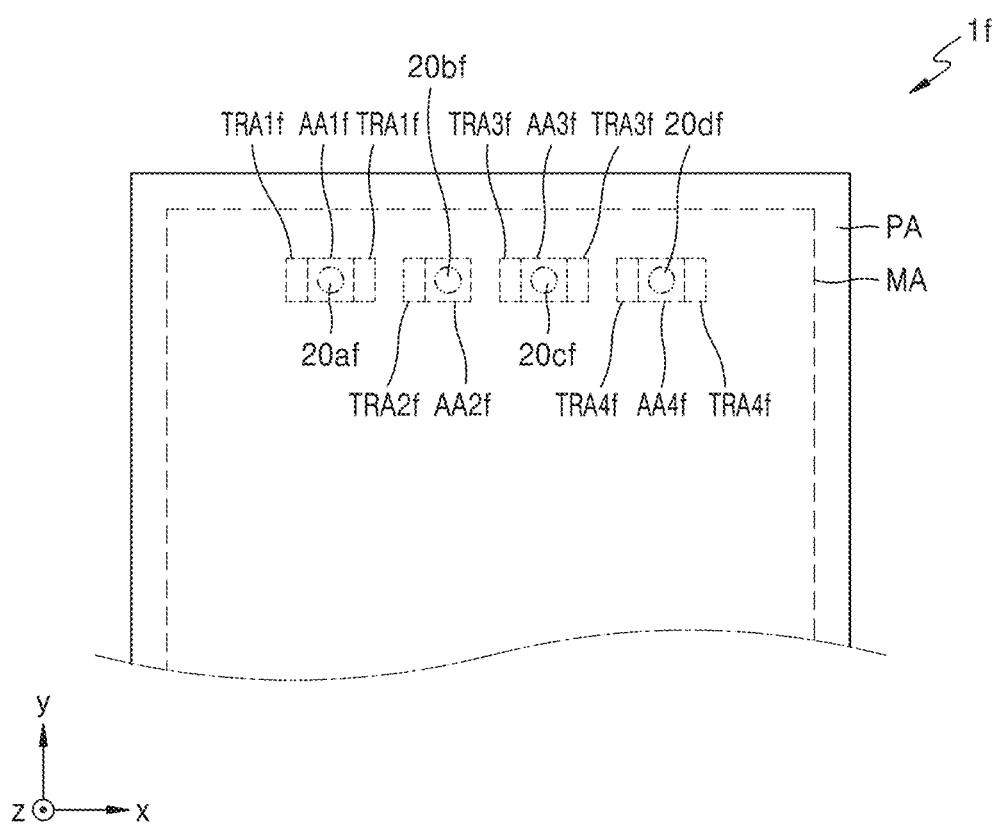
FIG. 28 is a schematic plan view illustrating a portion of a display device according to an embodiment.

FIG. 28 is a schematic plan view illustrating a portion of a display device 1*f* according to an embodiment. FIG. 28 is a modified embodiment of FIG. 16, and differences therebetween will be described.

Referring to FIG. 28, the display device 1*f* may include a first auxiliary area AA1*f*, a first intermediate area TRA1*f*, a second auxiliary area AA2*f*, a second intermediate area TRA2*f*, a third auxiliary area AA3*f*, a third intermediate area TRA3*f*, a fourth auxiliary area AA4*f*, and a fourth intermediate area TRA4*f*. First intermediate areas TRA1*f* may be respectively arranged on the left and right sides of the first auxiliary area AA1*f*, a second intermediate area TRA2*f* may be arranged on the left side of the second auxiliary area AA2*f*, third intermediate areas TRA3*f* may be respectively arranged on the left and right sides of the third auxiliary area AA3*f*, and fourth intermediate areas TRA4*f* may be respectively arranged on the left and right sides of the fourth auxiliary area AA4*f*. This is only an example, and the arrangement of the intermediate areas may be variously changed.

The display device 1*f* may include a first component 20*af* arranged to correspond to the first auxiliary area AA1*f*, a second component 20*bf* arranged to correspond to the second auxiliary area AA2*f*, a third component 20*cf* arranged to correspond to the third auxiliary area AA3*f*, and a fourth component 20*df* arranged to correspond to the fourth auxiliary area AA4*f*. As described above with reference to FIG. 24, types (or functions) of the first component 20*af*, the second component 20*bf*, the third component 20*cf*, and the fourth component 20*df* may be selected by considering improvement in diffraction difference or improvement in transmittance. For example, the first component 20*af* may be an infrared camera, the second component 20*bf* may be a flood illuminator, the third component 20*cf* may be a front camera, and the fourth component 20*df* may be a dot projector. The resolutions and/or light transmittances of the first auxiliary area AA1*f*, the second auxiliary area AA2*f*, the third auxiliary area AA3f, and the fourth auxiliary area AA4f may be different from one another.

Figure 29:
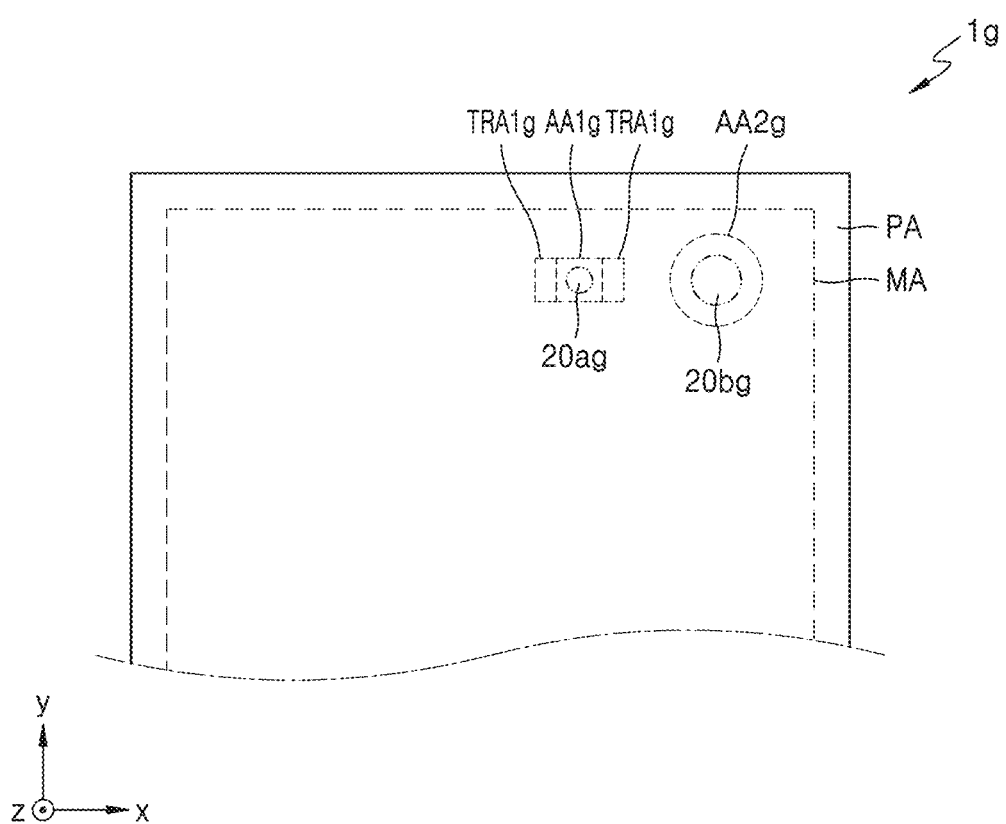
FIG. 29 is a schematic plan view illustrating a portion of a display device according to an embodiment.

FIG. 29 is a schematic plan view illustrating a portion of a display device 1g according to an embodiment.

Referring to FIG. 29, the display device 1g may include a first auxiliary area AA1g, a first intermediate area TRA1g, and a second auxiliary area AA2g. The first auxiliary area AA1g may correspond to the first auxiliary area AA1a of FIG. 16, the first intermediate area TRA1g may correspond to the first intermediate area TRA1 of FIG. 16, and the second auxiliary area AA2g may correspond to the second auxiliary area AA2 of FIG. 1.

The display device 1g may include a first component 20ag arranged to correspond to the first auxiliary area AA1g and a second component 20bg arranged to correspond to the second auxiliary area AA2g. As described above with reference to FIG. 24, types (or functions) of the first component 20ag and the second component 20bg may be selected by considering improvement in diffraction difference or improvement in transmittance.

Figure 30:
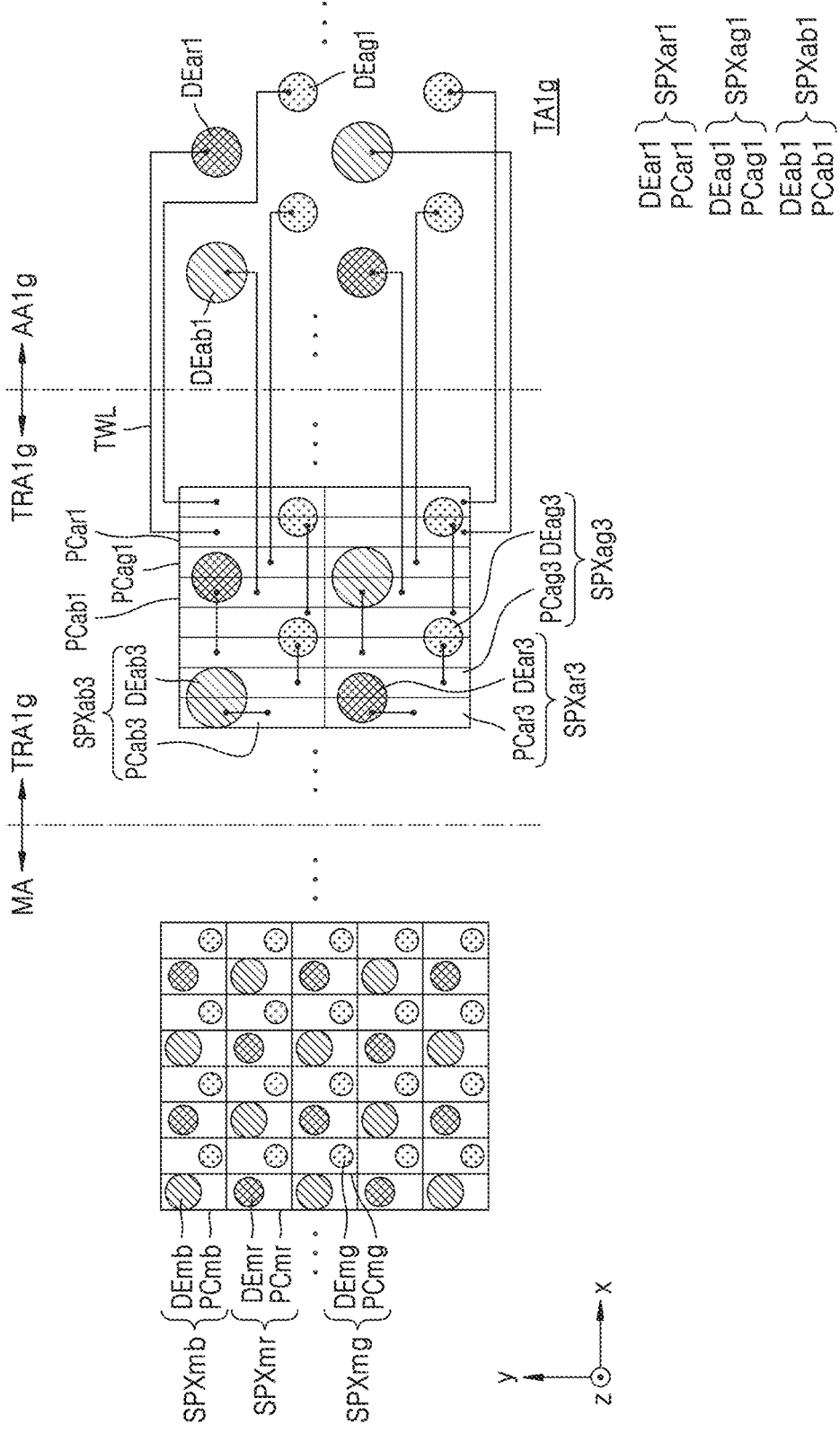
FIG. 30 is an enlarged schematic plan view illustrating a portion of FIG. 29.
Figure 31:
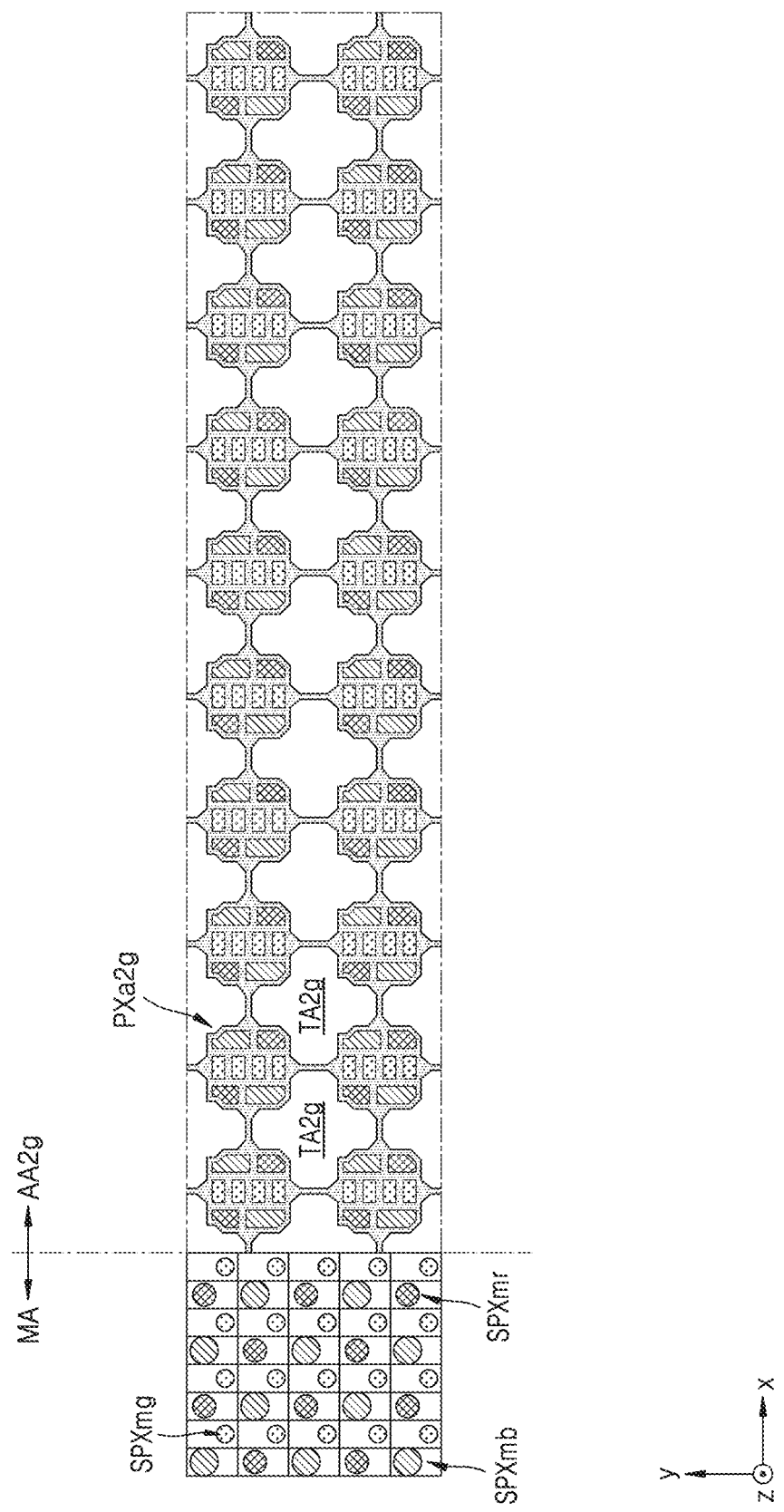
FIG. 31 is an enlarged schematic plan view illustrating a portion of FIG. 29.

FIGS. 30 and 31 are enlarged schematic plan views illustrating a portion of FIG. 29. By way of example, FIG. 30 illustrates portions of the main area MA, the first intermediate area TRA1g, and the first auxiliary area AA1g in FIG. 24, and FIG. 31 illustrates portions of the main area MA and the second auxiliary area AA2g in FIG. 24.

First, referring to FIG. 30, a red main sub-pixel SPXmr, a green main sub-pixel SPXmg, and a blue main sub-pixel SPXmb may be arranged in the main area MA. A first red auxiliary display element DEar1, a first green auxiliary display element DEag1, and a first blue auxiliary display element DEab1 may be arranged in the first auxiliary area AA1g. A $(1-1)^{th}$ auxiliary pixel circuit PCar1, a $(1-2)^{th}$ auxiliary pixel circuit PCag1, a $(1-3)^{th}$ auxiliary pixel circuit PCab1, a third red auxiliary sub-pixel SPXar3, a third green auxiliary sub-pixel SPXag3, and a third blue auxiliary sub-pixel SPXab3 may be arranged in the first intermediate area TRA1g. The structures of the sub-pixels shown in FIG. 30 are the same as those shown in FIG. 17, and the description given above may be equally applied thereto.

Referring to FIG. 31, a red main sub-pixel SPXmr, a green main sub-pixel SPXmg, and a blue main sub-pixel SPXmb may be arranged in the main area MA. Second auxiliary pixels PXa2g may be arranged in the second auxiliary area AA2g. The second auxiliary area AA2g may include a second transmission area TA2g. The structure of the second auxiliary area AA2g shown in FIG. 31 is the same as that shown FIG. 12, and the description given above may be equally applied thereto.

Figure 32:
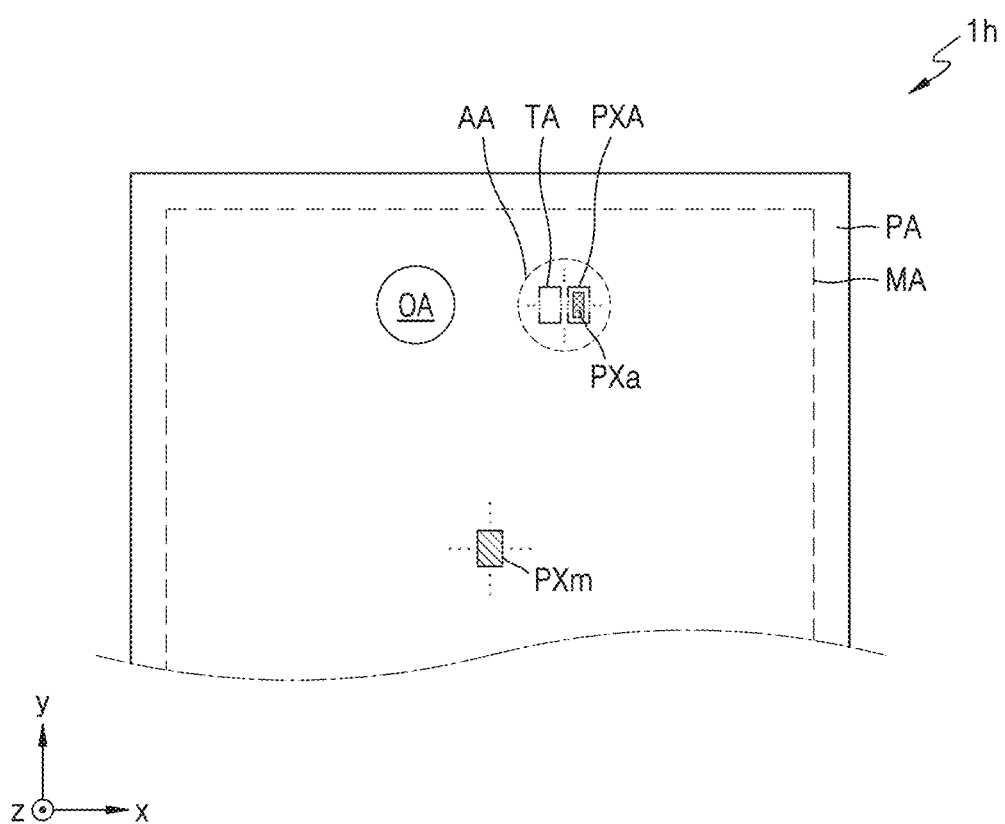
FIG. 32 is a schematic plan view illustrating a portion of a display device according to an embodiment.

FIG. 32 is a schematic plan view illustrating a portion of a display device 1h according to an embodiment.

Referring to FIG. 32, the display device 1h may include a main area MA, an opening area OA, and an auxiliary area AA. The opening area OA and the auxiliary area AA may be at least partially surrounded by the main area MA.

Main pixels PXm may be arranged in the main area MA. The auxiliary area AA may include a transmission area TA and a pixel area PXA, and auxiliary pixels PXa may be arranged in the pixel area PXA. A component may be arranged to correspond to the auxiliary area AA.

The opening area OA may be an area in which pixels are not arranged and may be an area in which a component is arranged in the same manner as in the auxiliary area AA. For example, the opening area OA may be understood as a transmission area through which light and/or sound output from the component to the outside or traveling from the outside toward the component may pass.

Although not shown in FIG. 32, at least one dummy sub-pixel may be disposed between the opening area OA and the auxiliary area AA. The dummy sub-pixel does not actually emit light but may reduce a difference in resistance due to a difference in lengths of wiring lines that transmit electrical signals. The dummy sub-pixel may prevent a signal delay from occurring and thus prevent a luminance difference from occurring between a sub-pixel not arranged in a same row or column as the opening area OA and the auxiliary area AA and a sub-pixel arranged in a same row or column as the opening area OA and the auxiliary area AA.

Figure 33:
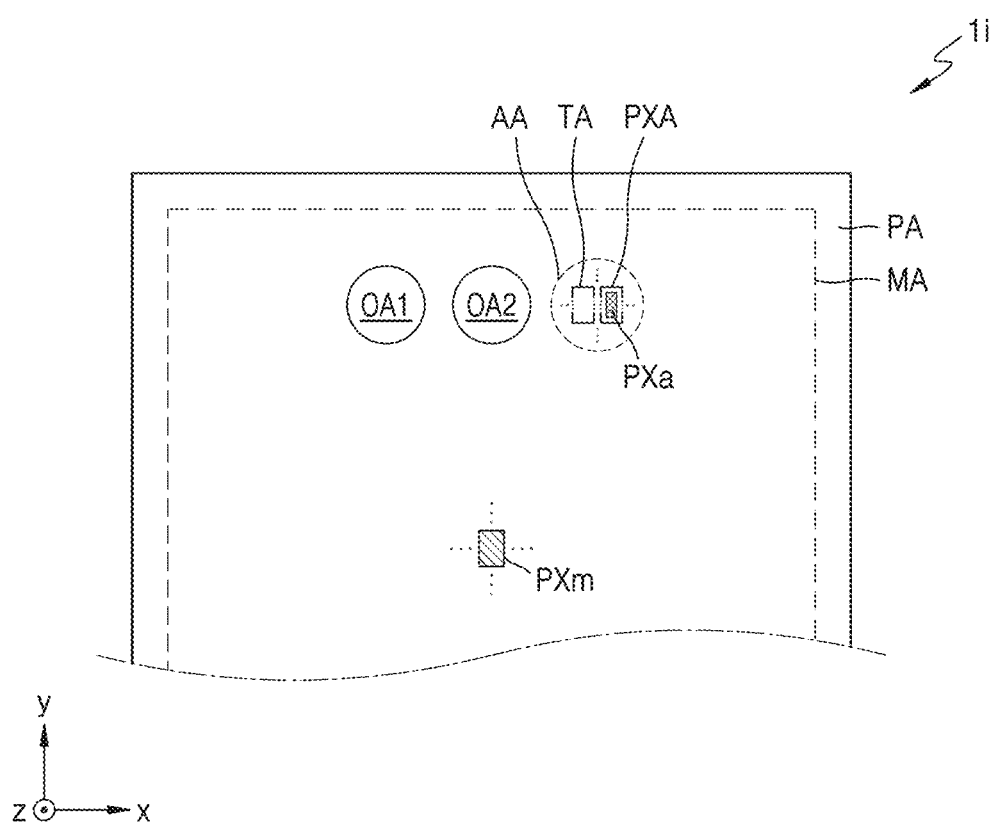
FIG. 33 is a schematic plan view illustrating a portion of a display device according to an embodiment.

FIG. 33 is a schematic plan view illustrating a portion of a display device 1i according to an embodiment. In FIG. 33, the same reference numerals as those of FIG. 32 refer to the same members, and redundant descriptions thereof will be omitted.

Referring to FIG. 33, the display device 1i may include a main area MA, a first opening area OA1, a second opening area OA2, and an auxiliary area AA. Each of the first opening area OA1 and the second opening area OA2 may be an area in which pixels are not arranged and may be an area in which a component is arranged in the same manner as in the auxiliary area AA. For example, the first opening area OA1 and the second opening area OA2 may be understood as transmission areas through which light and/or sound output from a component to the outside or traveling from the outside toward the component may pass.

Figure 34:
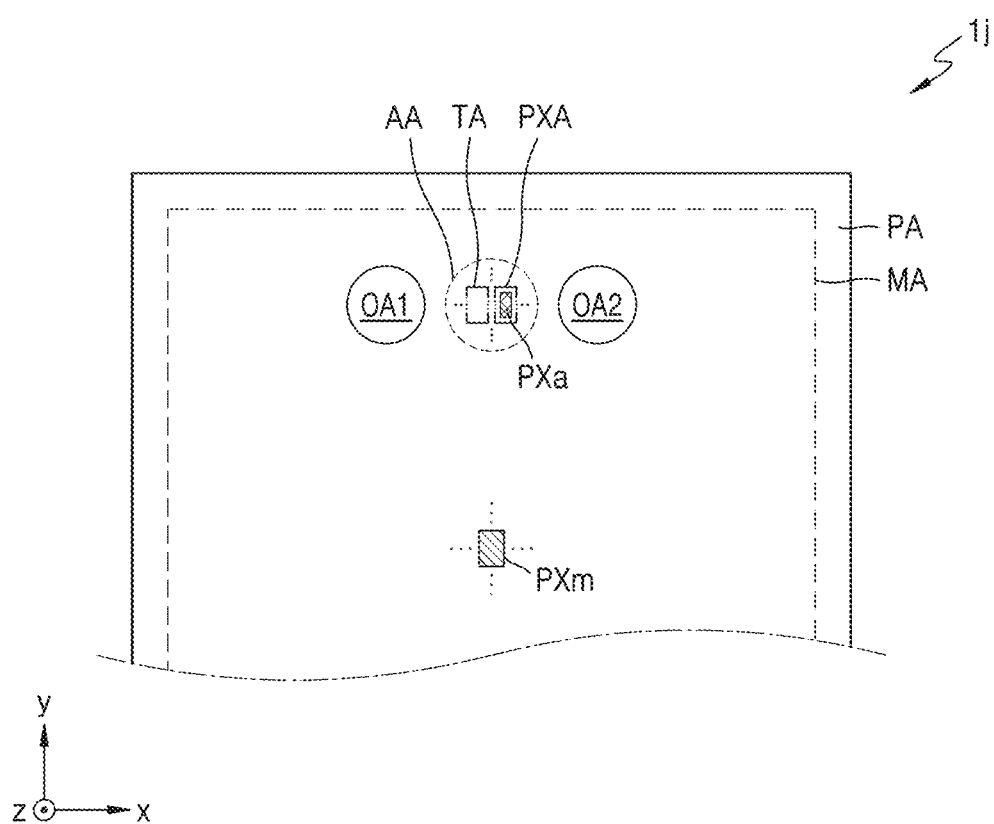
FIG. 34 is a schematic plan view illustrating a portion of a display device according to an embodiment.

FIG. 34 is a schematic plan view illustrating a portion of a display device 1j according to an embodiment. In FIG. 34, the same reference numerals as those of FIG. 33 refer to the same members, and redundant descriptions thereof will be omitted.

Referring to FIG. 34, unlike FIG. 33 described above, the auxiliary area AA may be located between the first opening area OA1 and the second opening area OA2.

Figure 35:
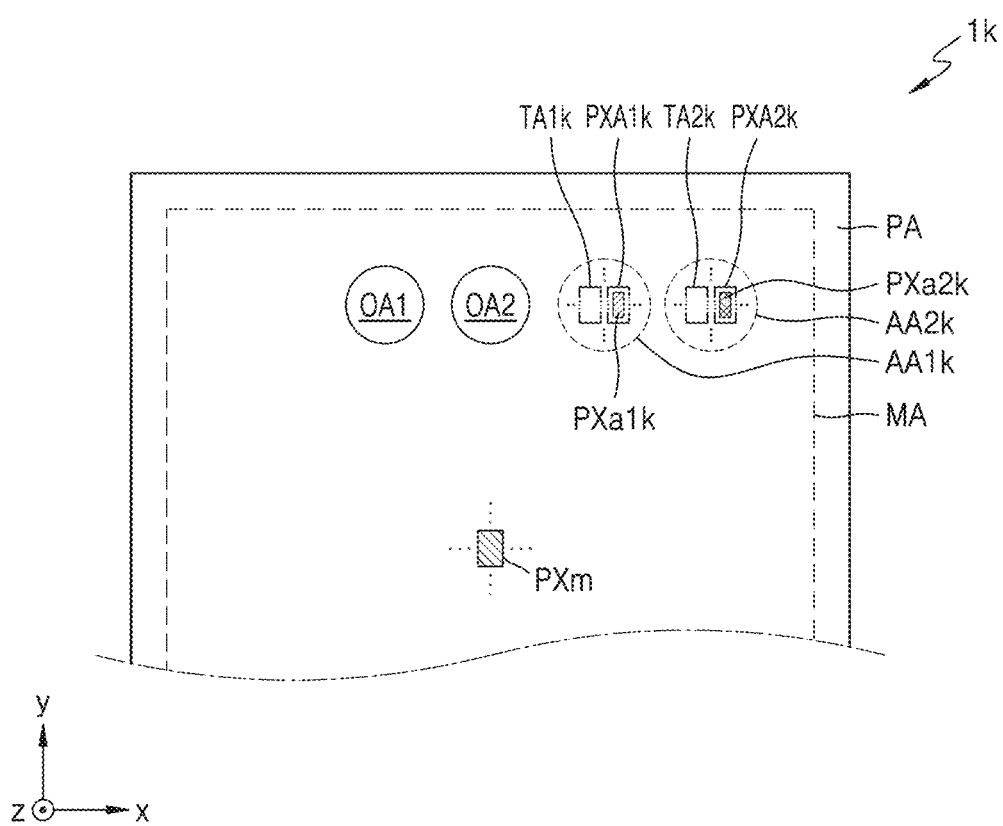
FIG. 35 is a schematic plan view illustrating a portion of a display device according to an embodiment.

FIG. 35 is a schematic plan view illustrating a portion of a display device 1k according to an embodiment. In FIG. 35, the same reference numerals as those of FIG. 33 refer to the same members, and redundant descriptions thereof will be omitted.

Referring to FIG. 35, the display device 1k may include a main area MA, a first opening area OA1, a second opening area OA2, a first auxiliary area AA1k, and a second auxiliary area AA2k. The first opening area OA1, the second opening area OA2, the first auxiliary area AA1k, and the second auxiliary area AA2k may be sequentially positioned in the first direction (for example, the ±x direction).

The first auxiliary area AA1k may include a first transmission area TA1k and a first pixel area PXA1k, and first auxiliary pixels PXa1k may be arranged in the first pixel area PXA1k. The second auxiliary area AA2k may include a second transmission area TA2k and a second pixel area PXA2k, and second auxiliary pixels PXa2k may be arranged in the second pixel area PXA2k. Components may be arranged to correspond to the first auxiliary area AA1k and the second auxiliary area AA2k, respectively.

Figure 36:
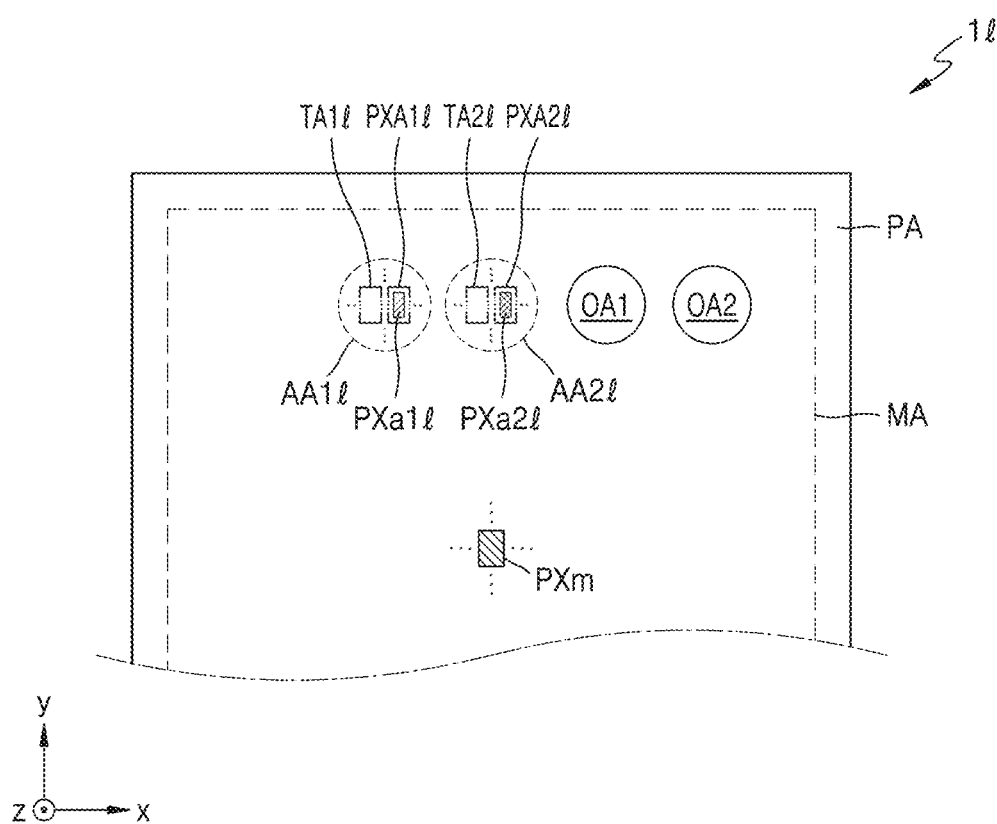
FIG. 36 is a schematic plan view illustrating a portion of a display device according to an embodiment.

FIG. 36 is a schematic plan view illustrating a portion of a display device 1l according to an embodiment. In FIG. 36, the same reference numerals as those of FIG. 33 refer to the same members, and redundant descriptions thereof will be omitted.

Referring to FIG. 36, the display device 1l, may include a main area MA, a first opening area OA1, a second opening area OA2, a first auxiliary area AA1f, and a second auxiliary area AA2l. The first auxiliary area AA1l, the second auxiliary area AA2l, the first opening area OA1, and the second opening area OA2 may be sequentially arranged in the first direction (for example, the ±x direction).

The first auxiliary area AA1*l* may include a first transmission area TA1*l* and a first pixel area PXA1*f*, and first auxiliary pixels PXa1*l* may be arranged in the first pixel area PXA1*l*. The second auxiliary area AA2*l* may include a second transmission area TA2*l* and a second pixel area PXA2*l*, and second auxiliary pixels PXa2*l* may be arranged in the second pixel area PXA2*l*. Components may be arranged to correspond to the first auxiliary area AA1*l* and the second auxiliary area AA2*l*, respectively.

Figure 37:
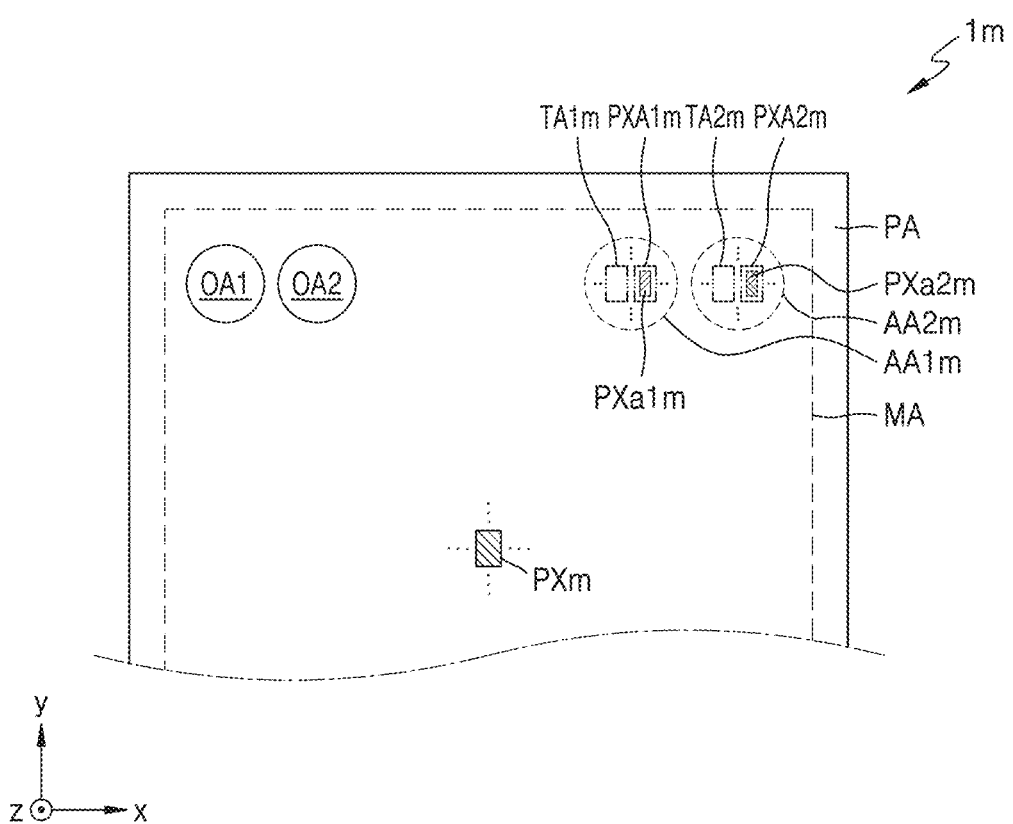
FIG. 37 is a schematic plan view illustrating a portion of a display device according to an embodiment.

FIG. 37 is a schematic plan view illustrating a portion of a display device 1*m* according to an embodiment. In FIG. 37, the same reference numerals as those of FIG. 33 refer to the same members, and redundant descriptions thereof will be omitted.

Referring to FIG. 37, the display device 1*m* may include a main area MA, a first opening area OA1, a second opening area OA2, a first auxiliary area AA1*m*, and a second auxiliary area AA2*m*. The first opening area OA1 and the second opening area OA2 may be arranged on the upper left side of the display device 1*m*, and the first auxiliary area AA1*m* and the second auxiliary area AA2*m* may be arranged on the upper right side of the display device 1*m*.

The first auxiliary area AA1*m* may include a first transmission area TA1*m* and a first pixel area PXA1*m*, and first auxiliary pixels PXa1*m* may be arranged in the first pixel area PXA1*m*. The second auxiliary area AA2*m* may include a second transmission area TA2*m* and a second pixel area PXA2*m*, and second auxiliary pixels PXa2*m* may be arranged in the second pixel area PXA2*m*. Components may be arranged to correspond to the first auxiliary area AA1*m* and the second auxiliary area AA2*m*, respectively.

Figure 38:
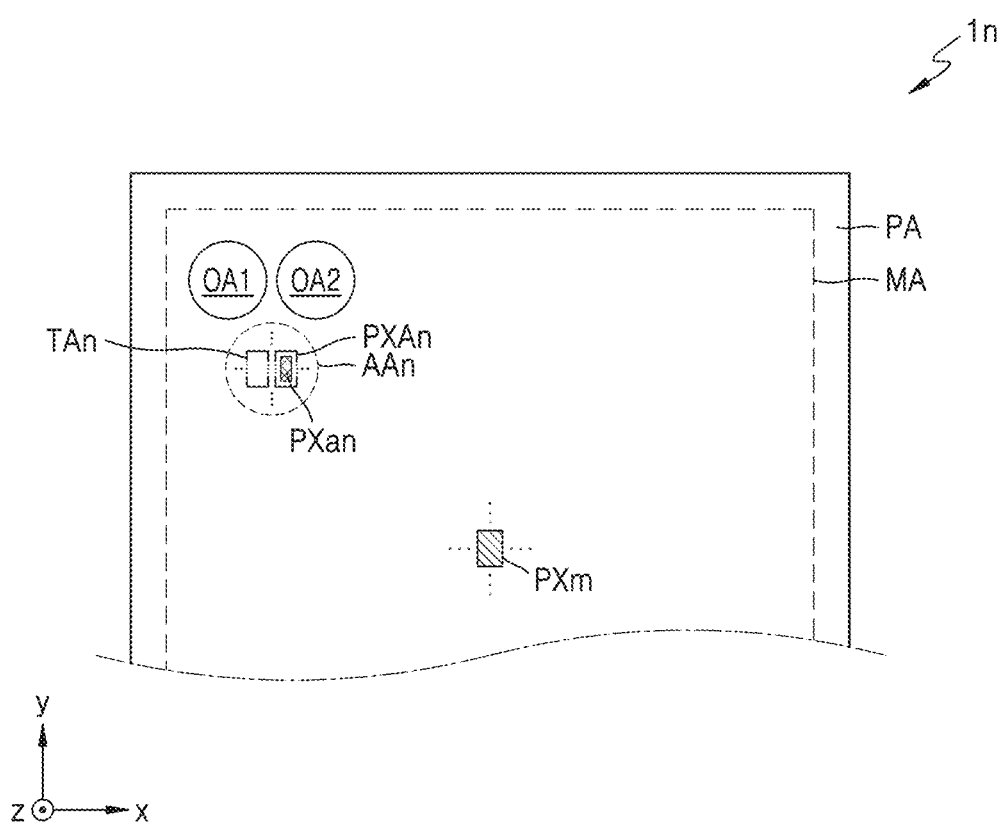
FIG. 38 is a schematic plan view illustrating a portion of a display device according to an embodiment.

FIG. 38 is a schematic plan view illustrating a portion of a display device 1*n* according to an embodiment. In FIG. 38, the same reference numerals as those of FIG. 33 refer to the same members, and redundant descriptions thereof will be omitted.

Referring to FIG. 38, the display device 1*n* may include a main area MA, a first opening area OA1, a second opening area OA2, and an auxiliary area AA*n*. The first opening area OA1, the second opening area OA2, and the auxiliary area AA*n* may be arranged on the upper left side of the display device 1*n*.

The auxiliary area AA*n* may include a transmission area TA*n* and a pixel area PXA*n*, and auxiliary pixels PXa*n* may be arranged in the pixel area PXA*n*. A component may be arranged to correspond to the auxiliary area AA*n*.

Figure 39:
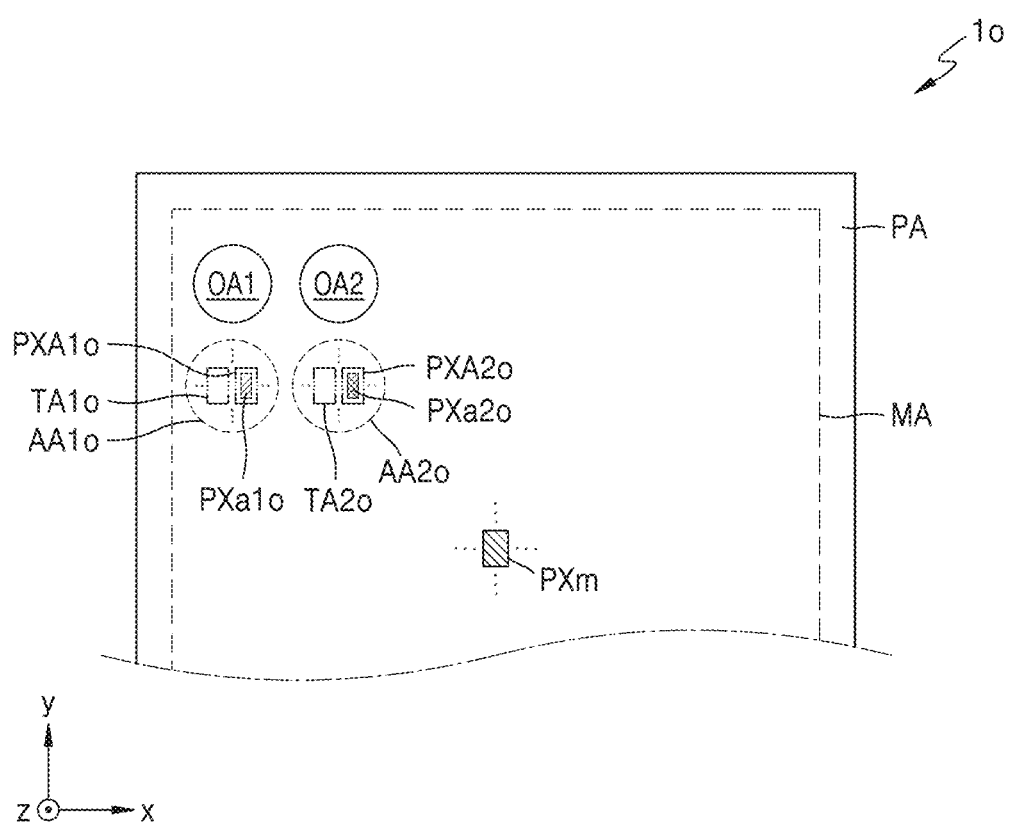
FIG. 39 is a schematic plan view illustrating a portion of a display device according to an embodiment.

FIG. 39 is a schematic plan view illustrating a portion of a display device 1*o* according to an embodiment. In FIG. 39, the same reference numerals as those of FIG. 33 refer to the same members, and redundant descriptions thereof will be omitted.

Referring to FIG. 39, the display device 1*o* may include a main area MA, a first opening area OA1, a second opening area OA2, a first auxiliary area AA1*o*, and a second auxiliary area AA2*o*. The first opening area OA1, the second opening area OA2, the first auxiliary area AA1*o*, and the second auxiliary area AA2*o* may be arranged on the upper left side of the display device 1*o*.

The first auxiliary area AA1*o* may include a first transmission area TA1*o* and a first pixel area PXA1*o*, and first auxiliary pixels PXa1*o* may be arranged in the first pixel area PXA1*o*. The second auxiliary area AA2*o* may include a second transmission area TA2*o* and a second pixel area PXA2*o*, and second auxiliary pixels PXa2*o* may be arranged in the second pixel area PXA2*o*. Components may be arranged to correspond to the first auxiliary area AA1*o* and the second auxiliary area AA2*o*, respectively.

Display devices have been described, but the disclosure is not limited thereto. For example, a method of manufacturing the display devices is also included within the scope of the disclosure.

According to embodiments, a display device in which the function of a component, which is an electronic element, is not limited may be implemented. The scope of the disclosure, however, is not limited by these effects.

It should be understood that embodiments described herein should be considered in a descriptive sense only and not for purposes of limitation. Descriptions of features or aspects within each embodiment should also be considered as available for other similar features or aspects in other embodiments. While one or more embodiments have been described with reference to the figures, it will be understood by those of ordinary skill in the art that various changes in form and details may be made therein without departing from the spirit and scope as defined by the attached claims.

What is claimed is:

1. A display device comprising:
   a substrate including:
   a first auxiliary area; and
   a second auxiliary area, wherein the first auxiliary area includes first pixel areas disposed in a matrix and first transmission areas disposed between the first pixel areas, and the second auxiliary area includes second pixel areas disposed in a matrix and second transmission areas disposed between the second pixel areas;
   first conductive patterns respectively disposed on the first pixel areas; and
   second conductive patterns respectively disposed on the second pixel areas,
   wherein a number of first conductive patterns per unit area is greater than a number of second conductive patterns per unit area.

2. The display device of claim 1, wherein a size of each of the first conductive patterns is less than a size of each of the second conductive patterns.

3. The display device of claim 1, wherein a first separation distance between first conductive patterns adjacent to each other in a row direction or a column direction from among the first conductive patterns is less than a second separation distance between second conductive patterns adjacent to each other in the row direction or the column direction from among the second conductive patterns.

4. The display device of claim 1, wherein a size of each of the first transmission areas is less than a size of each of the second transmission areas.

5. The display device of claim 1, further comprising:
   first auxiliary pixels respectively disposed on the first conductive patterns; and
   second auxiliary pixels respectively disposed on the second conductive patterns.

6. The display device of claim 5, wherein
   each of the first auxiliary pixels includes first auxiliary sub-pixels,
   each of the second auxiliary pixels includes second auxiliary sub-pixels, and
   a number of first auxiliary sub-pixels in each of the first auxiliary pixels is different from a number of second auxiliary sub-pixels in each of the second auxiliary pixels.

7. The display device of claim 6, wherein the number of first auxiliary sub-pixels in each of the first auxiliary pixels is less than the number of second auxiliary sub-pixels in each of the second auxiliary pixels.

8. The display device of claim 1, wherein a main area surrounding at least portions of the first auxiliary area and the second auxiliary area is defined on the substrate, a resolution of the main area is higher than a resolution of the first auxiliary area and a resolution of the second auxiliary area, and the resolution of the first auxiliary area is higher than the resolution of the second auxiliary area.

9. The display device of claim 1, further comprising:
first connection patterns electrically connecting first conductive patterns adjacent to each other in a row direction from among the first conductive patterns;
second connection patterns electrically connecting first conductive patterns adjacent to each other in a column direction from among the first conductive patterns;
third connection patterns electrically connecting second conductive patterns adjacent to each other in the row direction from among the second conductive patterns; and
fourth connection patterns electrically connecting second conductive patterns adjacent to each other in the column direction from among the second conductive patterns.

10. The display device of claim 1, further comprising:
a transistor disposed on the substrate, the transistor including a semiconductor layer and a gate electrode at least partially overlapping the semiconductor layer in a plan view,
wherein the first conductive patterns and the second conductive patterns are disposed between the substrate and the semiconductor layer.

11. The display device of claim 1, further comprising:
a first component disposed below the first auxiliary area that receives light in a first wavelength band; and
a second component disposed below the second auxiliary area that receives light in a second wavelength band that is different from the first wavelength band.

12. The display device of claim 11, wherein
the first wavelength band is a visible ray wavelength band, and
the second wavelength band is an infrared wavelength band.

13. A display device comprising:
a substrate including:
a first auxiliary area;
a second auxiliary area; and
a main area, wherein the first auxiliary area includes a first transmission area, the second auxiliary area includes a second transmission area, and the main area surrounds at least portions of the first auxiliary area and the second auxiliary area;
main display elements disposed on the main area and emitting light of a first color;
first auxiliary display elements disposed on the first auxiliary area and emitting light of the first color; and
second auxiliary display elements disposed in the second auxiliary area and emitting light of the first color, wherein
a number of main display elements per unit area is greater than a number of first auxiliary display elements per unit area and a number of second auxiliary display elements per unit area, and
the number of first auxiliary display elements per unit area is less than the number of second auxiliary display elements per unit area.

14. The display device of claim 13, wherein
an emission area of each of the main display elements is less than an emission area of each of the first auxiliary display elements and an emission area of each of the second auxiliary display elements, and
the emission area of each of the first auxiliary display elements is different from the emission area of each of the second auxiliary display elements.

15. The display device of claim 14, wherein the emission area of each of the first auxiliary display elements is greater than the emission area of each of the second auxiliary display elements.

16. The display device of claim 13, further comprising:
main pixel circuits electrically connected to the main display elements, respectively;
first auxiliary pixel circuits electrically connected to the first auxiliary display elements, respectively; and
second auxiliary pixel circuits electrically connected to the second auxiliary display elements, respectively, wherein
the main display elements at least partially overlap the main pixel circuits in a plan view,
the first auxiliary display elements are spaced apart from the first auxiliary pixel circuits, and
the second auxiliary display elements are spaced apart from the second auxiliary pixel circuits.

17. The display device of claim 16, wherein a first length of each of the first auxiliary pixel circuits in a direction is greater than a second length of each of the second auxiliary pixel circuits in the direction.

18. The display device of claim 16, further comprising:
first connection lines respectively electrically connecting the first auxiliary display elements to the first auxiliary pixel circuits and at least partially overlapping the first auxiliary area in the plan view; and
second connection lines respectively electrically connecting the second auxiliary display elements to the second auxiliary pixel circuits and at least partially overlapping the second auxiliary area in the plan view,
wherein the first connection lines and the second connection lines include a transparent conductive oxide.

19. The display device of claim 13, further comprising:
a first component disposed below the first auxiliary area that receives light in a first wavelength band; and
a second component disposed below the second auxiliary area that receives light in a second wavelength band that is different from the first wavelength band.

20. The display device of claim 19, wherein
the first wavelength band is a visible ray wavelength band, and
the second wavelength band is an infrared wavelength band.

* * * * *